(12) United States Patent
Sato et al.

(10) Patent No.: US 6,602,646 B1
(45) Date of Patent: Aug. 5, 2003

(54) POSITIVE-WORKING RESIST COMPOSITION

(75) Inventors: Kenichiro Sato, Shizuoka (JP); Kunihiko Kodama, Shizuoka (JP); Toshiaki Aoai, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/684,888

(22) Filed: Oct. 6, 2000

(30) Foreign Application Priority Data

Oct. 6, 1999 (JP) ............................................. 11-285761
Mar. 22, 2000 (JP) ........................................ 2000-080519

(51) Int. Cl.$^7$ ............................................. G03F 7/004
(52) U.S. Cl. ..................................... 430/270.1; 430/905
(58) Field of Search ............................... 430/270.1, 905

(56) References Cited

U.S. PATENT DOCUMENTS 5,843,624 A    12/1998  Houlihan et al.
5,968,713 A  * 10/1999  Nozaki et al. ............... 430/326
6,177,228 B1 *  1/2001  Allen et al. ............... 430/270.1
6,180,316 B1 *  1/2001  Kajita et al. ............. 430/270.1

FOREIGN PATENT DOCUMENTS

DE     196 26 003 A1    1/1997

OTHER PUBLICATIONS

Matsumoto, et al., *Radical Polymerization of 4–tert–Butyl-cyclohexyl Methacrylate: Polymerization Kinetics and Polymer Properties,* Macromolecules, vol. 26, No. 7, p. 1659–1665 (1993).
Matsumoto, et al., *Synthesis and Thermal Properties of Poly (cycloalkyl methacrylate)s Bearing Bridged–and Fused–Ring Structures,* Journal of Polymer Sciences: Part A: Polymer Chemistry, vol. 31, p. 2531–2539 (1993).
Matusmoto, et al., *Synthesis Characterization of Poly(1–adamantyl methacrylate): Effects of the Adamantyl Group on Radical Polymerication Kinetics and Thermal Properties of the Polymer,* Macromolecules, vol. 24, p. 4017–4024 (1991).

XP–002156709, Sanjay Malik et al., Lithographic Properties of Novel Acetal–Derivatized Hydroxy Styrene Polymers, (Mar. 15, 1999), pp. 388–400.
XP–002156707, R.R. Dammel et al., Lithographic Performance of a Dry–Etch Stable Methacrylate Resist at 193 nm, (Feb. 23, 1998), pp. 144–151.
XP–002156708, Yasunori Uetani et al., Standard Developer Available ArF Resist and Performance, (Feb. 23, 1998), pp. 546–553.
XP–002156706, M. Dalil Rahman et al., Cycloolefin/Maleic Anhydride Copolymers for 193 nm Resist Compositions, (Mar. 15, 1999), pp. 1193–1200.
XP–002156705, Kyle Patterson et al., Improving the Performance of 193nm Photoresists Based on Alicyclic Polymers, (Feb. 23, 1998), pp. 425–437.
XP–002156704, Naomi Shida et al., Chemically Amplified ArF Resists Based on Cleavable Alicyclic Group and the Absorption Band Shift Method, (Feb. 23, 1998), pp. 102–110.
XP–002156703, Yasunori Uetani et al., Positive ArF Resist with 2EAdMA/GBLMA Resin System, (Mar. 15, 1999), pp. 510–517.

European Search Report.

* cited by examiner

*Primary Examiner*—Rosemary Ashton
(74) *Attorney, Agent, or Firm*—Sughrue Mion, PLLC

(57) ABSTRACT

The present invention provides a high sensitivity chemically amplified positive-working resist composition which eliminates edge roughness on pattern and provides an excellent resist pattern profile. A novel positive-working resist composition is provided comprising (A) a resin containing an alkali-soluble group protected by at least one of moieties containing alicyclic hydrocarbon represented by general formulae (pI) to (pVI) and having a monomer component content of 5% or less of the total pattern area as determined by gel permeation chromatography (GPC), which increases in its solution velocity with respect to an alkaline developer by the action of an acid and (B) a compound which is capable of generating an acid by irradiation with an active ray or radiation.

5 Claims, No Drawings

POSITIVE-WORKING RESIST COMPOSITION

FIELD OF THE INVENTION

The present invention relates to a positive-working resist composition for use in ultramicrolithographic process for the production of very-LSI (very large scale integration) or high capacity microchip or other photofabrication processes. More particularly, the present invention relates to a positive-working resist composition which eliminates edge roughness, provides an excellent profile and exhibits a high sensitivity.

BACKGROUND OF THE INVENTION

In recent years, the degree of integration of integrated circuits has increased more and more. Under these circumstances, it has become necessary to work ultrafine patterns comprising lines with a width of less than half micron in the art of production of semiconductor substrates for very-LSI, etc. To this end, the wavelength of light used in the exposure apparatus in photolithography has been reduced more and more to the extent of considering the use of excimer laser beam (e.g., XeCl, KrF, ArF), which has the shortest wavelength among far ultraviolet rays.

As a resist for forming a pattern in lithography in this wavelength range there is known a chemically amplified resist.

In general, chemically amplified resists can be roughly divided into three groups, i.e., two-component system, 2.5-component system and three-component system (common name). The two-component system chemically amplified resist comprises a compound which undergoes photodecomposition to generate an acid (hereinafter referred to as "photo-acid generator") and a binder resin in combination. The binder resin contains in its molecule a group which decomposes when acted upon by an acid to increase the solubility of the resin in an alkaline developer (also referred to as "acid-decomposable group") The 2.5-component system chemically amplified resin comprises a low molecular weight compound having an acid-decomposable group incorporated in such a two-component system. The three-component system chemically amplified resin comprises a photo-acid generator, an alkali-soluble resin and the foregoing low molecular weight compound in combination.

The foregoing chemically amplified resist can be used as a photoresist adapted for irradiation with ultraviolet ray or far ultraviolet ray. However, the use of the chemically amplified resist requires that some demands be met.

As a photoresist composition for ArF light source there has been proposed a resin which comprises an alicyclic hydrocarbon site incorporated therein to render the resin resistant to dry etching. However, the introduction of such an alicyclic hydrocarbon site causes the system to be extremely hydrophobic, making it difficult for the photoresist to be developed with an aqueous solution of tetramethyl ammonium hydroxide (hereinafter referred to as "TMAH"), which has heretofore been widely used as a resist developer, or causing the resist to be peeled off from the substrate during development.

In order to cope with the hydrophobicization of the resist, the mixing of the developer with an organic solvent such as isopropyl alcohol has been considered. Though attaining some good results, this approach cannot necessarily give complete solutions to the foregoing problems because it gives an apprehension that the resist film can swell and complicates the production process. For the part of improving the resist, many approaches have been proposed such as introducing a hydrophilic group to make up for various hydrophobic alicyclic hydrocarbon sites.

JP-A-10-10739 (The term "JP-A" as used herein means an "unexamined published Japanese patent application") discloses an energy-sensitive resist material comprising a polymer obtained by the polymerization of a monomer having an alicyclic structure such as norbornene ring in its main chain, maleic anhydride and a monomer having carboxyl group. JP-A-10-111569 discloses a radiation-sensitive resin composition comprising a resin having an alicyclic skeleton in its main chain and a radiation-sensitive acid generator. JP-A-11-109632 discloses the use of a resin comprising a polar group-containing alicyclic functional group and an acid-decomposable group as a radiation-sensitive photographic material.

As mentioned above, it is usual that a resin containing an acid-decomposable group for use in photoresist adapted for exposure to far ultraviolet ray also contains an aliphatic cyclic hydrocarbon group in its molecule. The resulting resin is hydrophobic, causing some problems. In order to solve these problems, the foregoing various approaches have been studied. However, these approaches leave much to be desired.

In recent years, with the demand for the reduction of the size of semiconductor chips, the size of fine semiconductor patterns has reached a range of from 0.13 $\mu$m to 0.35 $\mu$m. However, these compositions used for this purpose are disadvantageous in that the resolving power of line pattern is deteriorated by defects such as edge roughness of line pattern. The term "edge roughness" as used herein is meant to indicate that the pattern is observed uneven at the edge as viewed from above because the top and bottom edges of the line pattern of the resist are arranged irregularly along the line and in the vertical direction due to the characteristics of the resist.

As mentioned above, the conventional known technique on photoresist composition is liable to pattern edge roughness that makes it impossible to obtain a stable pattern. It has thus been desired to provide further improvements.

SUMMARY OF THE INVENTION

It is therefore an object of the present invention to provide a high sensitivity chemically amplified positive-working resist composition which eliminates edge roughness on pattern and provides an excellent resist pattern profile.

The foregoing object of the present invention will become apparent from the following detailed description and examples.

The inventors made extensive studies of the constituents of chemically amplified positive-working resist composition. As a result, it was found that the use of a specific acid-decomposable resin makes it possible to accomplish the foregoing object of the present invention. The present invention has thus been worked out.

The foregoing object of the present invention is accomplished by the following constitutions.

(1) A positive-working resist composition comprising:

(A) a resin containing an alkali-soluble group protected by at least one of moieties containing alicyclic hydrocarbon represented by the following general formulae (pI) to (pVI) and having a monomer component content of 5% or less of the total pattern area as determined by gel permeation chromatography (GPC), which increases in its solution velocity with respect to an alkaline developer by the action of an acid:

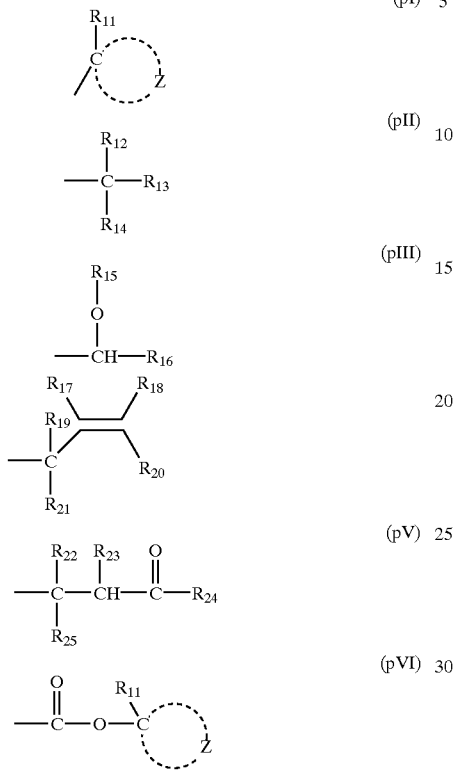

(pI)

(pII)

(pIII)

(pIV)

(pV)

(pVI)

wherein $R_{11}$ represents a methyl group, ethyl group, n-propyl group, isopropyl group, n-butyl group, isobutyl group or sec-butyl group; Z represents an atomic group required to form an alicyclic hydrocarbon group with carbon atoms; $R_{12}$ to $R_{16}$ each independently represent a $C_{1-4}$ straight-chain or branched alkyl group or alicyclic hydrocarbon group, with the proviso that at least one of $R_{12}$ to $R_{14}$ or either $R_{15}$ or $R_{16}$ represents an alicyclic hydrocarbon group; $R_{17}$ to $R_{21}$, each independently represent a hydrogen atom, $C_{1-4}$ straight-chain or branched alkyl group or alicyclic hydrocarbon group, with the proviso that at least one of $R_{17}$ to $R_{21}$ represents an alicyclic hydrocarbon group and either $R_{19}$ or $R_{21}$ represents a $C_{1-4}$ straight-chain or branched alkyl group or alicyclic hydrocarbon group; and $R_{22}$ to $R_{25}$ each independently represent a $C_{1-4}$ straight-chain or branched alkyl group or alicyclic hydrocarbon group, with the proviso that at least one of $R_{22}$ to $R_{25}$ represents an alicyclic hydrocarbon group; and (B) a compound which is capable of generating an acid by irradiation with an active ray or radiation.

(2) The positive-working resist composition according to Clause (1), wherein said resin (A) is one obtained by adding a reaction solution containing a monomer and a radical polymerization initiator dropwise to a reaction solvent or a reaction solution containing a monomer to cause polymerization reaction.

(3) The positive-working resist composition according to Clause (1), wherein said resin (A) is one obtained by adding a radical polymerization initiator to a reaction solution containing a monomer by portions in 30 minutes to 8 hours to cause polymerization reaction.

(4) The positive-working resist composition according to any one of Clauses (1) to (3), wherein said resin (A) is one obtained by a process which comprises heating a reaction solution containing a monomer and a radical polymerization initiator to cause polymerization reaction, adding the radical polymerization initiator to the polymerization reaction product, and then heating the mixture to cause polymerization reaction.

(5) The positive-working resist composition according to any one of Clauses (1) to (4), wherein said resin (A) is one obtained by a process which comprises adding the reaction solution obtained by polymerization reaction to at least one solution selected from the group consisting of water, at least one alcohol, water/alcohol mixture, water/ether mixture, water/ketone mixture, water/amide mixture, water/ester or lactone mixture and water/nitrile mixture, and then recovering the product in the form of powder.

(6) A positive-working resist composition comprising:
(A') a resin which increases in its solution velocity with respect to an alkaline developer by the action of an acid wherein (i) said resin contains at least one repeating structural unit selected from the group consisting of repeating structural units represented by the following general formulae (Ia) and (Ib) and a repeating structural unit represented by the following general formula (II), (ii) said resin contains a group capable of being decomposed by the action of an acid and (iii) the content of the monomers corresponding to the repeating structural units constituting the resin is 5% or less of the total pattern area as determined by gel permeation chromatography; and (B) a compound which is capable of generating an acid by irradiation with an active ray or radiation:

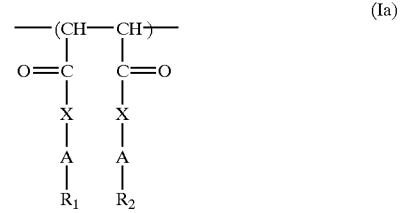

(Ia)

wherein $R_1$ and $R_2$ each independently represent a hydrogen atom, cyano group, hydroxyl group, —COOH, —COOR$_5$, —CO—NH—R$_6$, —CO—NH—SO$_2$—R$_6$, alkyl, alkoxy or cyclic hydrocarbon group which may be substituted or —Y group shown below, in which $R_5$ represents an alkyl or cyclic hydrocarbon group which may be substituted or —Y group shown below and $R_6$ represents an alkyl or cyclic hydrocarbon group which may be substituted; X represents an oxygen atom, sulfur atom, —NH—, —NHSO$_2$— or —NHSO$_2$NH—; A represents a single bond or divalent connecting group: —Y:

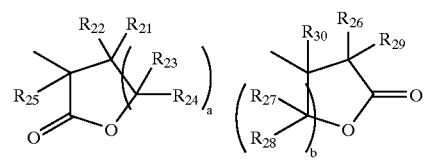

wherein $R_{21}$ to $R_{30}$ each independently represent a hydrogen atom or an alkyl group which may be substituted; and a and b each represent an integer of 1 or 2;

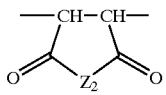
(Ib)

wherein $Z_2$ represents —O— or —N($R_3$)— in which $R_3$ represents a hydrogen atom, hydroxyl group or —OSO$_2$—$R_4$, in which $R_4$ represents an alkyl group, haloalkyl group, cycloalkyl group or camphor residue; and

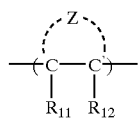
(II)

wherein $R_{11}$ and $R_{12}$ each independently represent a hydrogen atom, cyano group, halogen atom or alkyl group which may be substituted; and Z represents an atomic group containing two connected carbon atoms (C—C) required to form an alicyclic structure which may be substituted.

(7) The positive-working resist composition according to Clause (6), wherein Z in the general formula (II) represents an atomic group containing two connected carbon atoms (C—C) required to form a polycyclic hydrocarbon group which may having substituents (8) The positive-working resist composition according to Clause (6), wherein the general formula (II) is the following general formula (II-A) or (II-B):

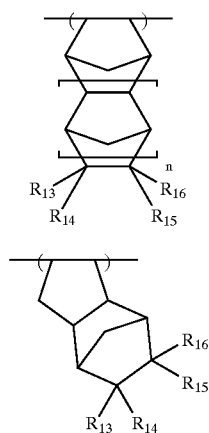

wherein $R_{13}$ to $R_{16}$ each independently represent a hydrogen atom, halogen atom, cyano group, —COOH, —COOR$_5$, group capable of being decomposed by the action of an acid, —C(=O)—X—A—$R_{17}$, or alkyl or cyclic hydrocarbon group which may have a substituent, in which $R_5$, $R_6$, X and A are as defined in Clause (6), and $R_{17}$ represents —COOH, —COOR$_5$, —CN, hydroxyl group, alkoxy group which may have a substituent, —CO—NH—$R_6$, —CO—NH—SO$_2$—$R_6$ or —Y group defined above, with the proviso that at least two or $R_{13}$ to $R_{16}$ may be connected to each other to form a ring; and n represents an integer of 0 or 1.

(9) The positive-working resist composition according to Clause (6), wherein said resin (A) is a polymer obtained by a process which comprises heating a solution containing monomers corresponding to the repeating structural units constituting the resin and a radical polymerization initiator to cause polymerization reaction, adding the radical polymerization initiator to the product of polymerization reaction, and then allowing the reaction mixture to undergo polymerization reaction.

(10) The positive-working resist composition according to Clause (6), wherein said resin (A) is a polymer obtained by a process which comprises adding a polymerization reaction solution obtained by polymerization reaction to at least one solvent selected from the group consisting of water, alcohols, ethers, ketones, amides, esters, lactones, nitriles, hydrocarbons and mixture thereof to cause the precipitation of a polymer which is then recovered in the form of powder.

DETAILED DESCRIPTION OF THE INVENTION

The components to be used in the present invention will be further described hereinafter.

[1] (A) Resin which Increases in its Solution Velocity with Respect to an Alkaline Developer by the Action of an Acid (Also Referred to as "Acid-decomposable Resin")

The various constituents of the acid-decomposable resin will be further described hereinafter.

In the general formulae (pI) to (pVI), the alkyl group represented by $R_{12}$ to $R_{25}$ represents a $C_{1-4}$ straight-chain or branched alkyl group which may be either substituted or unsubstituted. Examples of the alkyl group include methyl group, ethyl group, n-propyl group, isopropyl group, n-butyl group, isobutyl group, sec-butyl group, and t-butyl group.

Examples of further substituents on the alkyl group include $C_{1-4}$ alkoxyl group, halogen atom (e.g., fluorine, chlorine, bromine, iodine), acyl group, acyloxy group, cyano group, hydroxyl group, carboxyl group, alkoxycarbonyl group, and nitro group.

The alicyclic hydrocarbon group represented by $R_{11}$ to $R_{25}$ or the alicyclic hydrocarbon group formed by Z and carbon atoms may be monocyclic or polycyclic. Specific examples of such an alicyclic hydrocarbon group include groups having monocyclo, bicyclo, tricyclo or tetracyclo structure having 5 or more carbon atoms. The alicyclic hydrocarbon group preferably has from 6 to 30 carbon atoms, particularly from 7 to 25 carbon atoms. These alicyclic hydrocarbon groups may have a substituent.

Examples of the structure of alicyclic moiety of alicyclic hydrocarbon group will be given below.

(1)

(2)

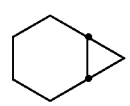
(3)

(4)

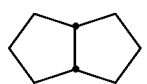 (5)
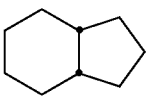 (6)
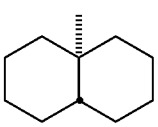 (7)
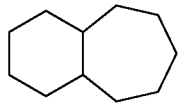 (8)
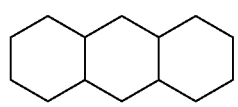 (9)
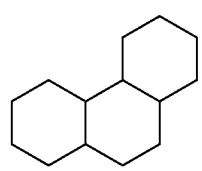 (10)
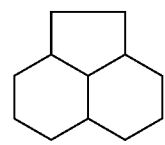 (11)
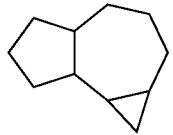 (12)
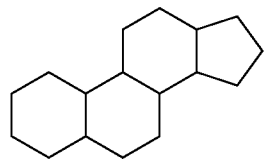 (13)
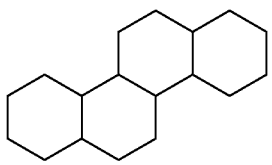 (14)
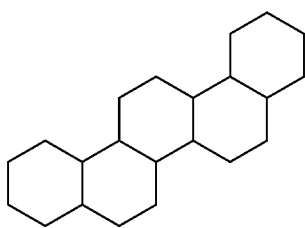 (15)
 (16)
 (17)
 (18)
 (19)
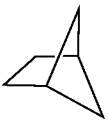 (20)
 (21)
 (22)
 (23)
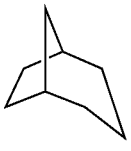 (24)
 (25)
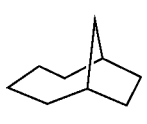 (26)
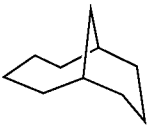 (27)
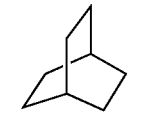 (28)

(29) 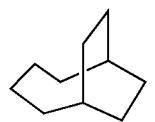

(30) 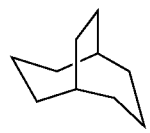

(31) 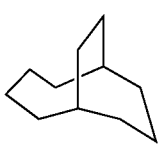

(32) 

(33) 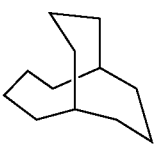

(34) 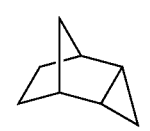

(35) 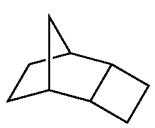

(36) 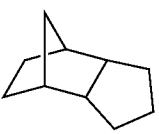

(37) 

(38) 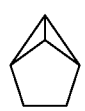

(39) 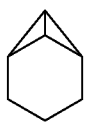

(40) 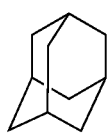

(41) 

(42) 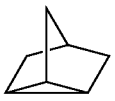

(43) 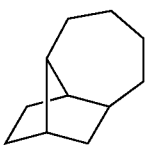

(44) 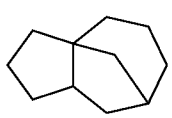

(45) 

(46) 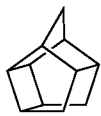

(47) 

(48) 

(49) 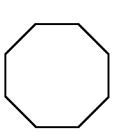

(50) 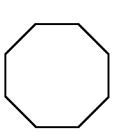

Preferred examples of the alicyclic moiety of the invention include adamantyl group, noradamnatyl group, decalin residue, tricyclodecanyl group, tetracyclododecanyl group, norbornyl group, cedrol group, cyclohexyl group, cycloheptyl group, cyclooctyl group, cyclodecanyl group, and cyclododecanyl group. Even more desirable among these groups are adamantyl group, decalin residue, norbornyl group, cedrol group, cyclohexyl group, cycloheptyl group, cyclooctyl group, cyclodecanyl group, and cyclododecanyl group.

Examples of substituents on these alicyclic hydrocarbon groups include alkyl group, substituted alkyl group, halogen atom, hydroxyl group, alkoxyl group, carboxyl group, and alkoxycarbonyl group. Preferred examples of the alkyl group include lower alkyl groups such as methyl group, ethyl group, propyl group, isopropyl group and low alkyl group. Even more desirable among these alkyl groups are methyl group, ethyl group, propyl group, and isopropyl group. Examples of substituents on the substituted alkyl group include hydroxyl group, halogen atom, and alkoxy group. Examples of the alkoxy group include $C_{1-4}$ alkoxy group such as methoxy, ethoxy, propoxy and butoxy.

Examples of the alkali-soluble group protected by the structure represented by the general formulae (pI) to (pVI) in the foregoing resin include various groups known in the art. Specific examples of the alkali-soluble group include carboxylic acid group, sulfonic acid group, phenol group, and thiol group. Preferred among these groups are carboxylic acid group and sulfonic acid group.

Preferred examples of the alkali-soluble group protected by the structure represented by the general formulae (pI) to (pVI) in the foregoing resin include those represented by the following general formulae (pVII) to (pXI).

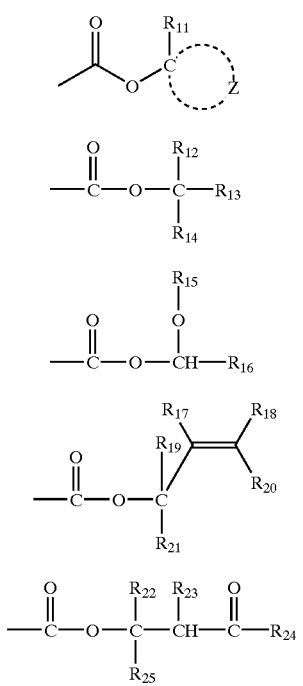

In these general formulae, $R_{11}$ to $R_{25}$ and Z are as defined above.

A preferred example of the repeating unit having the alkali-soluble group protected by the structure represented by the general formulae (pI) to (pVI) in the foregoing resin is one represented by the following general formula (pA).

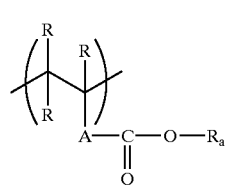

In the general formula (pA), R represents a hydrogen atom, halogen atom or $C_{1-4}$ substituted or unsubstituted straight-chain or branched alkyl group. The plurality of R's may be the same or different. A represents a single group or a combination of two or more groups selected from the group consisting of single bond, alkylene group, substituted alkylene group, ether group, thioether group, carbonyl group, ester group, amide group, sulfonamide group, urethane group and urea group.

Ra represents any of the groups represented by the foregoing general formulae (pI) to (pVI).

Specific examples of the monomer corresponding to the repeating unit represented by the general formula (pA) are shown below.

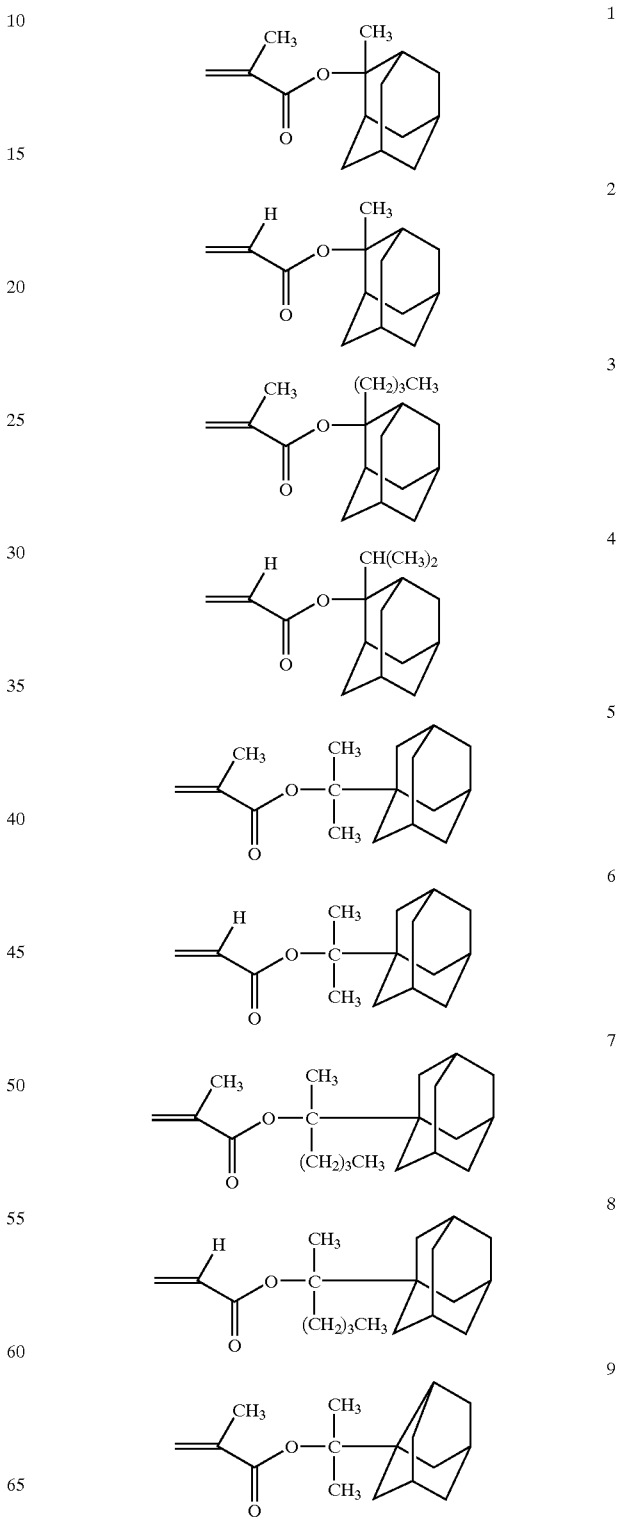

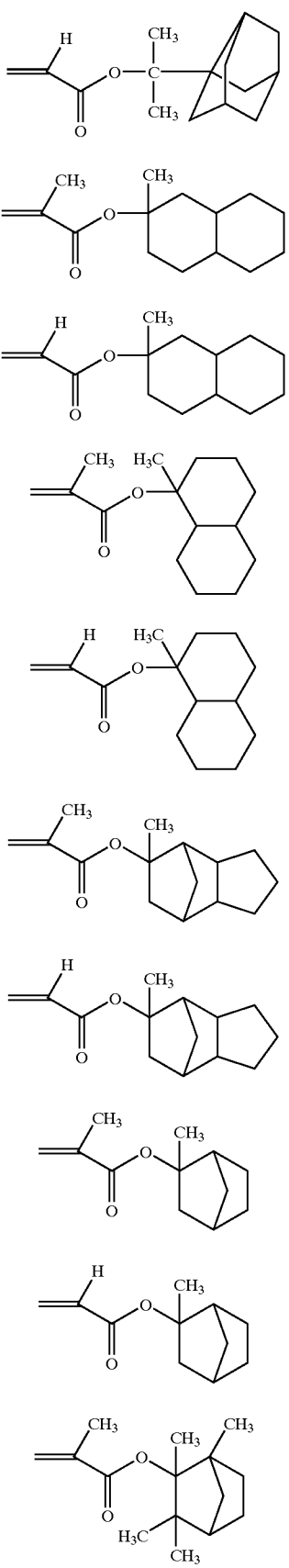
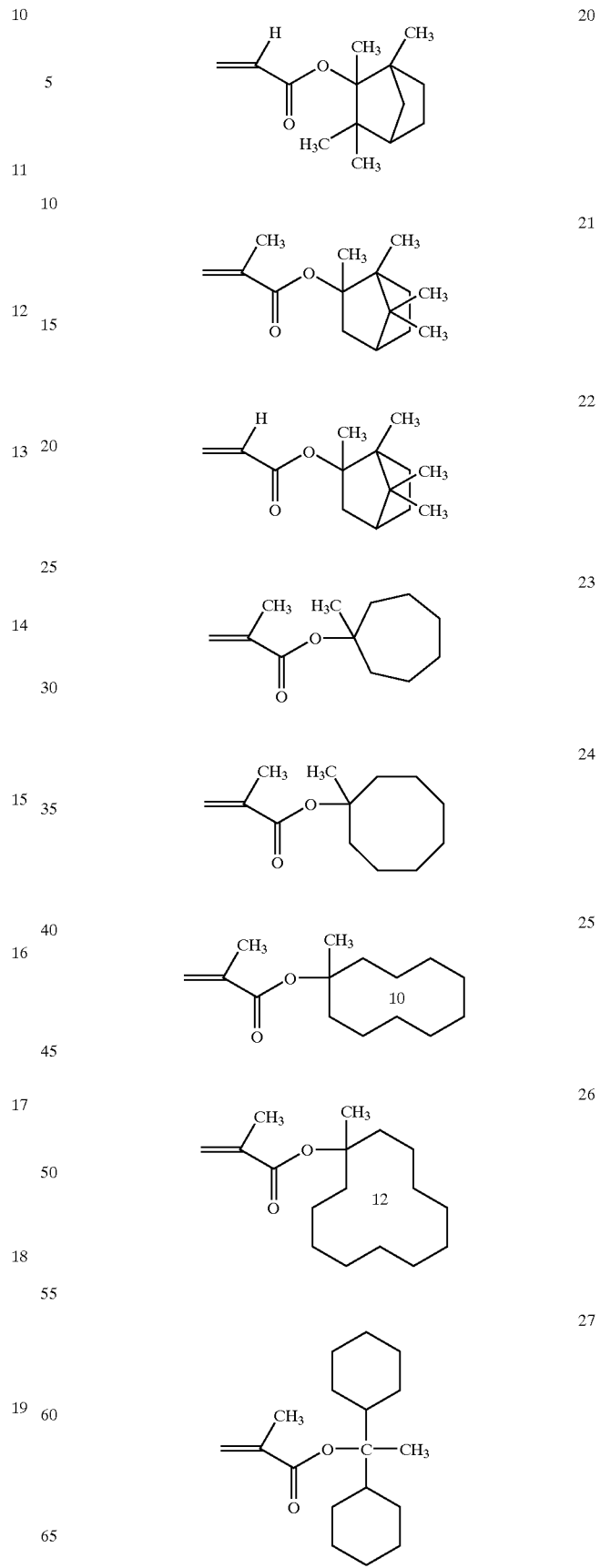

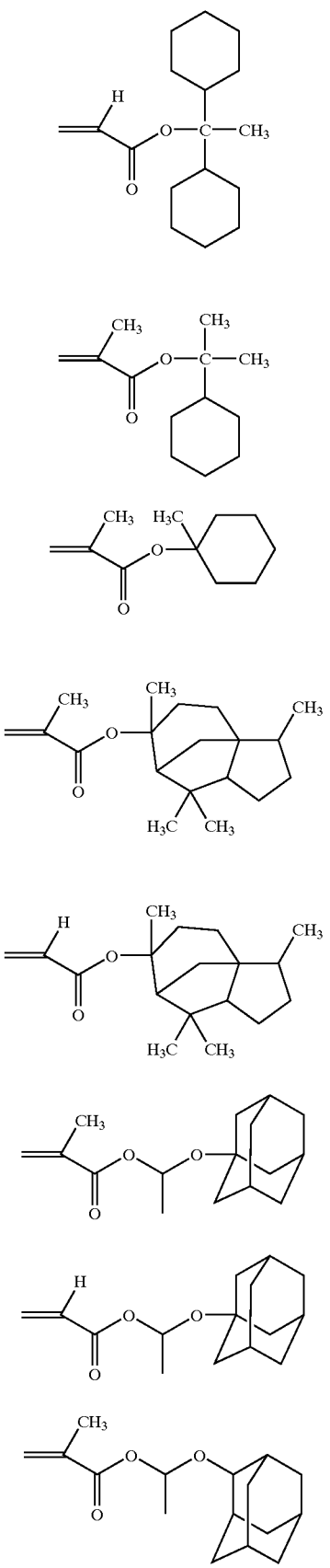

The foregoing resin may contain other repeating units besides the repeating unit having an alkali-soluble group protected by the structure represented by the general formulae (pI) to (pVI).

A preferred example of the other repeating units is one represented by the following general formula (AI).

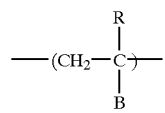

(AI)

R is as defined above. B represents a halogen atom, cyano group, group capable of being decomposed by the action of an acid, —C(=O)—Y—A—R$_{c9}$ or —COOR$_{c11}$.

Y represents a divalent connecting group selected from the group consisting of oxygen atom, sulfur atom, —NH—, —NHSO$_2$— and —NHSO$_2$NH—.

R$_{c9}$ represents —COOH, —COOR$_{c10}$ (in which R$_{c10}$ has the same meaning as R$_{c11}$ or represents the following lactone structure), —CN, hydroxyl group, alkoxy group which may have a substituent, —CO—NH—$R_{c11}$, —CO—NH—$SO_2$—$R_{c11}$ or the following lactone structure.

$R_{c11}$ represents an alkyl group or cyclic hydrocarbon group which may have a substituent.

A represents a single group or a combination of two or more groups selected from the group consisting of single bond, alkylene group, substituted alkylene group, ether group, thioether group, carbonyl group, ester group, amide group, sulfonamide group, urethane group and urea group.

Lactone structure

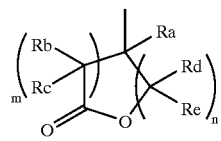

Ra to Re each independently represent a hydrogen atom or $C_{1-4}$ straight-chain or branched alkyl group which may have a substituent. The suffixes m and n each independently represent an integer of 0 to 3, with the proviso that the sum of m and n is from 2 to 6.

The foregoing group capable of being decomposed by the action of an acid is preferably a group represented by —C(=O)—$X_1$—$R_0$. Examples of $R_0$ include tertiary alkyl group such as t-butyl and t-amyl, 1-alkoxyethyl group such as isoboronyl, 1-ethoxyethyl, 1-butoxyethyl, 1-isobutoxyethyl and 1-cyclohexyloxyethyl, alkoxymethyl group such as 1-methoxymethyl and 1-ethoxymethyl, tetrahydropyranyl group, tetrahydrofuranyl group, trialkylsilyl group, and 3-oxocyclohexyl group. $X_1$ represents an oxygen atom, sulfur atom, —NH—, —$HNSO_2$— or —$NHSO_2HN$—. Preferred among these groups is oxygen atom.

The foregoing alkyl group is preferably a $C_{1-10}$ straight-chain or branched alkyl group, more preferably $C_{1-6}$ straight-chain or branched alkyl group, even more preferably methyl group, ethyl group, propyl group, isopropyl group, n-butyl group, isobutyl group, sec-butyl group or t-butyl group.

Examples of the foregoing cyclic hydrocarbon group include cyclic alkyl group, and polycyclic hydrocarbon group. Specific examples of these cyclic hydrocarbon groups include cyclopropyl group, cyclopentyl group, cyclohexyl group, adamantyl group, boronyl group, isoboronyl group, tricyclodecanyl group, dicyclopentenyl group, norbornaneepoxy group, menthyl group, isomenthyl group, neomenthyl group, and tetracyclododecanyl group.

Examples of the foregoing alkoxy group include $C_{1-4}$ alkoxy group such as methoxy group, ethoxy group, propoxy group and butoxy group.

Examples of further substituents on the foregoing alkyl group, cyclic alkyl group and alkoxy group include hydroxyl group, halogen atom, alkoxy group, acyl group, cyano group, and acyloxy group. Examples of the alkoxy group include $C_{1-4}$ alkoxy group include methoxy group, ethoxy group, propoxy group and butoxy group. Examples of the acyl group include formyl group, and acetyl group. Examples of the acyloxy group include acetoxy group.

Examples of the alkyl group or substituted alkylene group represented by A in the foregoing general formulae (AI) and (pA) include a group represented by the following general formula:

—[C(Rf)(Rg)]$_r$—

In the foregoing general formula, Rf and Rg may be the same or different and each represent a hydrogen atom, alkyl group, substituted alkyl group, halogen atom, hydroxyl group, and alkoxy group. Preferred examples of the alkyl group include low alkyl groups such as methyl group, ethyl group, propyl group, isopropyl group and butyl group. Substituents selected from the group consisting of methyl group, ethyl group, propyl group and isopropyl group are even more desirable. Examples of the substituents on the substituted alkyl group include hydroxyl group, halogen atom, and alkoxy group. Examples of the alkoxy group include $C_{1-4}$ alkoxy group such as methoxy group, ethoxy group, propoxy group and butoxy group. The suffix r represents an integer of from 1 to 10.

Examples of the halogen atom include chlorine atom, bromine atom, fluorine atom, and iodine atom.

The group represented by B is preferably an acid-decomposable group or a group represented by —$COOR_{c9}$ (lactone structure).

The acid-decomposable resin according to the invention preferably comprises an acid-decomposable group other than the alkali-soluble group protected by the structure represented by the general formula (pI) to (pVI) incorporated in a copolymer component such as repeating unit represented by the general formula (AI). The acid-decomposable group to be used in combination with the alkali-soluble group is preferably a group represented by the general formula —C(=O)—O—$R_0$.

Particularly preferred examples of the structure represented by the general formulae (pI) to (pVI) include 2-alkyl-2-adamantan, and the foregoing specific examples (5) to (8), which are acid-decomposable alicyclic monomers. The alkyl group preferably has from 1 to 4 carbon atoms.

The acid-decomposable resin preferably further contains repeating structure units represented by the following general formulae (III-a) to (III-d). In this arrangement, the problems due to the hydrophobicity of resist composition can be eliminated.

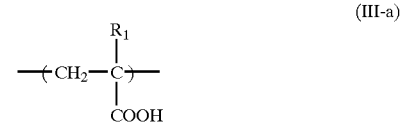

(III-a)

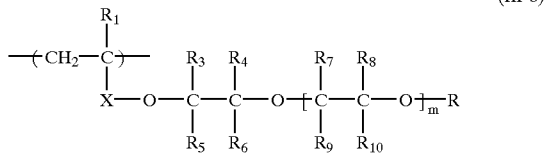

(III-b)

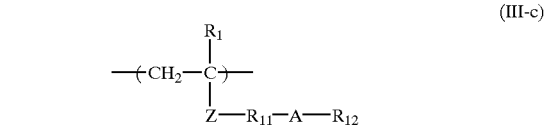

(III-c)

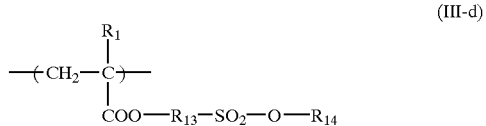

(III-d)

In the foregoing general formulae (III-a) to (III-d), $R_1$ has the same meaning as R in the general formula (pA) $R_5$ to $R_{12}$ each independently represent a hydrogen atom or an alkyl group which may have a substituent. R represents a hydrogen atom or an alkyl, cyclic alkyl, aryl or aralkyl group which may have a substituent. The suffix m represents an integer of from 1 to 10.

X represents a single bond, single group selected from the group consisting of alkylene group, cyclic alkylene group, arylene group, ether group, thioether group, carbonyl group, ester group, amide group, sulfonamide group, urethane group and urea group which may have a substituent or divalent group comprising in combination at least two of these groups which doesn't decompose by the action of an acid.

Z represents a single bond, ether group, ester group, amide group, alkylene group or divalent group comprising these groups in combination. $R_{13}$ represents a single bond, alkylene group, arylene group or divalent group comprising these groups in combination. $R_{15}$ represents an alkylene group, arylene group or divalent group comprising these groups in combination. $R_{14}$ represents an alkyl group, cyclic alkyl group, aryl group or aralkyl group which may have a substituent. $R_{16}$ represents a hydrogen atom or an alkyl group, cyclic alkyl group, alkenyl group, aryl group or aralkyl group which may have a substituent.

A represents any of the functional groups shown below.

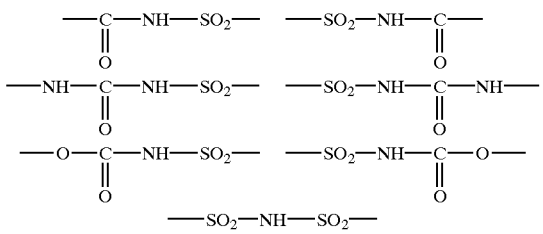

In the general formulae (III-a) to (III-d), the alkyl group represented by $R_3$ to $R_{10}$, R, $R_{12}$ and $R_{14}$ may be straight-chain or branched or may have a substituent. The straight-chain or branched alkyl group preferably has from 1 to 12 carbon atoms, more preferably from 1 to 10 carbon atoms. Specific examples of such a straight-chain or branched alkyl group include methyl group, ethyl group, propyl group, isopropyl group, n-butyl group, isobutyl group, sec-butyl group, t-butyl group, pentyl group, hexyl group, heptyl group, octyl group, nonyl group, and decyl group.

Examples of the cyclic alkyl group represented by R, $R_{12}$ and $R_{14}$ include $C_{3-30}$ cyclic alkyl group. Specific examples such a cyclic alkyl group include cyclopropyl group, cyclopentyl group, cyclohexyl group, adamantyl group, norbornyl group, boronyl group, tricyclodecanyl group, dicyclopentenyl group, norbornaneepoxy group, menthyl group, isomenthyl group, neomenthyl group, tetracyclododecanyl group, and steroid residue.

Examples of the aryl group represented by R, $R_{12}$ and $R_{14}$ include $C_{6-20}$ aryl group which may have a substituent. Specific examples of such an aryl group include phenyl group, tolyl group, and naphthyl group.

Examples of the aralkyl group represented by R, $R_{12}$ and $R_{14}$ include $C_{7-20}$ aralkyl group which may have a substituent. Specific examples of such an aralkyl group include benzyl group, phenethyl group, and cumyl group.

Examples of the alkenyl group represented by $R_{14}$ include $C_{2-6}$ alkenyl group. Specific examples of such an alkenyl group include vinyl group, propenyl group, allyl group, butenyl group, pentenyl group, hexenyl group, cyclopentenyl group, cyclohexenyl group, 3-oxocyclohexenyl group, 3-oxocyclopentenyl group, and 3-oxoindenyl group. Among these alkenyl groups, the cyclic alkenyl group may contain oxygen atom.

Examples of the connecting group X include single group selected from the group consisting of alkylene group, cyclic alkylene group, arylene group, ether group, thioether group, carbonyl group, ester group, amide group, sulfonamide group, urethane group and urea group which may have a substituent or divalent group comprising in combination at least two of these groups which doesn't decompose by the action of an acid.

Z represents a single bond, ether group, ester group, amide group, alkylene group or divalent group comprising these groups in combination.

$R_{11}$ represents a single bond, alkylene group, arylene group or divalent group comprising these groups in combination.

$R_{13}$ represents an alkylene group, arylene group or divalent group comprising these groups in combination.

Examples of the arylene group represented by X, $R_{11}$ and $R_{13}$ include $C_{6-10}$ arylene group which may have a substituent. Specific examples of such an arylene group include phenylene group, tolylene group, and naphthylene group.

An example of the cyclic alkylene group represented by X is the foregoing cyclic alkyl group which is divalent.

The alkylene group represented by X, Z, $R_{11}$ and $R_{13}$ has the same meaning as A in the general formula (pA).

Specific examples of the connecting group A will be given below, but the present invention should not be construed as being limited thereto.

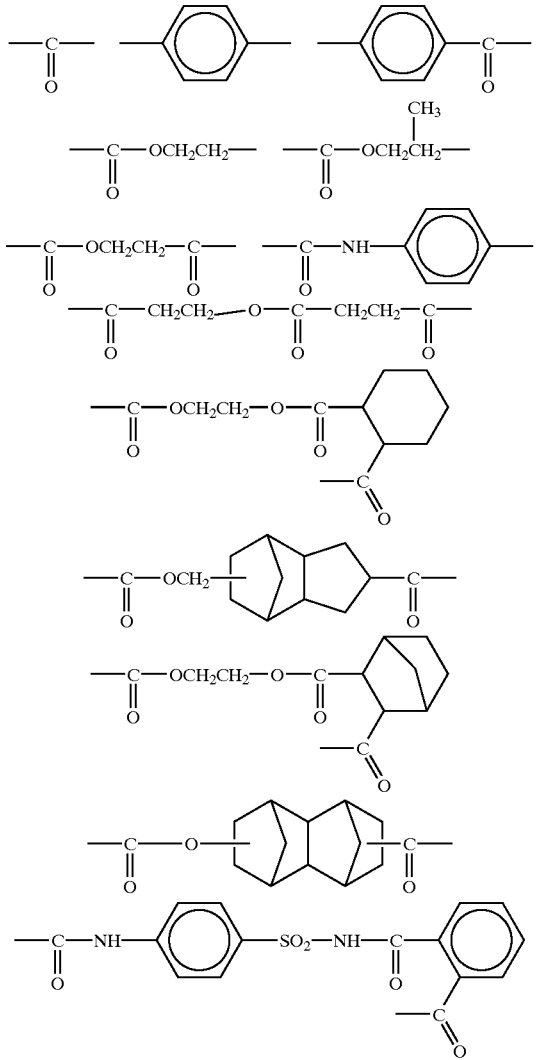

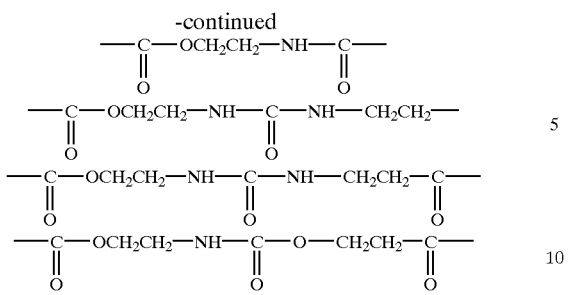

Examples of further substituents on the foregoing alkyl group, cyclic alkyl group, alkenyl group, aryl group, aralkyl group, alkylene group, cyclic alkylene group and arylene group include carboxyl group, acyloxy group, cyano group, alkyl group, substituted alkyl group, halogen atom, hydroxyl group, alkoxy group, acetylamide group, alkoxycarbonyl group, and acyl group.

Examples of the foregoing alkyl group include lower alkyl groups such as methyl group, ethyl group, propyl group, isopropyl group, butyl group, cyclopropyl group, cyclobutyl group and cyclopentyl group. Examples of the substituents on the substituted alkyl group include hydroxyl group, halogen atom, and alkoxy group. Examples of the foregoing alkoxy group include $C_{1-4}$ alkoxy group such as methoxy group, ethoxy group, propoxy group and butoxy group. Examples of the foregoing acyloxy group include acetoxy group. Examples of the halogen atom include chlorine atom, bromine atom, fluorine atom, and iodine atom.

Specific examples of the structure of side chain in the general formula (III-b) will be given below with X being excluded, but the present invention should not be construed as being limited thereto.

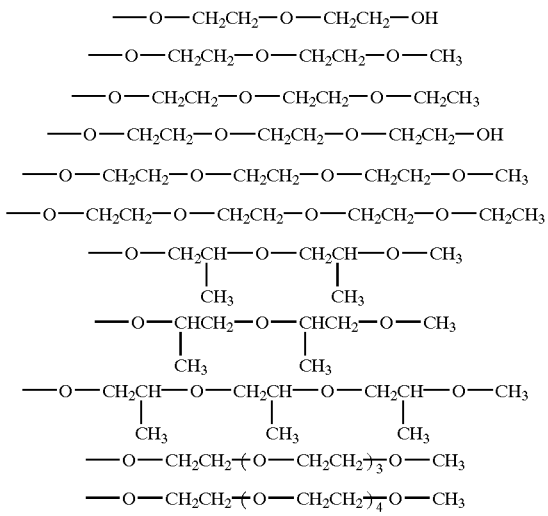

Specific examples of the monomer corresponding to the repeating structural unit represented by the general formula (III-c) will be given below, but the present invention should not be construed as being limited thereto.

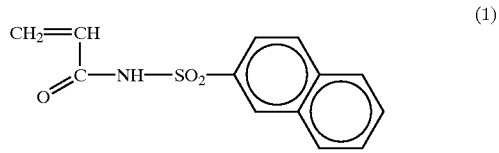

(1)

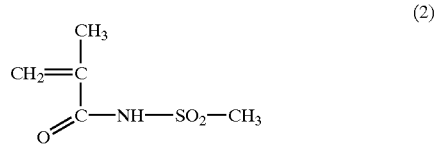

(2)

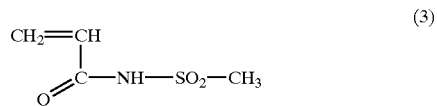

(3)

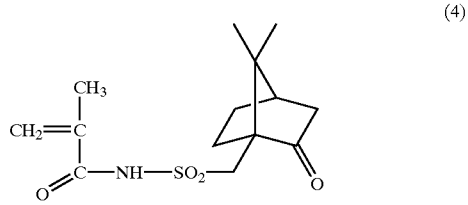

(4)

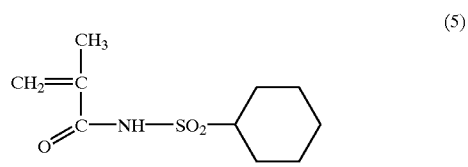

(5)

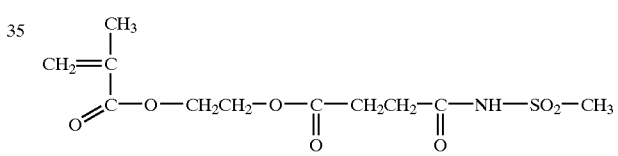

(6)

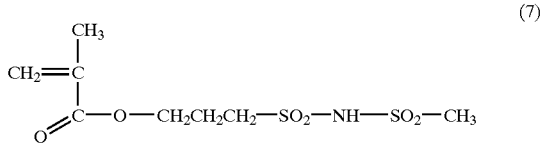

(7)

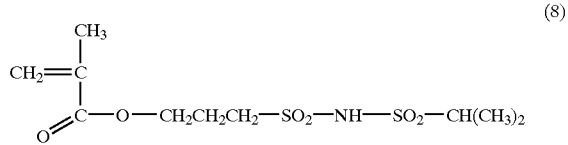

(8)

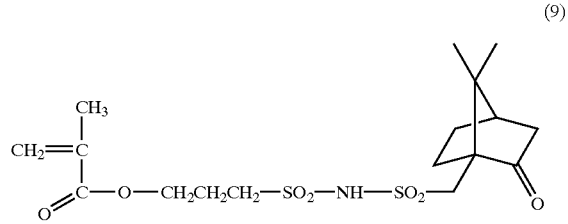

(9)

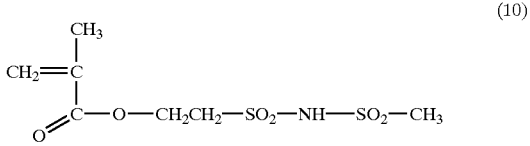

(10)

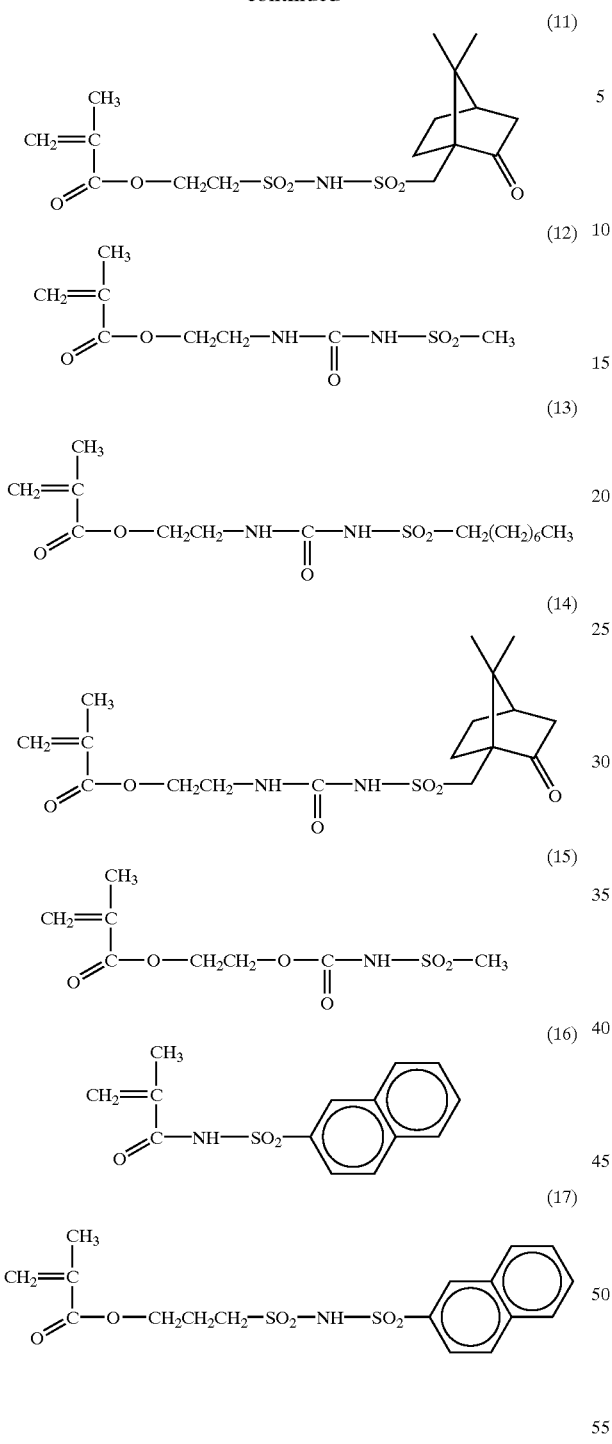
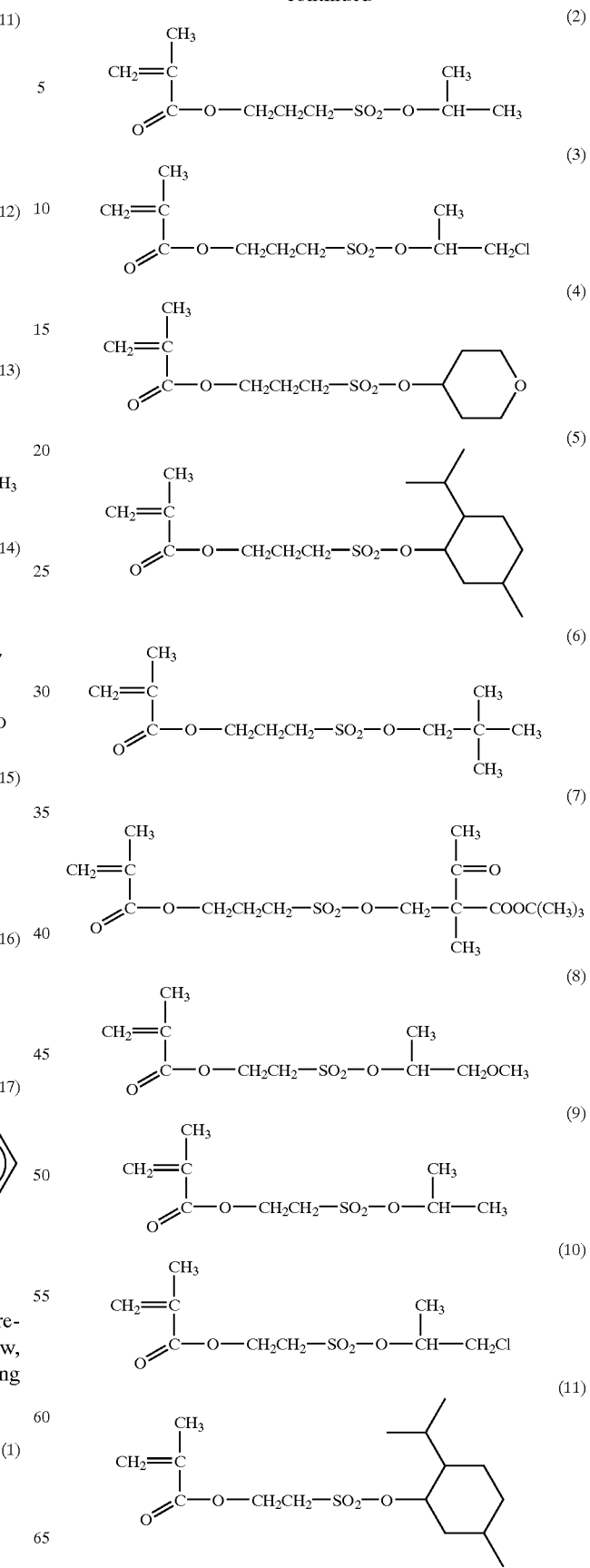
Specific examples of the repeating structural unit represented by the general formula (III-d) will be given below, but the present invention should not be construed as being limited thereto.

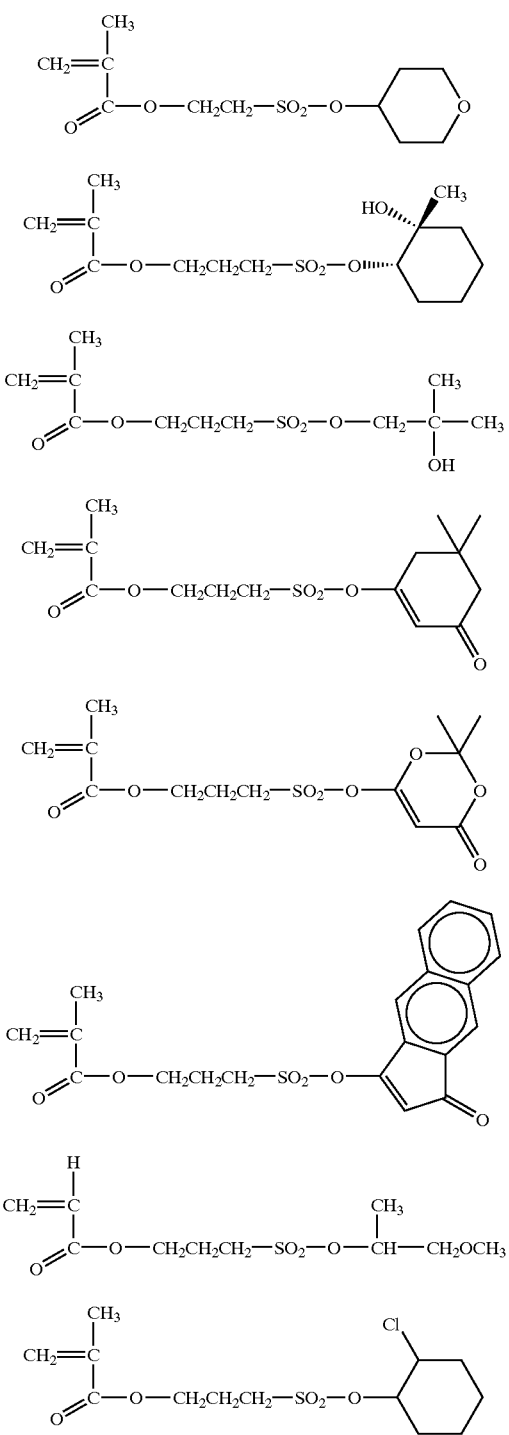

ester bond, $C_{1-6}$ alkylene group or combination thereof, more preferably a single bond or ester bond.

In the general formula (III-d), $R_{13}$ is preferably a $C_{1-4}$ alkylene group. $R_{14}$ is preferably a $C_{1-8}$ alkyl group such as methyl group, ethyl group, propyl group, isopropyl group, butyl group, neopentyl group and octyl group which may have a substituent, cyclohexyl group, adamantyl group, nornornyl group, boronyl group, isoboronyl group, mentyl group, morpholino group, 4-oxocyclohexyl group, or phenyl group, toluyl group, mesityl group, naphthyl group or camphor residue which may have a substituent. Examples of these further substituents include halogen atom such as fluorine atom, and $C_{1-4}$ alkoxy group.

Of the general formulae (III-a) to (III-d), the repeating structural units represented by the general formula (III-b) or (III-d) are preferred.

The acid-decomposable resin as the component (A) may contain various repeating structural units besides the foregoing repeating structural units for the purpose of adjusting dry etching resistance, adaptability to standard developer, adhesion to substrate, resist profile and required general characteristics of resist such as resolution, heat resistance and sensitivity.

Examples of these repeating structural units employable herein include those corresponding to the following monomers, but the present invention should not be construed as being limited thereto.

In this arrangement, properties required for acid-decomposable resin, particularly the following properties can be finely adjusted:

(1) Solubility in the coating solvent;
(2) Film-forming properties (glass transition temperature);
(3) Alkali-developability;
(4) Film thickness loss (selection of hydrophilic group, alkali-soluble group);
(5) Adhesion of unexposed area to substrate; and
(6) Dry etching resistance Examples of such a monomer include a compound having one addition-polymerizable unsaturated bond such as acrylic acid ester, methacrylic acid ester, acrylamide, methacrylamide, allyl compound, vinylether and vinylester.

Specific examples of such a compound include the following monomers.

Acrylic acid esters (preferably alkyl acrylate the alkyl moiety of which has from 1 to 10 carbon atoms):

Acrylic acid methyl, acrylic acid ethyl, acrylic acid propyl, acrylic acid amyl, acrylic acid cyclohexyl, acrylic acid ethylhexyl, acrylic acid octyl, acrylic acid t-octyl, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate Methacrylic acid esters (preferably alkyl methacrylate the alkyl group of which has from 1 to 10 carbon atoms):

Methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate Acrylamides:

Acrylamide, N-alkylacrylamide (having an alkyl moiety with from 1 to 10 carbon atoms such as methyl group, ethyl In the general formula (III-b), $R_3$ to $R_{10}$ each are preferably a hydrogen atom or methyl group. R is preferably a hydrogen atom or $C_{1-4}$ alkyl group. The suffix m represents an integer of from 1 to 6.

In the general formula (III-c), $R_{11}$ is preferably a single bond or alkylene group such as methylene group, ethylene group, propylene group and butylene group. $R_{12}$ is preferably a $C_{1-10}$ alkyl group such as methyl group and ethyl group, cyclic alkyl group such as cyclopropyl group, cyclohexyl group and camphor residue, naphthyl group or naphthylmethyl group. Z is preferably a single bond, ether bond, group, propyl group, butyl group, t-butyl group, heptyl group, octyl group, cyclohexyl group and hydroxyethyl group), N,N-dialkylacrylamide (having an alkyl moiety with from 1 to 10 carbon atoms such as methyl group, ethyl group, butyl group, isobutyl group, ethylhexyl group and cyclohexyl group), N-hydroxyethyl-N-methylacrylamide, N-2-acetamideethyl-N-acetylacrylamide Methacrylamides:

Methacrylamide, N-alkylmethacrylamide (having an alkyl moiety with from 1 to 10 carbon atoms such as methyl group, ethyl group, t-butyl group, ethylhexyl group, hydroxyethyl group, cyclohexyl group), N,N-dialkylmethacrylamide (having an alkyl moiety such as ethyl group, propyl group and butyl group), N-hydroxyethyl-N-methyl methacrylamide Allyl compounds:

Allyl esters (e.g., allyl acetate, allyl caproate, allyl caprate, allyl laurate, allyl palmitate, allyl stearate, allyl benzoate, allyl acetoacetate, allyl lactate), allyl oxyethanol Vinyl ethers:

Alkyl vinyl ether (e.g., hexyl vinyl ether, octyl vinyl ether, decyl vinyl ether, ethyl hexyl vinyl ether, methoxy ethyl vinyl ether, ethoxy ethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylamino ethyl vinyl ether, diethylamino ethyl vinyl ether, butylamino ethyl vinyl ether, benzyl vinyl ether, tetrahydrofurfuryl vinyl ether)

Vinyl esters:

Vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl acetoacetate, vinyl lactate, vinyl-β-phenyl butyrate, vinylcyclohexyl carboxylate Itaconic acid dialkyls:

Itaconic acid dimethyl, itaconic diethyl, itaconic acid dibutyl, fumaric acid dialkyl ester, fumaric acid monoalkyl ester, dibutyl fumarate Others:

Crotonic acid, itaconic acid, maleic anhydride, maleimide, acrylonitrile, methacrylonitrile, maleilonitrile Other monomers may be copolymerized so far as they are addition-polymerizable unsaturated compounds copolymerizable with the monomers corresponding to the various repeating structural units.

The mixing molar ratio of the various repeating structural units in the acid-decomposable resin may be properly predetermined to adjust dry etching resistance, adaptability to standard developer, adhesion to substrate, resist profile and required general characteristics of resist such as resolution, heat resistance and sensitivity.

The content of the repeating structural unit containing an alkali-soluble group protected by the structure represented by the general formulae (pI) to (pVI) in the acid-decomposable resin is preferably from 30 to 70 mol-%, more preferably from 35 to 65 mol-%, even more preferably from 40 to 60 mol-% based on the total content of repeating structural units.

The content of the repeating structural units represented by the general formulae (III-a) to (III-d) in the acid-decomposable resin is preferably from 0 to 20 mol-%, more preferably from 0 to 18 mol-%, even more preferably from 0 to 16 mol-% based on the total content of repeating structural units.

The content of other acid decomposable group-containing repeating structural units in the acid-decomposable resin than the repeating structural unit containing an alkali-soluble group protected by the structure represented by the general formulae (pI) to (pVI) is preferably from 0 to 20 mol-%, more preferably from 0 to 18 mol-%, even more preferably from 0 to 16 mol-% based on the total content of repeating structural units.

The content of the repeating structural unit having a lactone structure in the acid-decomposable resin is preferably from 20 to 70 mol-%, more preferably from 25 to 65 mol-%, even more preferably from 30 to 60 mol-% based on the total content of repeating structural units.

The content of the repeating structural unit based on the further copolymerizable component monomer in the resin can be properly predetermined according to the desired properties of the resist. In practice, however, it is preferably 99 mol-% or less, more preferably 90 mol-% or less, even more preferably 80 mol-% or less based on the total molar amount of repeating structural units containing an alkali-soluble group protected by the structure represented by the general formulae (pI) to (pVI).

The acid-decomposable resin to be used in the invention has a monomer content of 5% or less, preferably from 0.01% to 4%, more preferably from 0.1% to 3% based on the total pattern area of gel permeation chromatography (GPC). For GPC, Shodex system-11, produced by Showa Denko K.K., may be used.

By predetermining the content of monomers in the acid-decomposable resin to the above defined value, the resulting photoresist composition exhibits a high sensitivity and can provide a pattern having an excellent profile free of edge roughness.

The acid-decomposable resin to be used in the invention can be synthesized by ordinary method (e.g., radical polymerization). In order to provide the acid-decomposable resin with the foregoing predetermined content of monomers, at least one of the following means (i) to (iv) may be used to effect synthesis or recovery.

(i) To add a reaction solution containing various monomers and a radical polymerization initiator dropwise to a reaction solvent or a reaction solution containing monomers.

(ii) To add a radical polymerization initiator to a reaction solution containing various monomer by portions in 30 minutes to 8 hours to cause polymerization reaction.

(iii) To heat a reaction solution containing various monomers and a radical polymerization initiator to cause polymerization reaction, add the radical polymerization initiator to the product of polymerization reaction, and then heat the mixture to cause polymerization reaction.

(iv) To add a reaction solution obtained by polymerization reaction to at least one solvent selected from the group consisting of water, at least one of alcohols, water/alcohol mixture, water/ether mixture, water/ketone mixture, water/amide mixture, water/ester mixture, water/lactone mixture and watet/nitrile mixture to give a product which is then recovered in the form of powder.

In the present invention, preferred among the foregoing means are means (i) and (iii) in combination, means (ii) and (iii) in combination, means (i), (iii) and (iv) in combination or (ii), (iii) and (iv) in combination.

Specific examples of synthesis method will be given below.

A dropping method which comprises adding monomers to be reacted to a reaction solvent with an initiator, and then adding gradually the mixture dropwise to a reaction solvent optionally having a part of monomers which has been heated to a predetermined temperature in a nitrogen atmosphere (method corresponding to the means (i));

A method which comprises adding monomers to be reacted to a reaction solvent, uniformalizing the reaction solution, and then heating the reaction solution with stirring in a nitrogen atmosphere to a predetermined temperature where the reaction solution then undergoes polymerization reaction with a radical polymerization initiator being added by portions in a predetermined period of time (method corresponding to the means (ii)); and A method which comprises adding monomers to be reacted to a reaction solvent, uniformalizing the reaction solution, heating the reaction solution with stirring in a nitrogen atmosphere to a predetermined temperature where the reaction solution then undergoes polymerization reaction with a radical polymerization initiator being added at once, and then adding the initiator to the reaction solution (method corresponding to the means (iii))

These methods may be used singly or in combination.

Preferred among these methods is the dropping method (i). By selecting the dropping method (i), the effect of the present invention of improving resolution, eliminating edge roughness and other resist properties can be exerted more, though the mechanism being quite unknown.

In the present invention, the temperature of the foregoing various reactions may be properly predetermined depending on the kind of the initiator used. In practice, however, it is normally from 30° C. to 180° C., preferably from 40° C. to 160° C., more preferably from 50° C. to 140° C.

The dropping time at the dropping method (i) can be predetermined to various values depending on the reaction temperature, the kind of the initiator used and the kind of monomers to be reacted. In practice, however, it is normally from 30 minutes to 8 hours, preferably from 45 minutes to 6 hours, more preferably from 1 to 5 hours.

In the method (i), if the mixture is added to a solution containing monomers, the content of monomers in the solution to be dropwise added is preferably 30 mol-% or more, more preferably 50 mol-% or more, even more preferably 70 mol-% or more based on the total amount of monomers in the solution to be dropwise added and the solution to which the former solution is added dropwise.

The time during which the initiator is added in the method (ii) can be predetermined to various values depending on the reaction temperature, the kind of the initiator used and the kind of monomers to be reacted. In practice, however, it is preferably from 30 minutes to 8 hours, preferably from 45 minutes to 6 hours, more preferably from 1 to 5 hours. In the method (ii), the time intervals at which the initiator is added is preferably from 10 minutes to 3 hours, more preferably from 20 minutes to 2 hours and 30 minutes, even more preferably from 30 minutes to 2 hours. The number of times by which the initiator is added is preferably from 2 to 20, more preferably from 3 to 15, even more preferably from 4 to 10.

When the method (ii) or (iii) is used, the addition of the initiator is followed by heating with stirring to a predetermined temperature in a nitrogen atmosphere for a predetermined period of time. In the case of the dropping method (i), too, the dropwise addition is followed by heating to a predetermined temperature in a nitrogen atmosphere for a predetermined period of time. The heating time varies with the reaction temperature and the kind of initiator. In practice, however, it is normally 10 hours or less, preferably 8 hours or less, more preferably 6 hours or less.

In any case, the step involving heating with stirring for a predetermined period of time is preferably followed by adding the initiator again. The further addition of the initiator results in the improvement of sensitivity and resolution and elimination of edge roughness, though its mechanism being unknown. The further addition of the initiator is similarly followed by heating with stirring for a predetermined period of time. The further addition of the initiator may be followed by raising the temperature.

As the solvent to be used in the reaction there may be used any solvent which can dissolve the monomer used therein but doesn't inhibit polymerization (polymerization initiator such as nitrobenzene, chain transfer agent such as mercapto compound). Examples of such a solvent include alcohols, ethers, ketones, amides, esters, lactones, nitriles, and mixture thereof. Specific examples of the alcohols include methanol, ethanol, propanol, isopropanol, butanol, ethylene glycol, propylene glycol, ethylene glycol monomethyl ether, ethylene glycol monoethyl ether, and 1-methoxy-2-propanol. Specific examples of the ethers include propyl ether, isopropyl ether, butylmethyl ether, tetrahydrofuran, 1,4-dioxane, 1,3-dioxolan, and 1,3-dioxane. Specific examples of the ketones include acetone, methyl ethyl ketone, diethyl ketone, methyl isopropyl ketone, and methyl isobutyl ketone. Specific examples of the amides include N,N-dimethylformamide, and N,N-dimethylacetamide. Specific examples of the esters and lactones include ethyl acetate, methyl acetate, isobutyl acetate, and γ-butyrolactone. Specific examples of the nitrites include acetonitrile, propionitrile, and butrylonitrile.

Preferred among these solvents are 1-methoxy-2-propanol, ethylene glycol monomethyl ether, ethylene glycol monoethyl ether, tetrahydrofuran, 1,4-dioxane, 1,3-dioxolan, 1,3-dioxane, methyl ethyl ketone, N,N-dimethylformamide, N,N-dimethylacetamide, γ-butyrolactone, and acetonitrile.

Specific examples of the mixed solvent include mixture of alcohol and ether, mixture of alcohol and ketone, mixture of alcohol and amide, mixture of alcohol, ester and lactone, mixture of ethers, mixture of ether and ketone, mixture of ether and amide, mixture of ether, ester and lactone, mixture of ether and nitrile, mixture of ketone and amide, mixture of ketone, ester and lactone, mixture of ketone and nitrile, mixture of amide, ester and lactone, mixture of amide and nitrile, mixture of ester and lactone, and mixture of nitriles.

Preferred examples of the mixed solvent include mixture of 1-methoxy-2-propanol and tetrahydrofuran, mixture of 1-methoxy-2-propanol and 1,4-dioxane, mixture of 1-methoxy-2-propanol and 1,3-dioxolan, mixture of 1-methoxy-2-propanol and 1,3-dioxane, mixture of 1-methoxy-2-propanol and methyl ethyl ketone, mixture of 1-methoxy-2-propanol and N,N-dimethylformamide, mixture of 1-methoxy-2-propanol and N,N-dimethylacetamide, mixture of 1-methoxy-2-propanol and γ-butyrolactone, mixture of ethylene glycol monomethy ether and tetrahydrofuran, mixture of ethylene glycol monomethyl ether and 1,4-dioxane, mixture of ethylene glycol monomethyl ether and 1,3-dioxolan, mixture of ethylene glycol monomethyl ether and 1,3-dioxane, mixture of ethylene glycol monomethyl ether and methyl ethyl ketone, mixture of ethylene glycol monomethyl ether and N,N-dimethylformamide, mixture of ethylene glycol monomethyl ether and N,N-dimethylacetamide, mixture of ethylene glycol monomethyl ether and γ-butyrolactone, mixture of ethylene glycol monoethyl ether and tetrahydrofuran, mixture of ethylene glycol monoethyl ether and 1,4-dioxane, mixture of ethylene glycol monoethyl ether and 1,3-dioxolane, mixture of ethylene glycol monoethyl ether and 1,3-dioxane, mixture of ethylene glycol monoethyl ether and methyl ethyl ketone, mixture of ethylene glycol monoethyl ether and N,N-dimethylformamide, mixture of ethylene glycol monoethyl ether and N,N-dimethylacetamide, mixture of ethylene glycol monoethyl ether and γ-butyrolactone, mixture of tetrahydrofuran and 1,4-dioxane, mixtur of tetrahydrofuran and 1,3-dioxolane, mixture of tetrahydrofuran and 1,3-dioxane, mixture of tetrahydrofuran and methyl ethyl ketone, mixture of tetrahydrofuran and N,N-dimethylformamide, mixture of tetrahydrofuran and N,N-dimethylacetamide, mixture of tetrahydrofuran and γ-butyrolactone, mixture of tetrahydrofuran and acetonitrile, mixture of methyl ethyl ketone and N,N-dimethylacetamide, mixture of methyl ethyl ketone and γ-butyrolactone, mixture of N,N-dimethylacetamide and γ-butyrolactone, mixture of N,N-dimethylformamide and acetonitrile, mixture of N,N-dimethylacetamide and acetonitrile, and mixture of γ-butyrolactone and acetonitrile.

The amount of the reaction solvent to be used varies with the desired molecular weight and the kind of monomers and initiator used. In practice, however, as calculated in terms of solution of monomer in solvent, the monomer concentration is normally from 12% to 30% by weight, preferably from 14% to 28% by weight, more preferably from 16% to 26% by weight.

Examples of the radical polymerization initiator to be used in the reaction of the invention will be given below.

As the radical polymerization initiator there may be used a commonly used radical polymerization initiator such as peroxide and azo-based initiator. Azo-based initiators are preferred. Specific examples of azo-based initiators include 2,2'-azobis (4-methoxy-2,4-dimethylvaleronitrile), 2,2'-azobis(2-cyclopropylpropionitrile), 2,2'-azobis(2,4-dimethylvaleronitrile), 2,2'-azobisisobutyronitrile, 2,2'-azobis(2-methylbutyronitrile), 1,1'-azobis(cyclohexane-1-carbonitrile), 2,2'-azobis (2-methyl-N-phenylpropionamidine)dihydrochloride, 2,2'-azobis(2-methyl-N-2-propenylpropionamidine)dihydrochloride, 2,2'-azobis[2-(5-methyl-2-imidazoline-2-il)propane] dihydrochloride, 2,2'-azobis{2-methyl-N-[1,1-bis(hydroxymethyl)2-hydroxyethyl]propionamide}, dimethyl-2,2'-azobis(2-methylpropionate), 4,4'-azobis(4-cyanovaleric acid), and 2,2'-azobis(2-(hydroxymethyl)propionitrile).

Preferred among these radical polymerization initiators are 2,2'-azobis(4-methoxy-2,4-dimethylvaleronitrile), 2,2'-azobisisobutyronitrile, 2,2'-azobis(2-methylbutyronitrile), 1,1'-azobis(cyclohexane-1-carbonitrile), dimethyl-2,2'-azobis(2-methylpropionate), 4,4'-azobis(4-cyanovaleric acid), and 2,2'-azobis (2-(hydroxymethyl)propionitrile).

In the present invention, the polymer (resin) obtained by the foregoing polymerization reaction is preferably recovered by reprecipitation method. In other words, the reaction solution obtained by polymerization is poured into reprecipitating solution to give a desired resin which is then recovered in the form of powder.

Examples of the reprecipitating solution include water, alcohols, ethers, ketones, amides, esters, lactones, and nitrites. These reprecipitating solutions may be used singly or in admixture. Examples of the alcohols include methanol, ethanol, propanol, isopropanol, butanol, ethylene glycol, propylene glycol, and 1-methoxy-2-propanol. Examples of the ethers include propyl ether, isopropyl ether, butyl methyl ether, tetrahydrofuran, 1,4-dioxane, 1,3-dioxolane, and 1,3-dioxane. Examples of the ketones include acetone, methyl ethyl ketone, diethyl ketone, methyl isopropyl ketone, and methyl isobutyl ketone. Examples of the amides include N,N-dimethylformamide, and N,N-dimethylacetamide. Examples of the esters and lactones include ethyl acetate, methyl acetate, isobutyl acetate, and γ-butyrolactone. Examples of the nitrites include acetonitrile, propionitrile, and butyronitrile.

Examples of the mixed solvent include mixture of alcohols, mixture of water and alcohol, mixture of water and ether, mixture of water and ketone, mixture of water and amide, mixture of water and ester, mixture of water and lactone, and mixture of water and nitrile.

Specific examples of the mixed solvent include mixture of methanol and ethanol, mixture of methanol and propanol, mixture of methanol and isopropanol, mixture of methanol and butanol, mixture of ethylene glycol and ethanol, mixture of ethylene glycol and propanol, mixture of ethylene glycol and isopropanol, mixture of ethylene glycol and butanol, mixture of 1-methoxy-2-propanol and ethanol, mixture of 1-methoxy-2-propanol and propanol, mixture of 1-methoxy-2-propanol and isopropanol, mixture of 1-methoxy-2-propanol and butanol, mixture of water and methanol, mixture of water and methanol, mixture of water and ethanol, mixture of water and propanol, mixture of water and isopropanol, mixture of water and butanol, mixture of water and ethylene glycol, mixture of water and propylene glycol, mixture of water and 1-methoxy-2-propanol, mixture of water and tetrahydrofuran, mixture of water and acetone, mixture of water and methyl ethyl ketone, mixture of water and N,N-dimethylformamide, mixture of water and N,N-dimethylacetamide, mixture of water and γ-butrolactone, and mixture of water and acetonitrile. The mixing ratio of these components is from 20/1 to 1/20.

A preferred example of reprecipitating solution is water, at least one alcohol or at least one solution selected from the group consisting of water/alcohol mixture, water/ether mixture, water/ketone mixture, water/amide mixture, water/ester mixture, water/lactone mixture and water/nitrile mixture.

Even more desirable examples of reprecipitating solution include water, methanol, isopropanol, mixture of water and methanol, mixture of water and ethanol, mixture of water and propanol, mixture of water and isopropanol, mixture of water and butanol, mixture of water and ethylene glycol, mixture of water and propylene glycol, mixture of water and 1-methoxy-2-propanol, mixture of water and tetrahydrofuran, mixture of water and acetone, mixture of water and methyl ethyl ketone, mixture of water and N,N-dimethylformamide, mixture of water and N,N-dimethylacetamide, mixture of water and γ-butyrolactone, and mixture of water and acetonitrile. Particularly preferred among these reprecipitating solutions are methanol, isopropanol, mixture of water and methanol, mixture of water and ethanol, mixture of water and propanol, mixture of water and 1-methoxy-2-propanol, mixture of water and tetrahydrofuran, mixture of water and acetone, mixture of water and methyl ethyl ketone, and mixture of water and acetonitrile.

The reprecipitation in a hydrocarbon solvent such as hexane and heptane as reprecipitating solution as disclosed in JP-A-9-73173, JP-A-10-207069 and JP-A-10-274852 is so extremely dangerous as to cause extreme static electrification and hence give difficulty in working to disadvantage.

It was also found that the repetition of reprecipitation merely causes an increase in the amount of waste liquid in vain, gives a poor working efficiency and leads to worsening of edge roughness as described in JP-A-10-301285. In the present invention, the number of times of reprecipitation may be from 1 to 3, preferably 1.

The amount of the reprecipitating solution to be used is properly predetermined depending on the amount and kind of the solvent to be used in polymerization and the kind of the reprecipitating solution used. In practice, however, it is normally from 3 to 100 times, preferably from 4 to 50 times, more preferably from 5 to 30 times by volume the amount of the polymerization solution. When the amount of the reprecipitating solution to be used is too small, it is difficult for the reprecipitating solution to be separated from the powder recovered, deteriorating the working efficiency. On the contrary, when the amount of the reprecipitating solution to be used is too great, the amount of waste liquid increases to disadvantage on an economic basis.

The molecular weight of the foregoing acid-decomposable resin is preferably from 3,000 to 100,000, more preferably from 4,000 to 70,000, more preferably from 5,000 to 50,000 as calculated in terms of weight-average molecular weight (Mw: in polystyrene equivalence as determined by GPC). The greater the molecular weight of the acid-decomposable resin is, the better is the heat resistance of the resin but the poorer are the developability and other properties thereof. Thus, the molecular weight of the acid-decomposable resin is adjusted so properly that these properties are well-balanced.

In the positive-working resist composition of the invention, the amount of the acid-decomposable resin to be incorporated in the entire resist composition is preferably from 40% to 99.99% by weight, more preferably from 50% to 99.97% by weight based on the total solid content.

Specific examples of combination of repeating structural units constituting the acid-decomposable resin as component (A) will be given below.

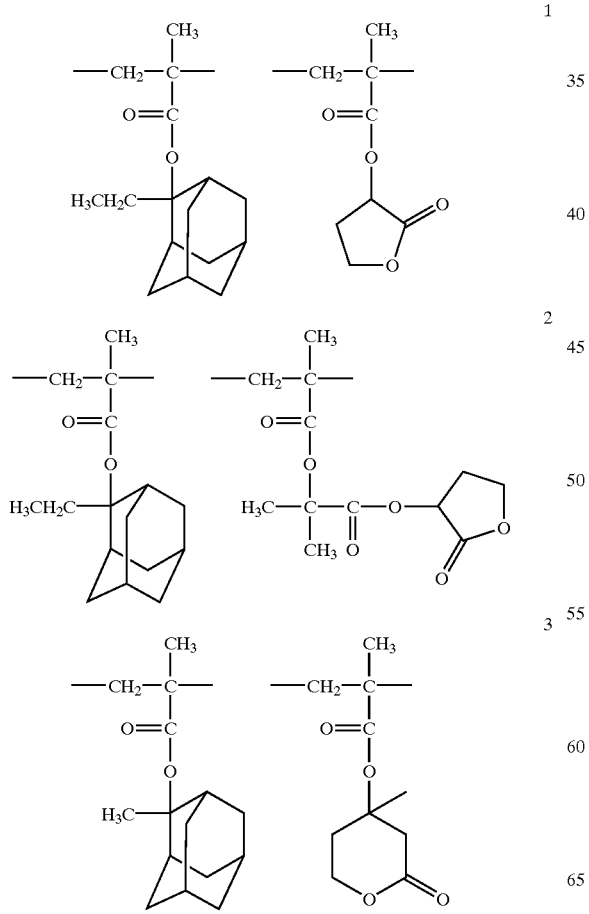

-continued

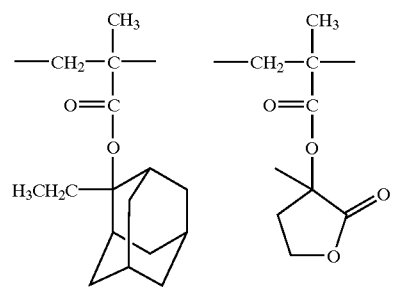

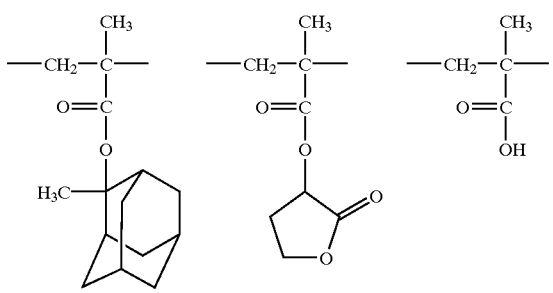

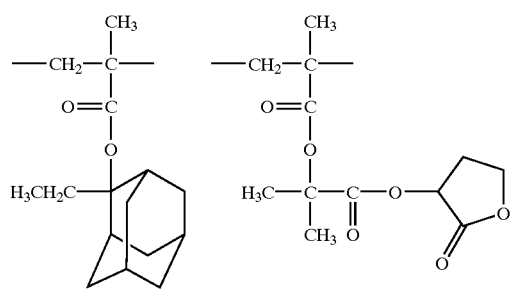

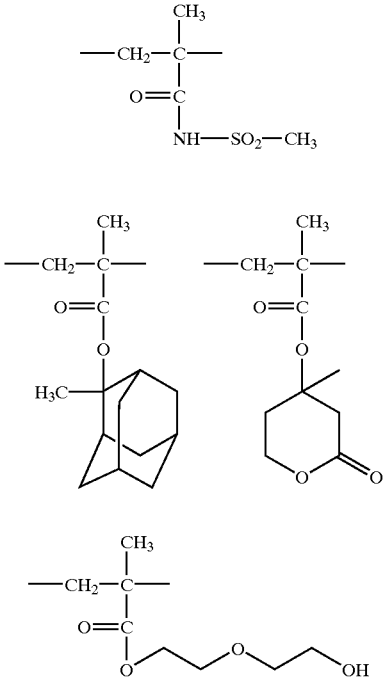

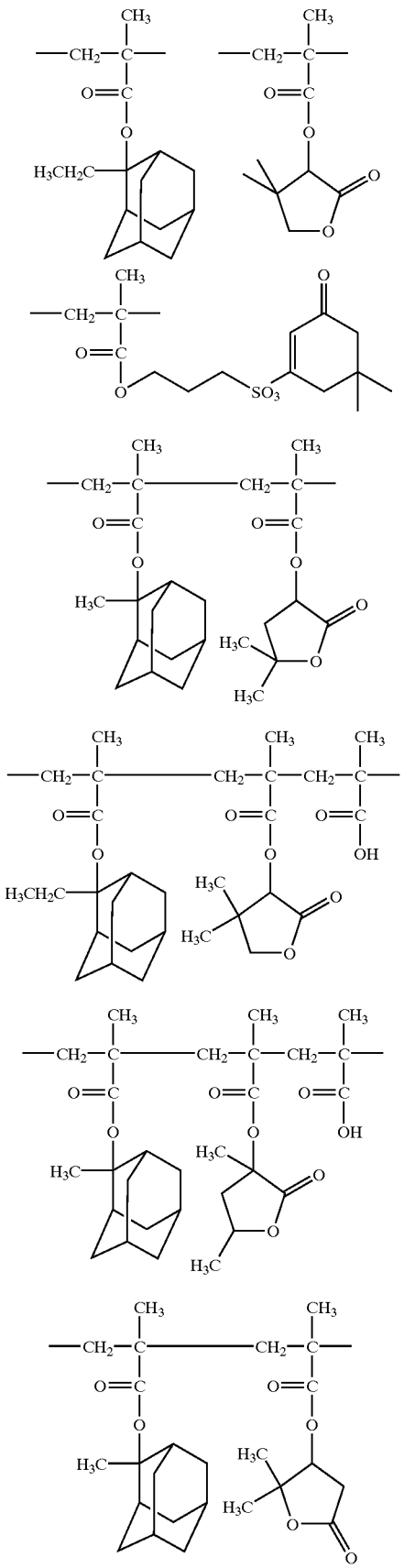

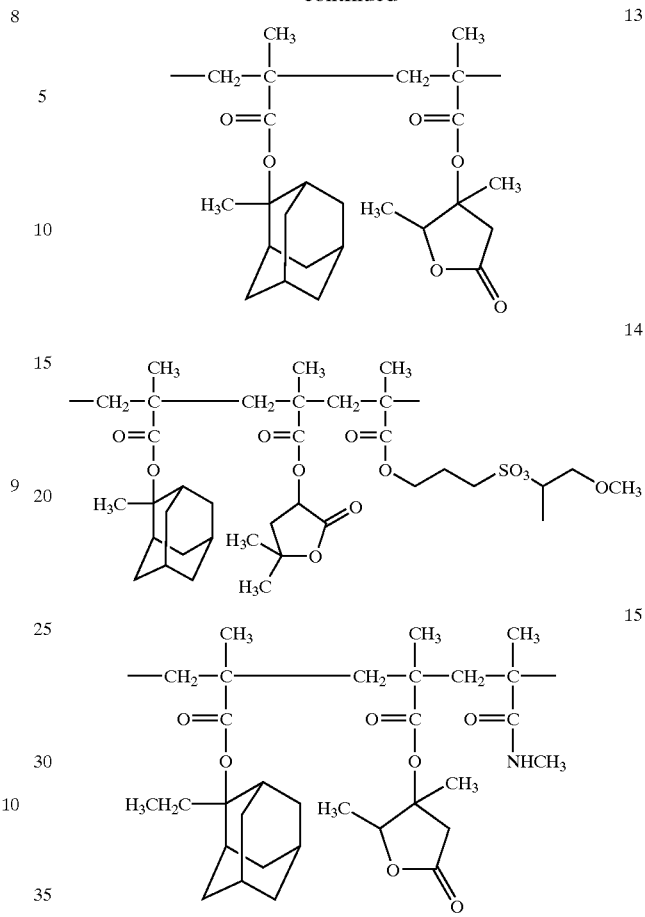

The various constituents of the acid-decomposable resin of the present invention as component (A') will be further described hereinafter.

In the general formula (Ia), $R_1$ and $R_2$ each independently represent a hydrogen atom, cyano group, hydroxy group, —COOH, —COOR$_5$, —CO—NH—R$_6$, —CO—NH—SO$_2$—R$_6$, alkyl, alkoxy or cyclic hydrocarbon group which may be substituted or —Y group defined above. $R_5$ represents an alkyl or cyclic hydrocarbon group which may have a substituent or —Y group defined above. $R_6$ represents an alkyl or cyclic hydrocarbon group which may have a substituent.

In —Y group, $R_{21}$ to $R_{30}$ each independently represent a hydrogen atom or an alkyl group which may have a substituent. The suffixes a and b each represent an integer of from 1 to 2.

X represents oxygen atom, sulfur atom, —NH—, —NHSO$_2$— or —NHSO$_2$NH—.

A represents a single bond or divalent connecting group.

In the general formula (Ib), $Z_2$ represents —O— or —N(R$_3$)—. R3 represents a hydrogen atom, hydroxyl group or —OSO$_2$—R$_4$. $R_4$ represents an alkyl group, haloalkyl group, cycloalkyl group or camphor residue.

The alkyl group represented by $R_1$, $R_2$, $R_4$, $R_5$, $R_6$ and $R_{21}$ to $R_{30}$ is preferably a $C_{1-10}$ straight-chain or branched alkyl group, more preferably a $C_{1-6}$ straight-chain or branched alkyl group, even more preferably a methyl group, ethyl group, propyl group, isopropyl group, n-butyl group, isobutyl group, sec-butyl group or t-butyl group.

Examples of the cyclic hydrocarbon group represented by $R_1$, $R_2$, $R_5$ and $R_6$ include cyclopropyl group, cyclopentyl group, cyclohexyl group, adamantyl group, 2-methyl-2-adamantyl group, norbornyl group, boronyl group, isoboronyl group, tricyclodecanyl group, dicyclopentenyl group, norbornaneepoxy group, menthyl group, isomenthyl group, neomenthyl group, and tetracyclododecanyl group.

Examples of the alkoxy group represented by $R_1$ and $R_2$ include $C_{1-4}$ alkoxy group such as methoxy group, ethoxy group, propoxy group and butoxy group.

Examples of the haloalkyl group represented by $R_4$ include trifluoromethyl group, nanofluorobutyl group, pentadecafluorooctyl group, and trichloromethyl group. Examples of the cycloalkyl group represented by $R_4$ include cyclopentyl group, cyclohexyl group, and cyclooctyl group.

Examples of further substituents on the foregoing alkyl group, cyclic hydrocarbon group and alkoxy group include hydroxyl group, halogen atom, carboxyl group, alkoxy group, acyl group, cyano group, and acyloxy group. Examples of the halogen atom include chlorine atom, bromine atom, fluorine atom, and iodine atom. Examples of the alkoxy group include $C_{1-4}$ alkoxy group such as methoxy group, ethoxy group, propoxy group and butoxy group. Examples of the acyl group include formyl group, and acetyl group. Examples of the acyloxy group include acetoxy group.

Examples of the divalent connecting group represented by A in the general formulae (Ia) and (Ib) include alkylene group, substituted alkylene group, ether group, thioether group, carbonyl group, ester group, amide group, sulfonamide group, urethane group, and urea group. These divalent connecting groups may be used singly or in combination of two or more thereof.

Examples of the unsubstituted or substituted alkylene group represented by A include group represented by the following general formula:

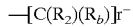

In the foregoing general formula, $R_2$ and $R_b$ may be the same or different and each represent a hydrogen atom, alkyl group, substituted alkyl group, halogen atom, hydroxyl group or alkoxy group. Examples of the alkyl group include lower alkyl group such as methyl group, ethyl group, propyl group, isopropyl group and butyl group. Preferred among these alkyl groups are methyl group, ethyl group, propyl group and isopropyl group. Examples of substituents on the substituted alkyl group include hydroxyl group, halogen atom, and alkoxy group. Examples of the alkoxy group include $C_{1-4}$ alkoxy group such as methoxy group, ethoxy group, propoxy group and butoxy group. Examples of the halogen atom include chlorine atom, bromine atom, fluorine atom, and iodine atom. The suffix r represents an integer of from 1 to 10.

Specific examples of the repeating structural unit represented by the general formula (Ia) will be given below, but the present invention should not be construed as being limited thereto.

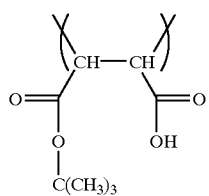

[I-1]

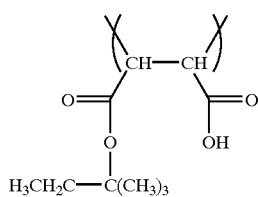

[I-2]

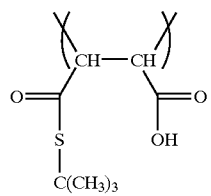

[I-3]

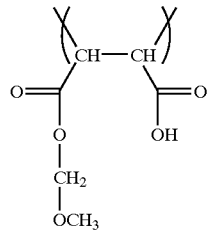

[I-4]

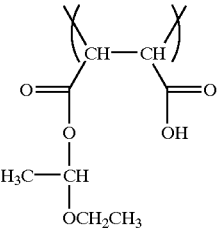

[I-5]

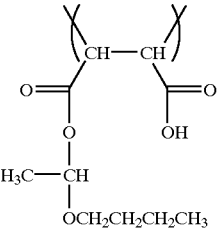

[I-6]

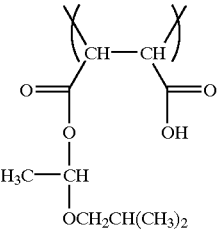

[I-7]

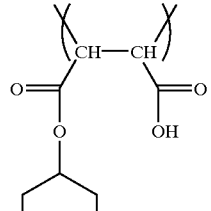

[I-8]

-continued
[I-9]
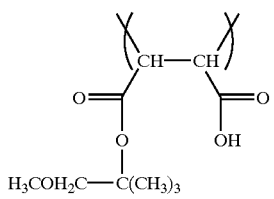
[I-10]
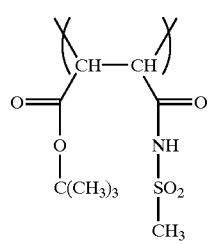
[I-11]
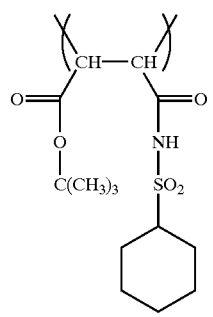
[I-12]
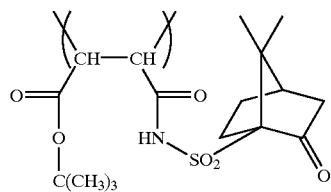
[I-13]
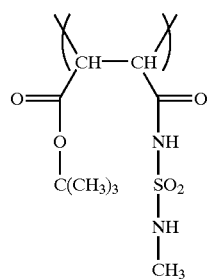
[I-14]
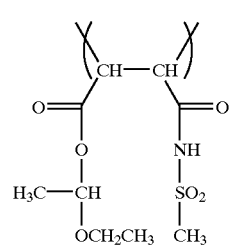
-continued
[I-15]
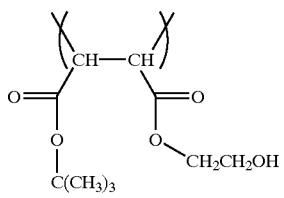
[I-16]
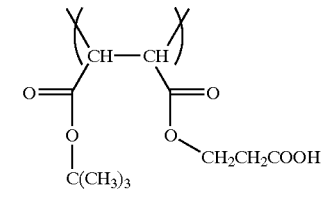
[I-17]
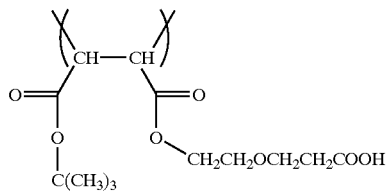
[I-18]
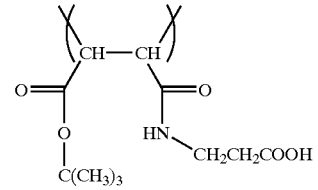
[I-19]
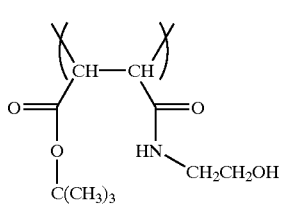
[I-20]
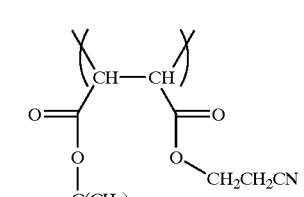
[I-21]
[I-22]
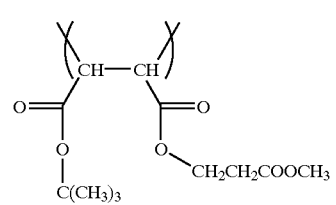

[I-23] 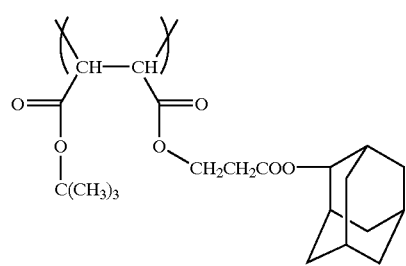
[I-24] 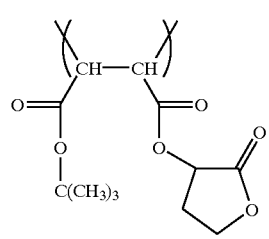
[I-25] 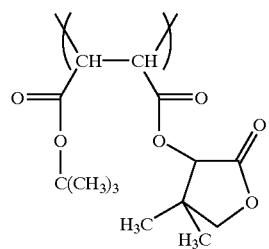
[I-26] 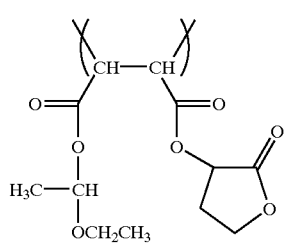
[I-27] 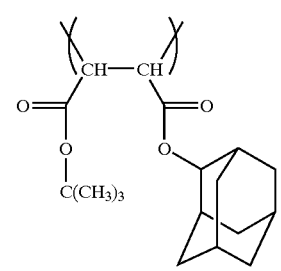
[I-28] 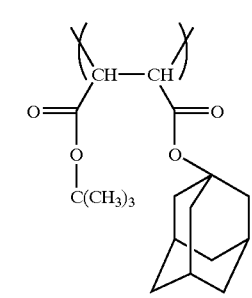
[I-29] 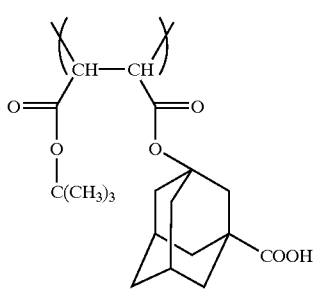
[I-30] 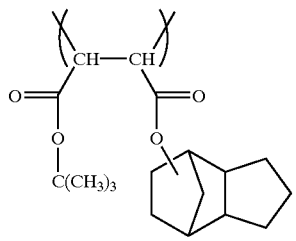
[I-31] 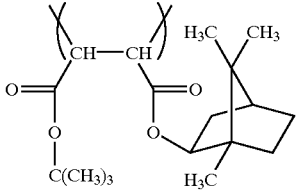
[I-32] 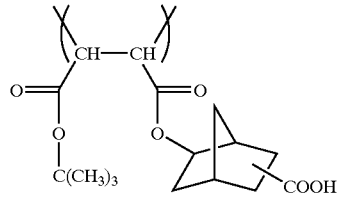
[I-33] 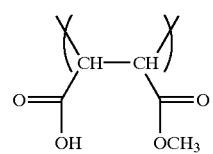
[I-34] 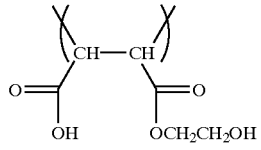
[I-35] 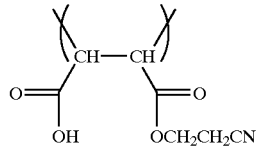
[I-36] 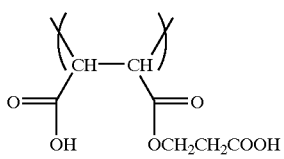

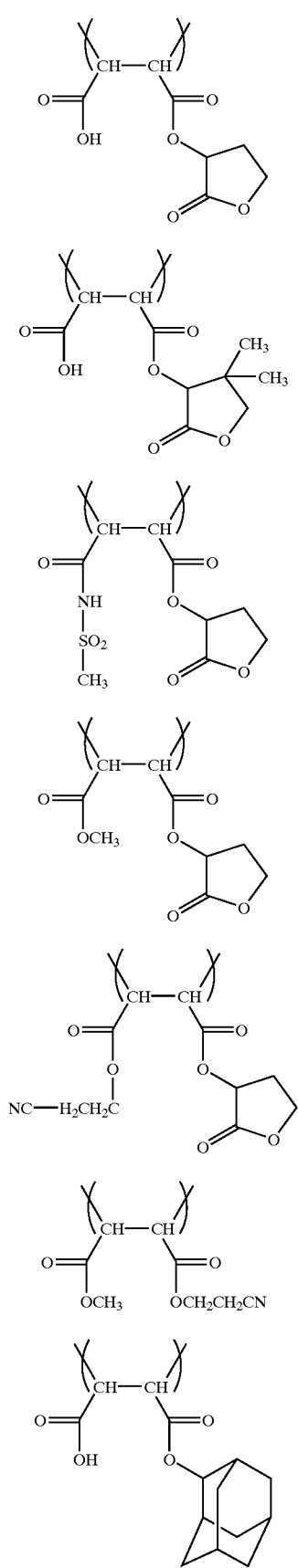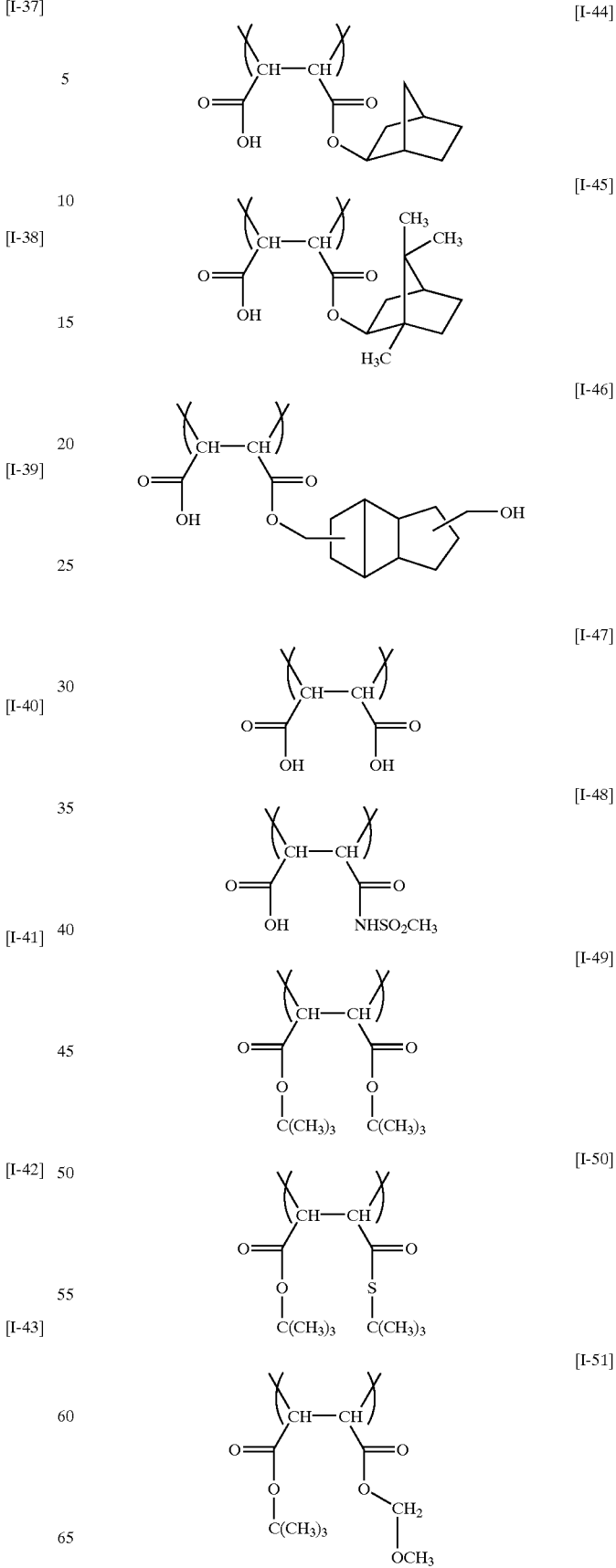

-continued
[I-52] 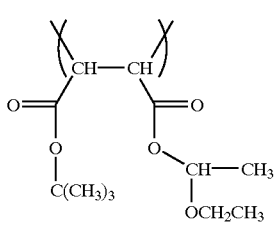
[I-53] 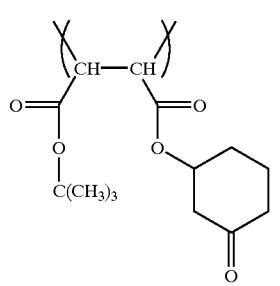
[I-54] 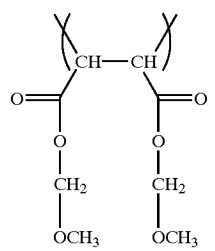
[I-55] 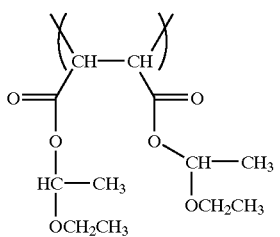
[I-56] 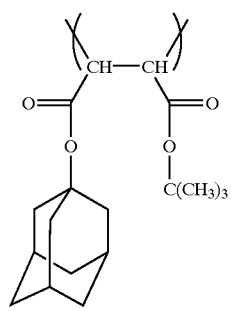
[I-57] 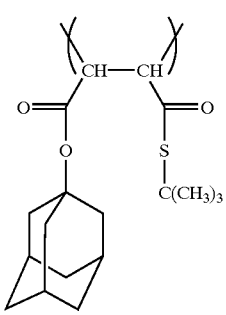
-continued
[I-58] 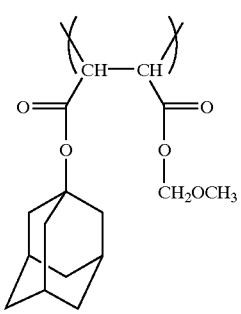
[I-59] 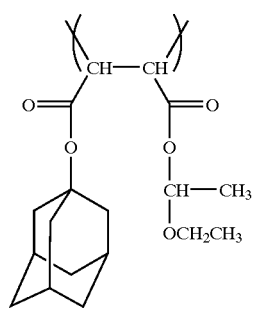
[I-60] 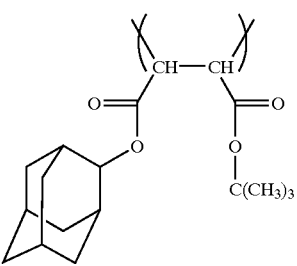
[I-61] 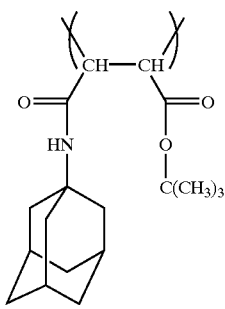
[I-62] 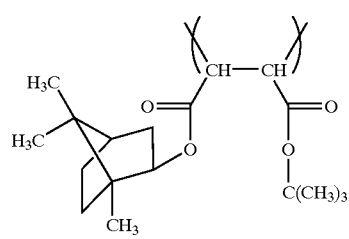

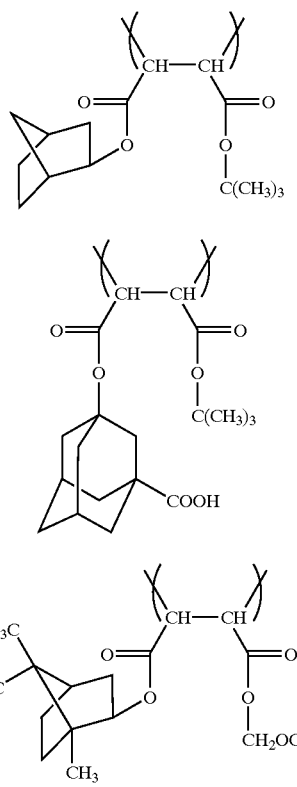

Specific examples of the repeating structural unit represented by the general formula (Ib) include those represented by the following general formulae [I'-1] to [I'-7], but the present invention should not be construed as being limited thereto.

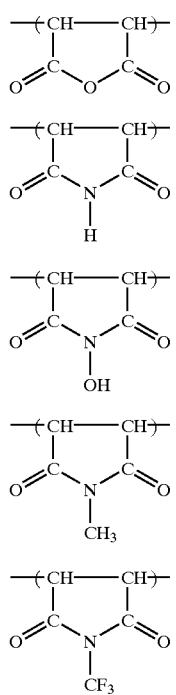

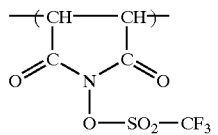

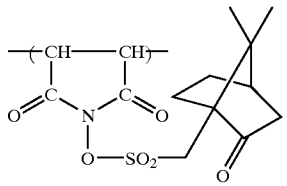

In the general formula (II), $R_{11}$ and $R_{12}$ each independently represent a hydrogen atom, cyano group, halogen atom, or alkyl group which may have a substituent. Z represents an atomic group containing two connected carbon atoms (C—C) required to form an alicyclic structure which may have a substituent.

Examples of the halogen atom represented by $R_{11}$ and $R_{12}$ include chlorine atom, bromine atom, fluorine atom, and iodine atom.

The alkyl group represented by $R_{11}$ and $R_{12}$ is preferably a $C_{1-10}$ straight-chain or branched alkyl group, more preferably $C_{1-6}$ straight-chain or branched alkyl group, even more preferably methyl group, ethyl group, propyl group, isopropyl group, n-butyl group, isobutyl group, sec-butyl group or t-butyl group.

Examples of further substituents on the alkyl group represented by $R_{11}$ and $R_{12}$ include hydroxyl group, halogen atom, carboxyl group, alkoxy group, acyl group, cyano group, and acyloxy group. Examples of the halogen atom include chlorine atom, bromine atom, fluorine atom, and iodine atom. Examples of the alkoxy group include $C_{1-4}$ alkoxy group such as methoxy, ethoxy, propoxy and butoxy. Examples of the acyl group include formyl group, and acetyl group. Examples of the acyloxy group include acetoxy group.

The atomic group required to form the alicyclic structure represented by Z is an atomic group required to form a repeating structural unit of alicyclic hydrocarbon group which may have a substituent in the resin. In particular, an atomic group required to form a polycyclic hydrocarbon group constituting a repeating structural unit of crosslinked alicyclic hydrocarbon group is preferred.

Examples of the skeleton of the alicyclic hydrocarbon group thus formed include those represented by the following structural formulae.

 (1)

 (2)

 (3)

(4)
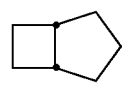
(5)
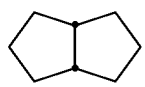
(6)
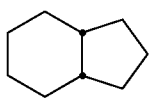
(7)
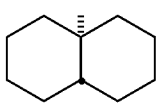
(8)
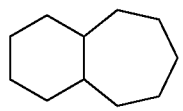
(9)
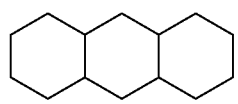
(10)
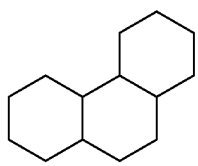
(11)
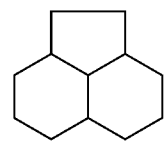
(12)
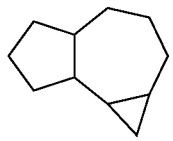
(13)
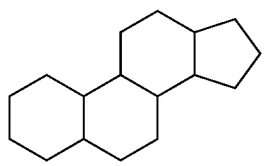
(14)
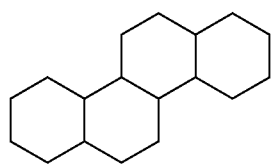
(15)
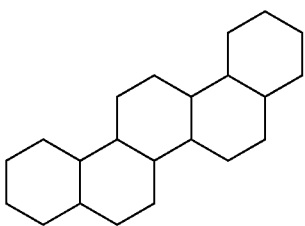
(16)
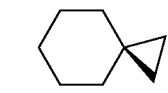
(17)
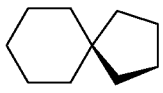
(18)
(19)
(20)
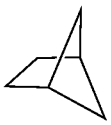
(21)
(22)
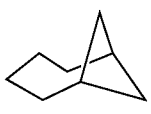
(23)
(24)
(25)
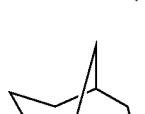
(26)
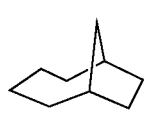

(27) 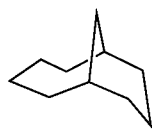

(28) 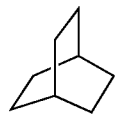

(29) 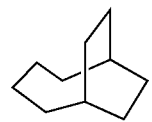

(30) 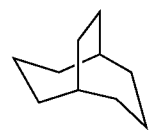

(31) 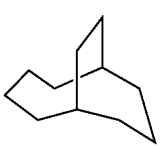

(32) 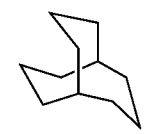

(33) 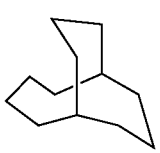

(34) 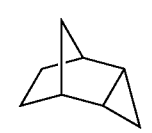

(35) 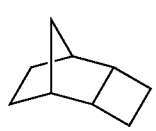

(36) 

(37) 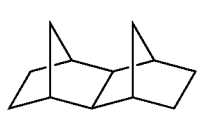

(38) 

(39) 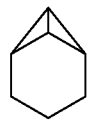

(40) 

(41) 

(42) 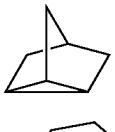

(43) 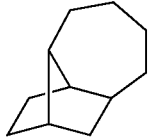

(44) 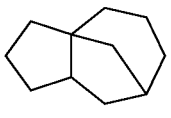

(45) 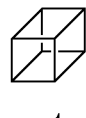

(46) 

(47) 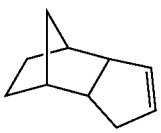

Preferred among these examples of the skeleton of polycyclic hydrocarbon group are those represented by the above specific formulae (5), (6), (7), (9), (10), (13), (14), (15), (23), (28), (36), (37), (42), and (47).

The foregoing skeleton of alicyclic hydrocarbon group may have a substituent. Examples of the substituents include $R_{13}$ to $R_{16}$ in the general formula (II-A) or (II-B).

Even more desirable among the foregoing examples of repeating structural unit having polycyclic hydrocarbon group are those represented by the general formula (II-A) or (II-B).

In the general formula (II-A) or (II-B), $R_{13}$ to $R_{16}$ each independently represent a hydrogen atom, halogen atom, cyano group, —COOH, —COOR$_5$ (in which R$_5$ represents an alkyl or cyclic hydrocarbon group which may have a substituent or —Y group as defined in the general formula (I)), group capable of being decomposed by the action of an acid, —C(=O)—X—A—R$_{17}$ or alkyl or cyclic hydrocarbon group which may have a substituent. The suffix n represents an integer of from 0 or 1. X represents an oxygen atom, sulfur atom, —NH—, —NHSO$_2$— or —NHSO$_2$NH—. R$_{17}$ represents —COOH, —COOR$_5$, —CN, hydroxyl group, alkoxy group which may have a substituent, —CO—NH—R$_6$, —CO—NH—SO$_2$—R$_6$ (in which R$_5$ and R$_6$ are as defined above) or —Y group in the general formula (Ia). A represents a single bond or divalent connecting group.

In the acid-decomposable resin to be used in the invention, the acid-decomposable group may be contained in the foregoing group —C(=O)—X—A—R$_1$ or —C(=O)—X—A—R$_2$ or may be contained as a substituent on Z in the general formula (II).

The structure of the acid-decomposable group is represented by —C(=O)—X—R$_0$ in which R$_0$ represents a tertiary alkyl group such as t-butyl group and t-amyl group, 1-alkoxyethyl group such as isoboronyl group, 1-ethoxyethyl group, 1-butoxyethyl group, 1-isobutoxyethyl group and 1-cylohexyloxyethyl group, aloxymethyl group such as 1-methoxymethyl group and 1-ethoxymethyl group, 3-oxoalkyl group, tetrahydropyranyl group, tetrahydrofuranyl group, trialkylsilylester group, 3-oxocyclohexylester group, 2-methyl-2-adamantyl group, mevalonic lactone residue or 2-(γ-butyrolactonyloxycarbonyl)-2-propyl group; and X$_1$ has the same meaning as X above.

Examples of the halogen atom represented by R$_{13}$ to R$_{16}$ include chlorine atom, bromine atom, fluorine atom, and iodine atom.

The alkyl group represented by R$_{13}$ to R$_{26}$ is preferably a C$_{1-10}$ straight-chain or branched alkyl group, more preferably a C$_{1-6}$ straight-chain or branched alkyl group, even more preferably a methyl group, ethyl group, propyl group , isopropyl group, n-butyl group, isobutyl group, sec-butyl group or t-butyl group.

Examples of the cyclic hydrocarbon group represented by R$_{13}$ to R$_{16}$ include cyclic alkyl group, and crosslinked hydrocarbon group. Specific examples of these cyclic hydrocarbon groups include cyclopropyl group, cyclopentyl group, cyclohexyl group, adamantyl group, 2-methyl-2-adamnatyl group, norbornyl group, boronyl group, isoboronyl group, tricyclodecanyl group, dicyclopentenyl group, norbornaneepoxy group, menthyl group, isomenthyl group, neomenthyl group, and tetracyclododecanyl group.

Examples of the ring formed by bonding at least two of R$_{13}$ to R$_{16}$ include C$_{5-12}$ ring such as cyclopentene, cyclohexene, cycloheptane and cyclooctane.

Examples of the alkoxy group represented by R$_{17}$ include C$_{1-4}$ alkoxy group such as methoxy group, ethoxy group, propoxy group and butoxy group.

Examples of further substituents on the foregoing alkyl group, cyclic hydrocarbon group and alkoxy group include hydroxyl group, halogen atom, carboxyl group, alkoxy group, acyl group, cyano group, and acyloxy group. Examples of the halogen atom include chlorine atom, bromine atom, fluorine atom, and iodine atom. Examples of the alkoxy group include C$_{1-4}$ alkoxy group include methoxy group, ethoxy group, propoxy group and butoxy group. Examples of the acyl group include formyl group, and acetyl group. Examples of the acyloxy group include acetoxy group.

Examples of the divalent connecting group represented by A include those described with reference to the general formula (Ia), i.e, single bond, alkylene group, substituted alkylene group, ether group, thioether group, carbonyl group, ester group, amide group, sulfonamide group, urethane group and urea group. These groups may be used singly or in combination.

Examples of the unsubstituted or substituted alkylene group represented by A include those described with reference to the general formula (Ia).

In the acid-decomposable resin to be used in the present invention, the group capable of being decomposed by the action of an acid may be contained in at least one repeating structural unit selected from the group consisting of repeating structural unit represented by the general formula (Ia), repeating structural unit represented by the general formula (Ib), repeating structural unit represented by the general formula (II) and repeating structural unit constituting the copolymer component described later.

The various substituents R$_{13}$ to R$_{16}$ in the general formula (II-A) or (II-B) can also be substituents on the atomic group Z required to form an alicyclic hydrocarbon group or polycyclic hydrocarbon group in the general formula (II).

Specific examples of the repeating structural unit represented by the general formula (II-A) or (II-B) include those represented by the following general formulae [II-1] to [II-166], but the present invention should not be construed as being limited thereto.

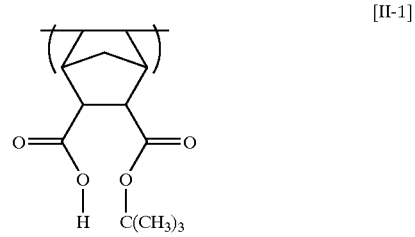

[II-1]

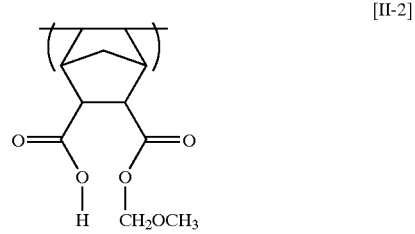

[II-2]

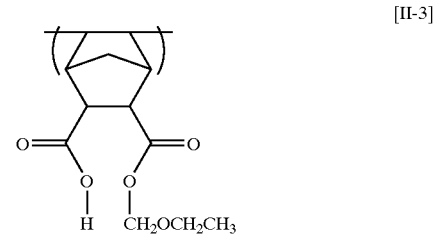

[II-3]

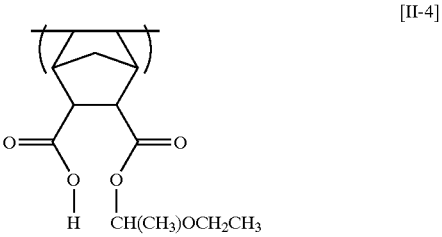

[II-4]

-continued
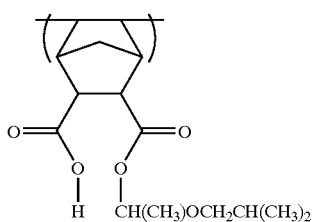
[II-5]
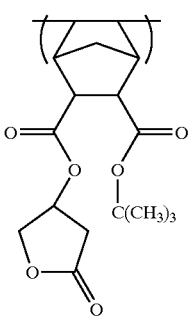
[II-6]
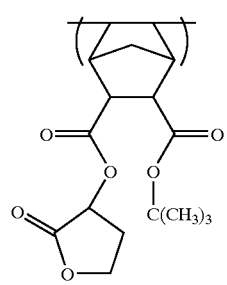
[II-7]
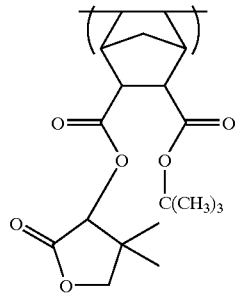
[II-8]
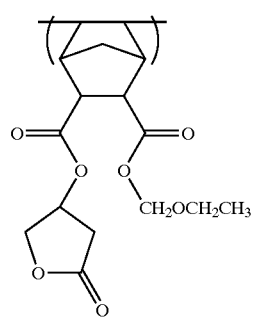
[II-9]
-continued
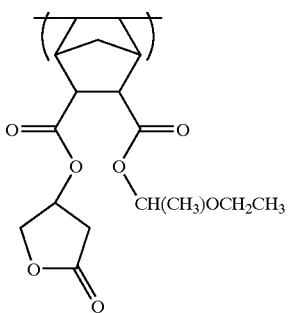
[II-10]
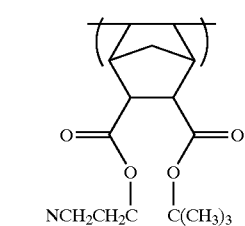
[II-11]
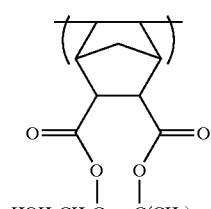
[II-12]
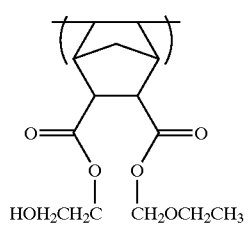
[II-13]
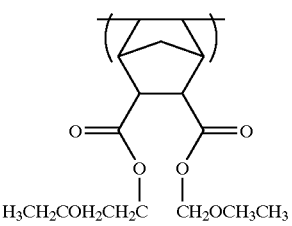
[II-14]
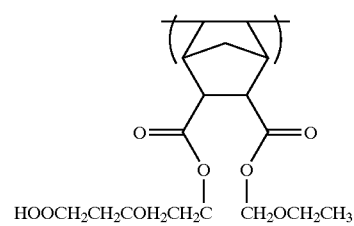
[II-15]

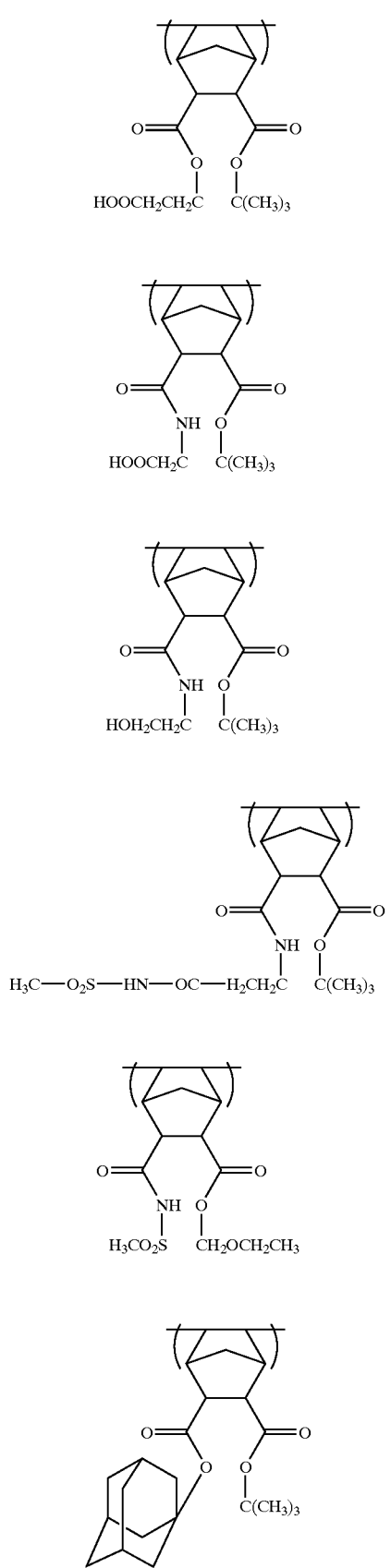
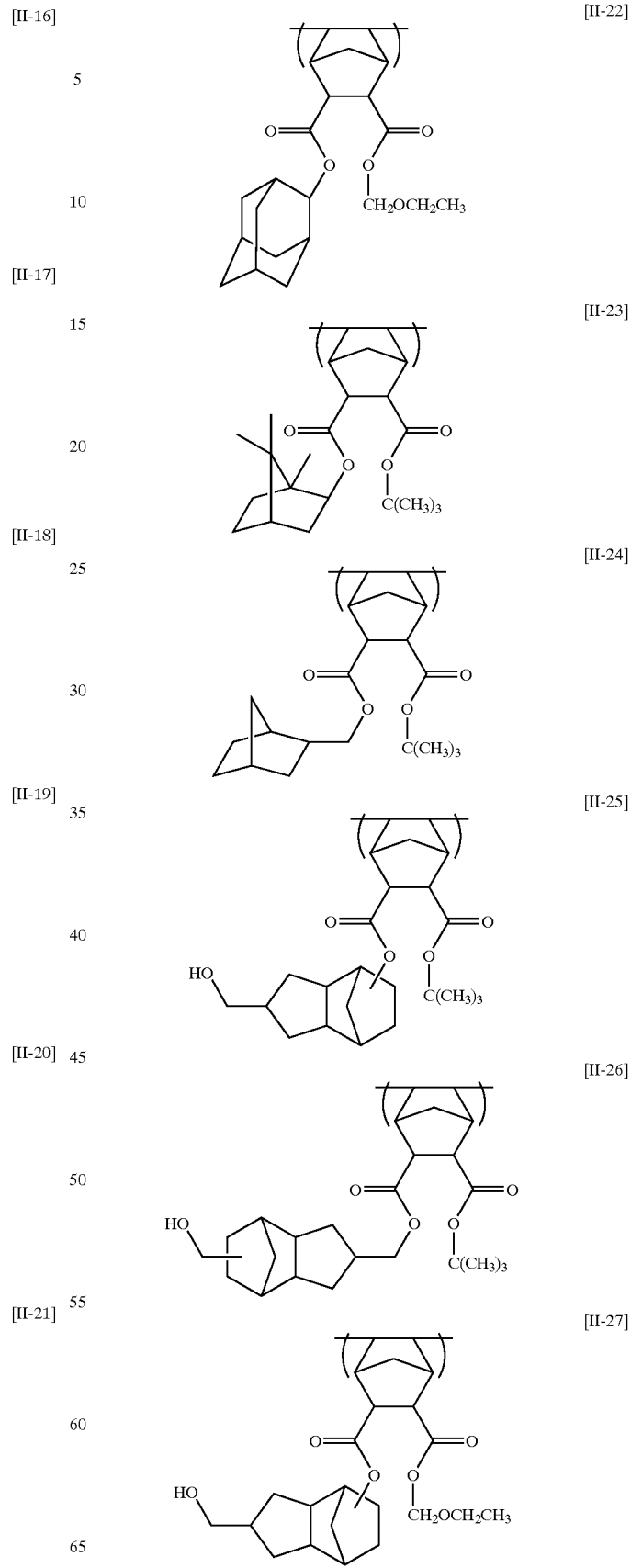

[II-28]
[II-29]
[II-30]
[II-31]
[II-32]
[II-33]
[II-34]
[II-35]
[II-36]
[II-37]

-continued
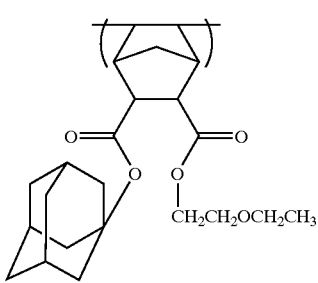
[II-38]
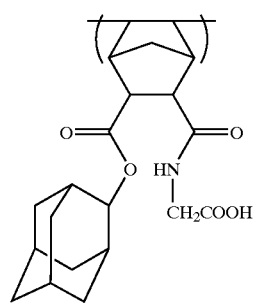
[II-39]
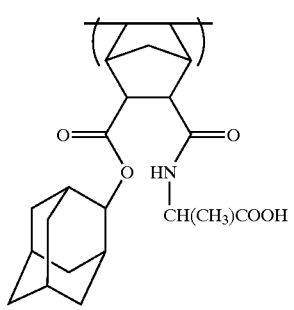
[II-40]
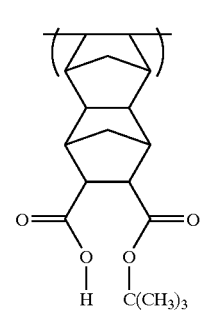
[II-41]
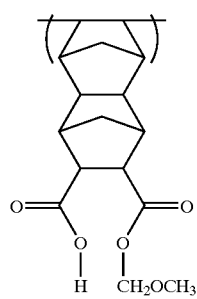
[II-42]
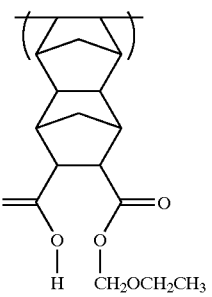
[II-43]
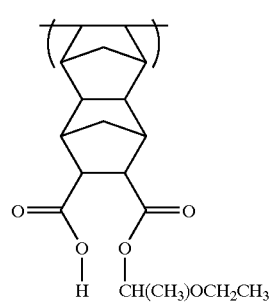
[II-44]
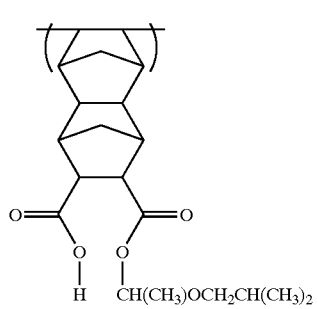
[II-45]
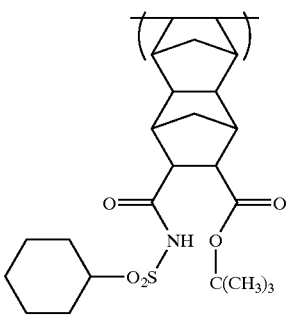
[II-46]
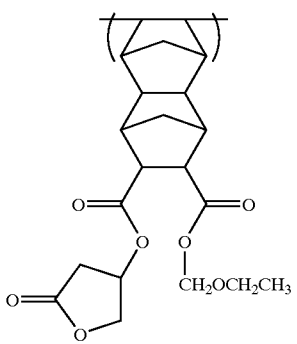
[II-47]

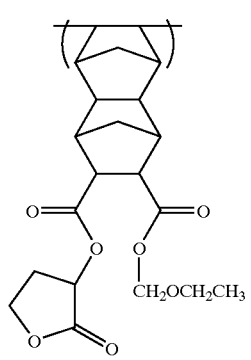
[II-48]
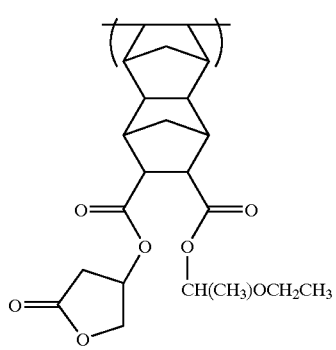
[II-49]
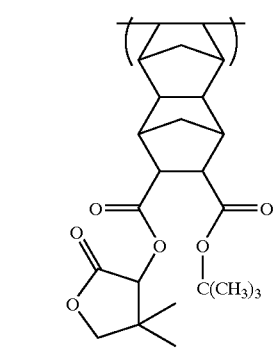
[II-50]
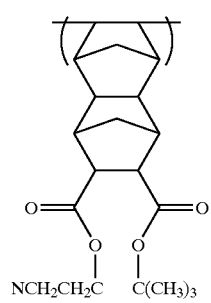
[II-51]
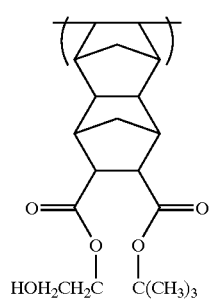
[II-52]
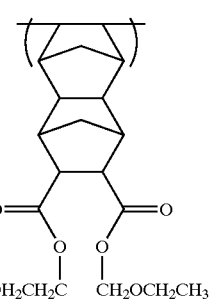
[II-53]
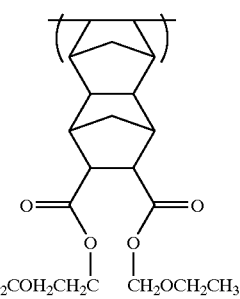
[II-54]
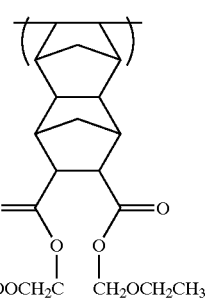
[II-55]
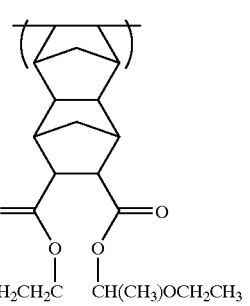
[II-56]
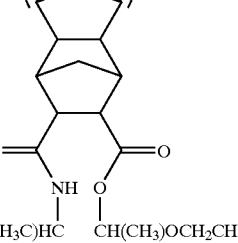
[II-57]

[II-58] 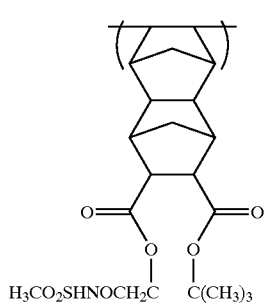
[II-62] 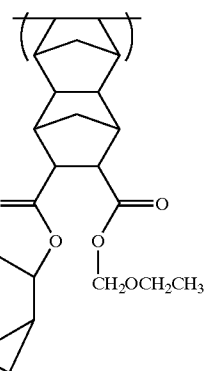
[II-59] 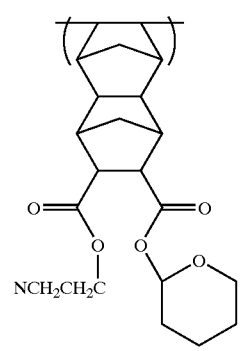
[II-63] 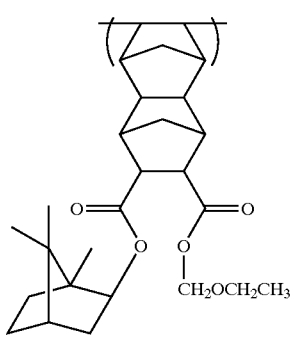
[II-60] 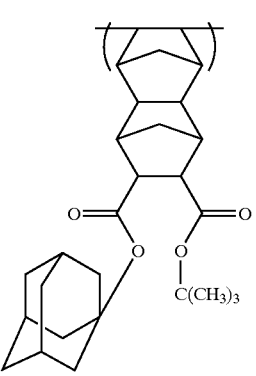
[II-64] 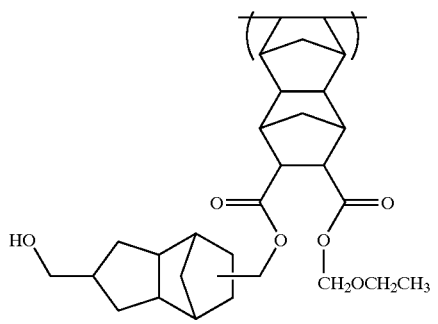
[II-61] 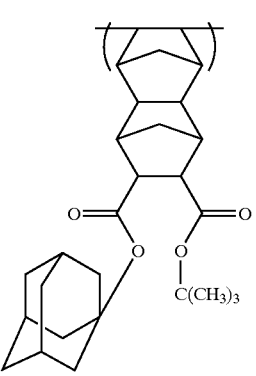
[II-65] 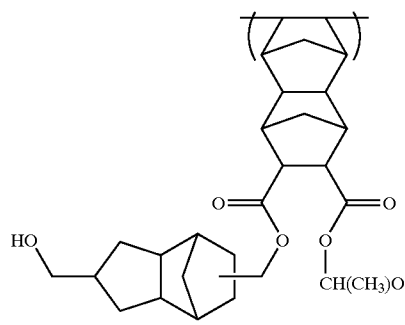

[II-66]
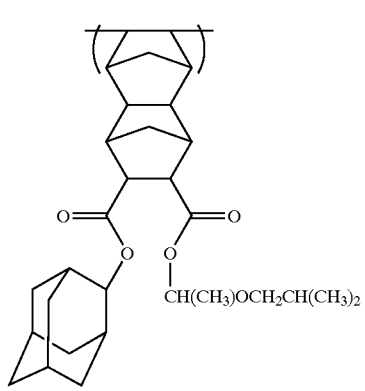
[II-67]
[II-70]
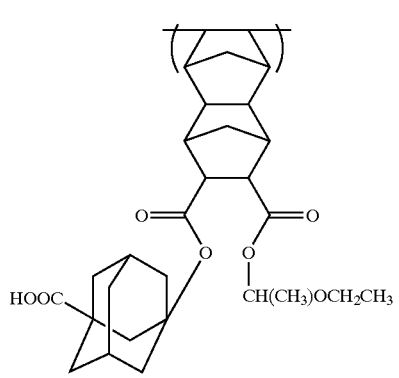
[II-71]
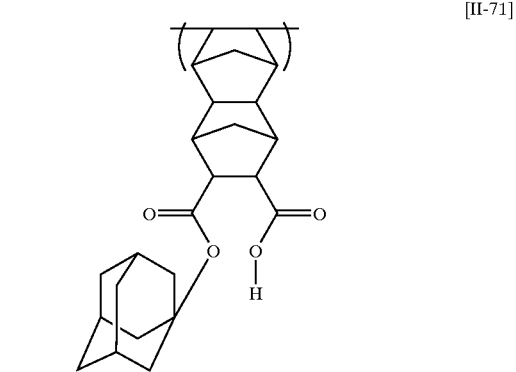
[II-68]
[II-72]
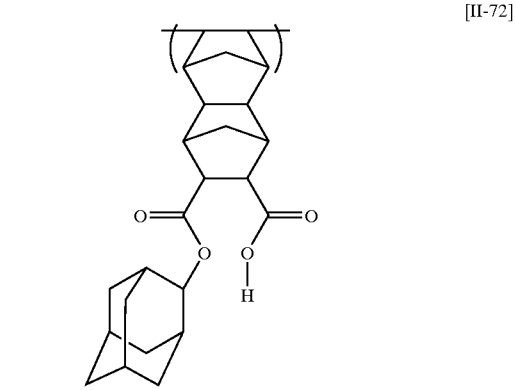
[II-69]
[II-73]
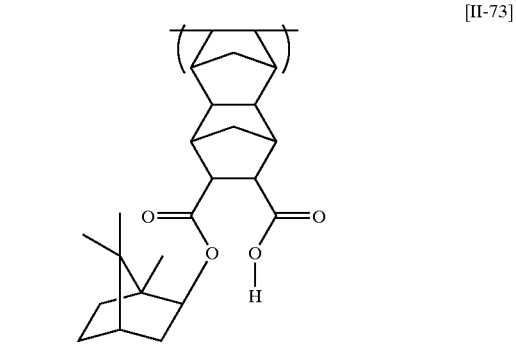

-continued
[II-74]
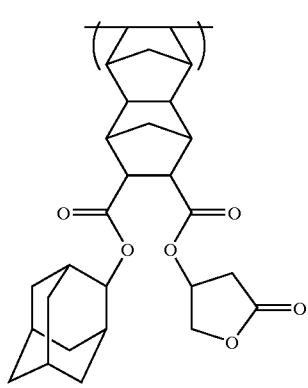
[II-75]
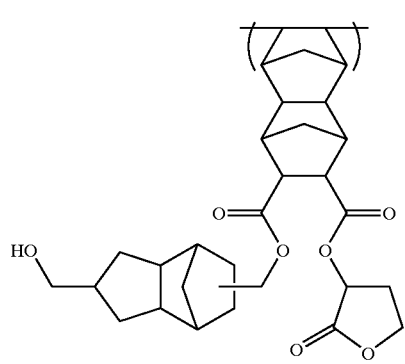
[II-76]
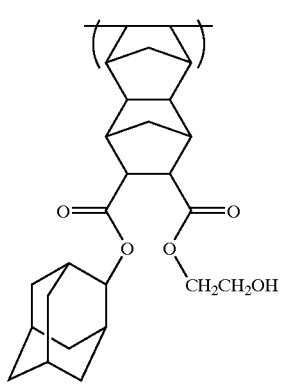
[II-77]
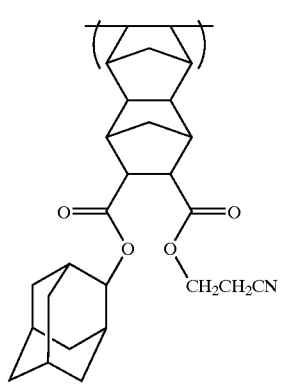
-continued
[II-78]
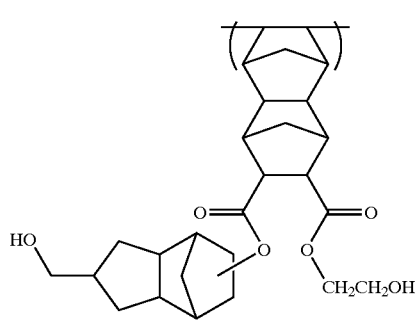
[II-79]
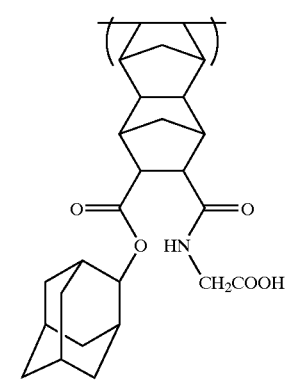
[II-80]
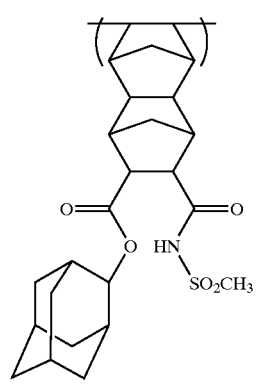
[II-81]
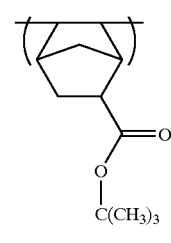
[II-82]
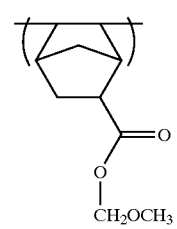

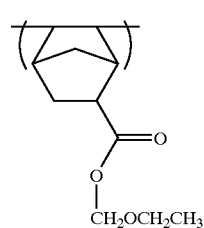 [II-83]
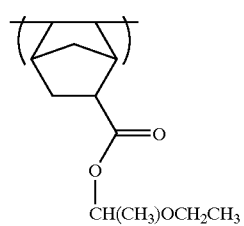 [II-84]
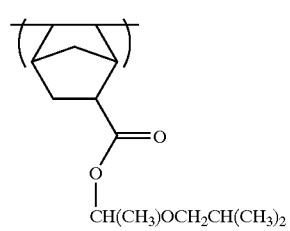 [II-85]
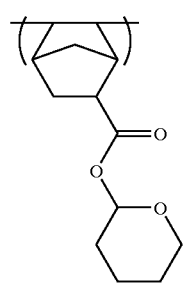 [II-86]
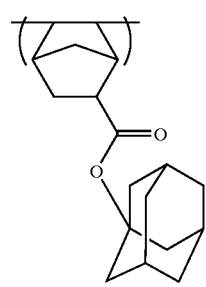 [II-87]
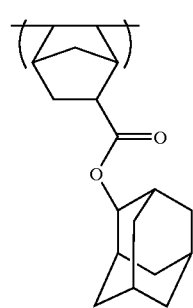 [II-88]
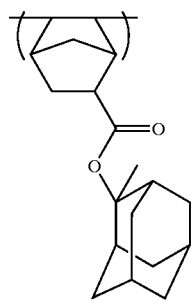 [II-89]
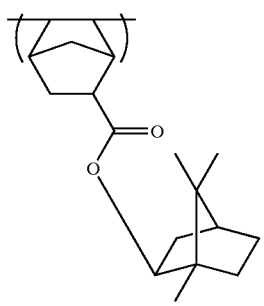 [II-90]
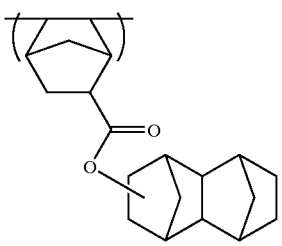 [II-91]
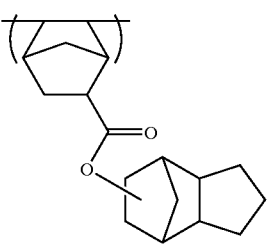 [II-92]
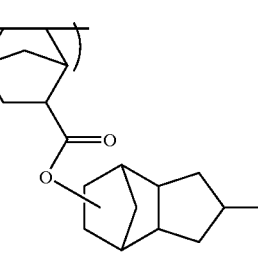 [II-93]
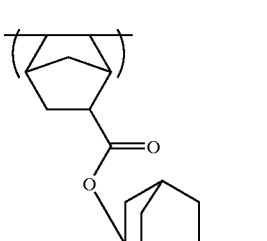 [II-94]

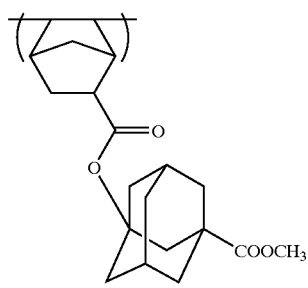 [II-95]
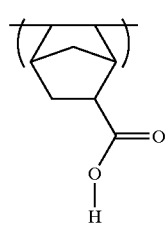 [II-96]
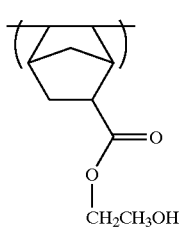 [II-97]
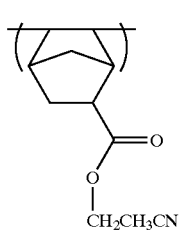 [II-98]
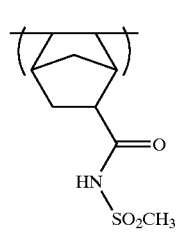 [II-99]
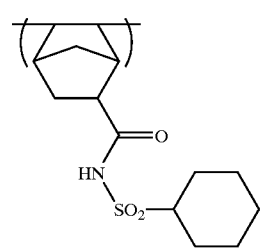 [II-100]
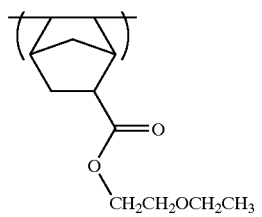 [II-101]
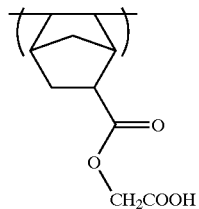 [II-102]
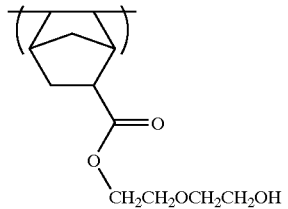 [II-103]
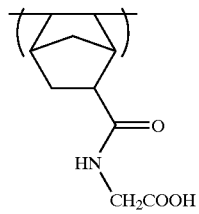 [II-104]
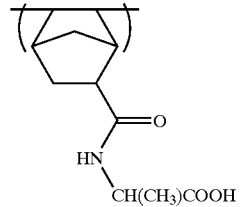 [II-105]
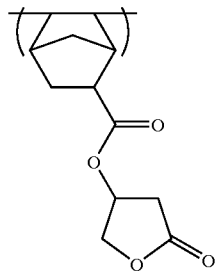 [II-106]

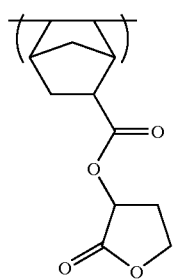 [II-107]
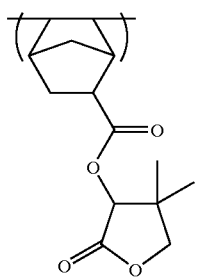 [II-108]
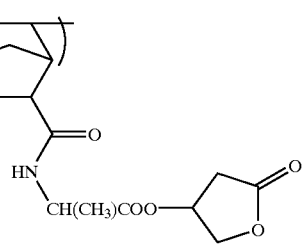 [II-109]
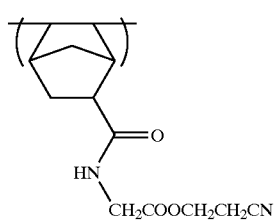 [II-110]
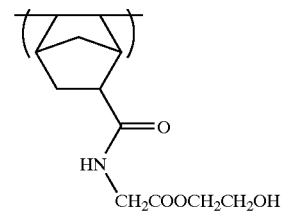 [II-111]
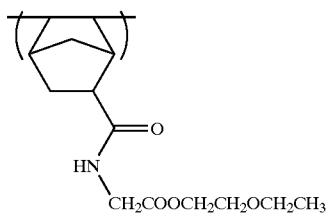 [II-112]
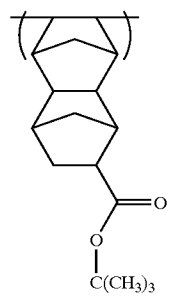 [II-113]
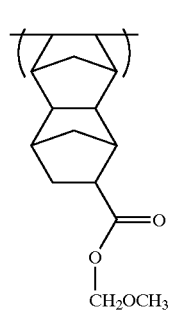 [II-114]
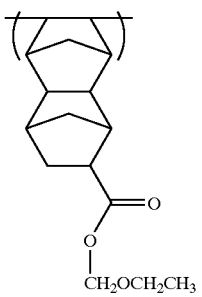 [II-115]
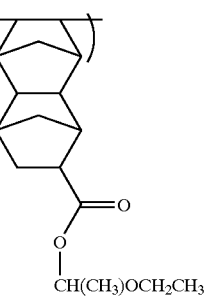 [II-116]
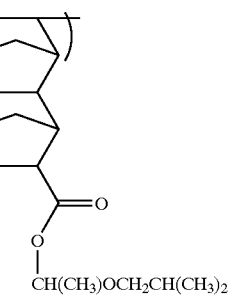 [II-117]

[II-118]
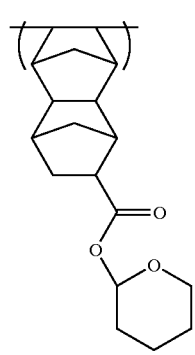
[II-119]
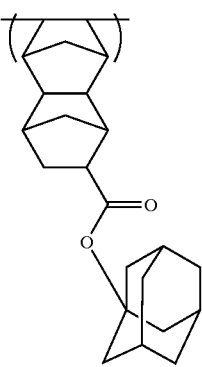
[II-120]
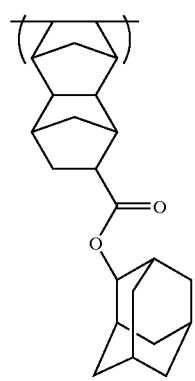
[II-121]
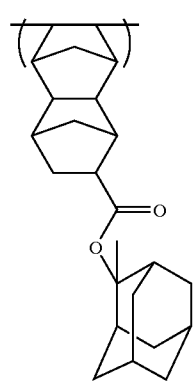
[II-122]
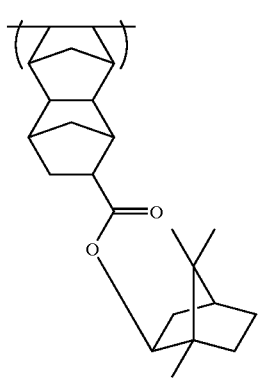
[II-123]
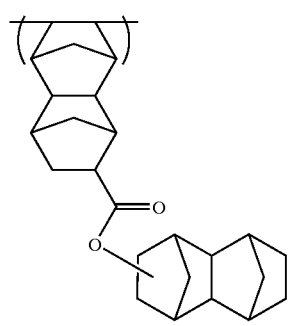
[II-124]
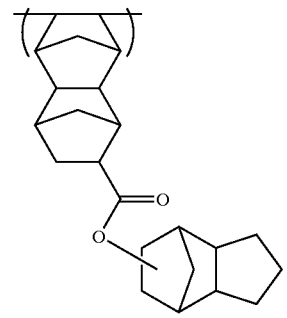
[II-125]
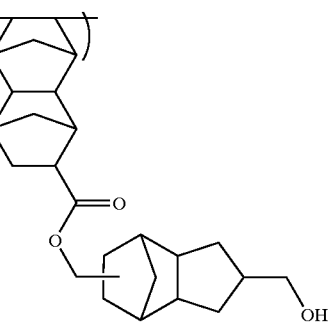

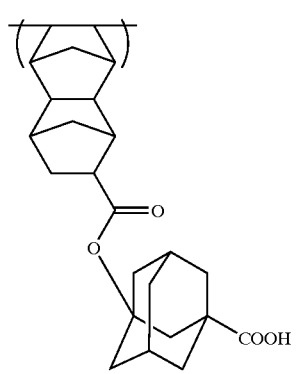
[II-126]
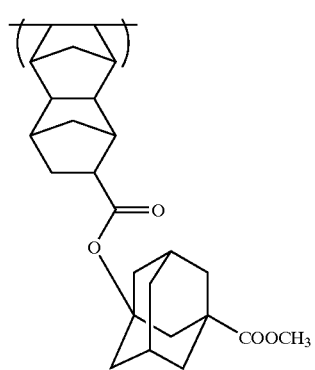
[II-127]
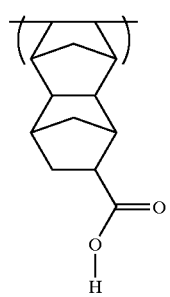
[II-128]
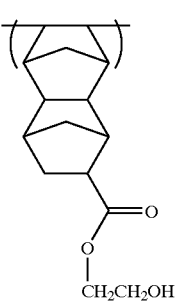
[II-129]
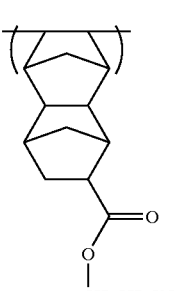
[II-130]
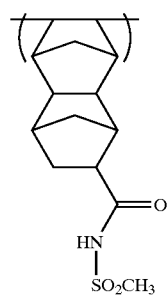
[II-131]
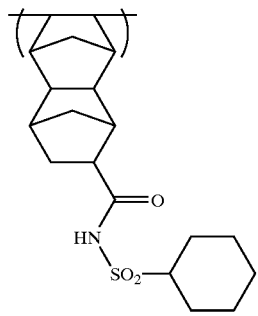
[II-132]
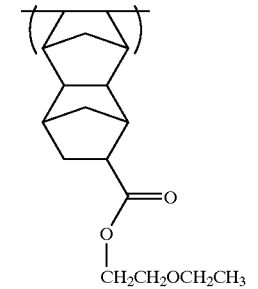
[II-133]
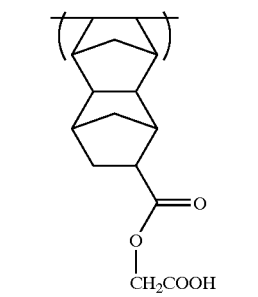
[II-134]
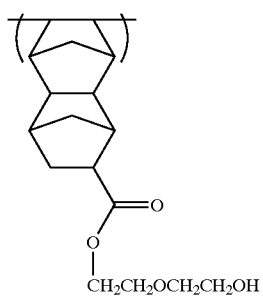
[II-135]

-continued

[II-136] [II-141] [II-137] [II-138] [II-142] [II-139] [II-143] [II-144] [II-140] [II-145]

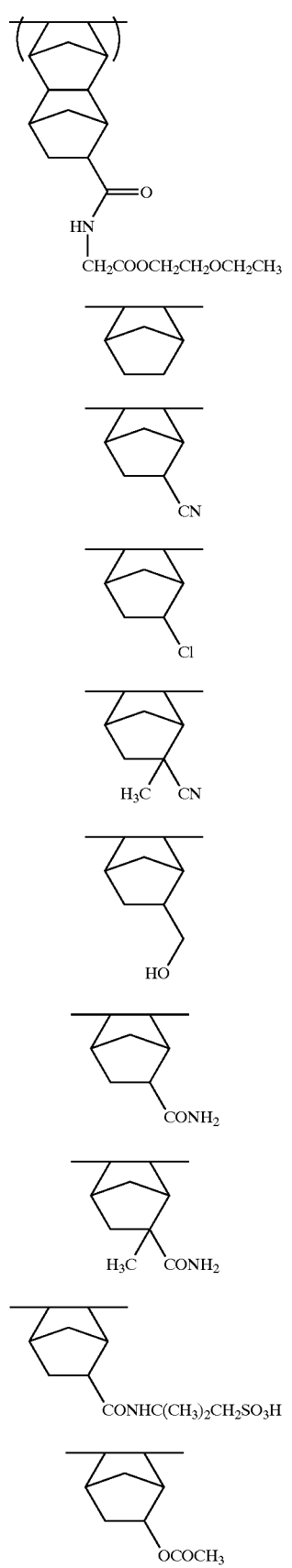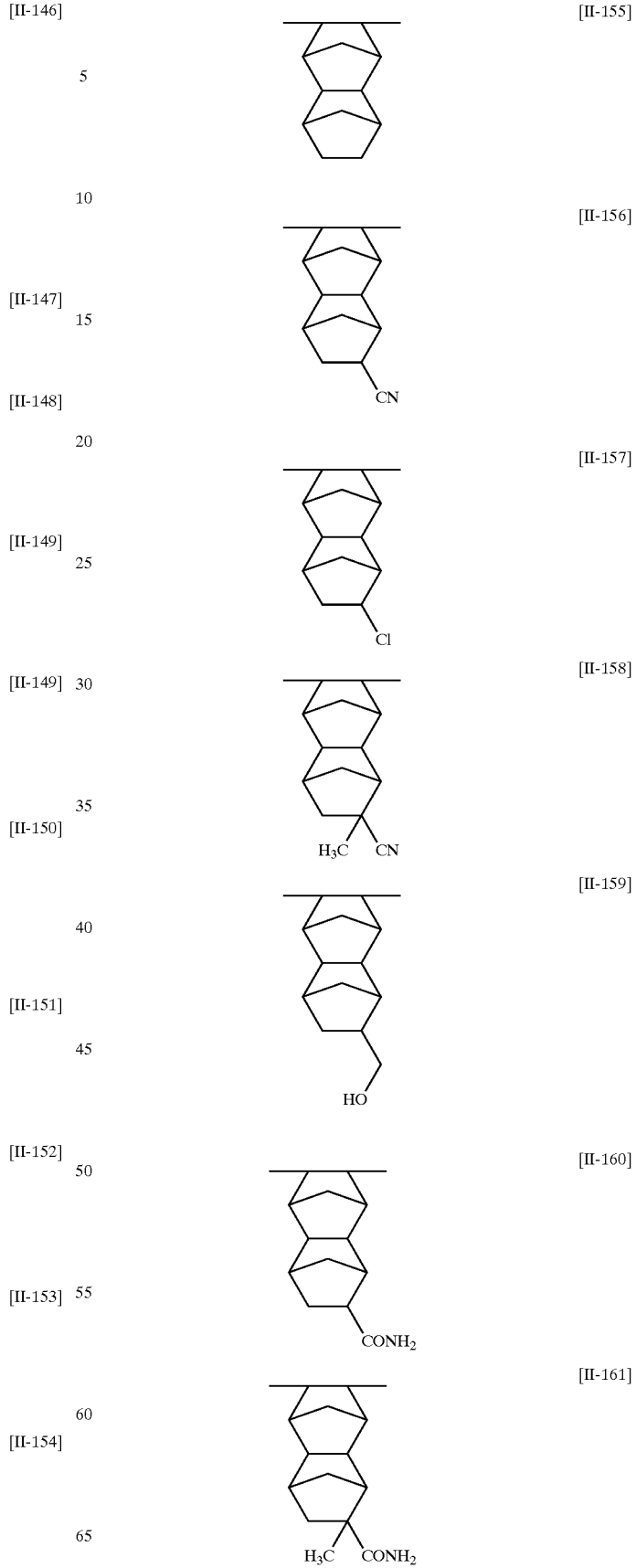

-continued

[II-162]
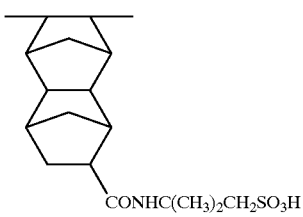

[II-163]
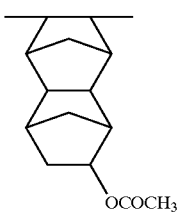

[II-164]
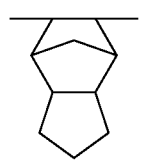

[II-165]
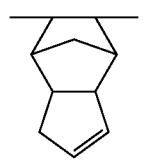

[II-166]
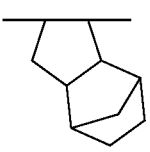

The acid-decomposable resin to be used in the present invention can be a copolymer comprising various repeating structural units of monomer besides at least any one of repeating structural units represented by the general formulae (Ia) and (Ib) and one or some of repeating structural units represented by the general formula (II) (including the general formulae (II-A) and (II-B)) for the purpose of adjusting dry etching resistance, adaptability to standard developer, adhesion to substrate, resist profile and required general characteristics of resist such as resolution, heat resistance and sensitivity.

Preferred examples of the foregoing copolymer components include repeating structural units represented by the following general formulae (IV') and (V').

[IV']
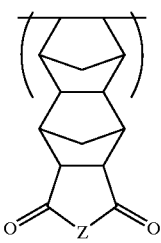

-continued

[V']

wherein Z represents an oxygen atom, —NH—, —N(—$R_{50}$)— or —N(—$OSO_2R_{50}$)— in which $R_{50}$ represents the same (substituted) alkyl group or (substituted) cyclic hydrocarbon group as mentioned above.

Specific examples of the repeating structural units represented by the general formulae (IV') and (V') include those represented by the following general formulae [IV'-9] to [IV'-16] and [V'-9] to [V'-16], but the present invention should not be construed as being limited thereto.

[IV'-9]

[IV'-10]

[VI'-11]

[IV'-12]

[IV'-13]

[IV'-14]
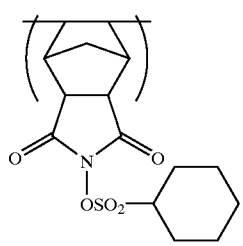
[IV'-15]
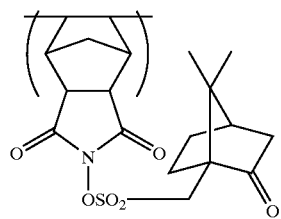
[IV'-16]
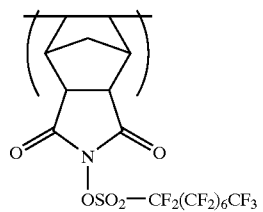
[V'-9]
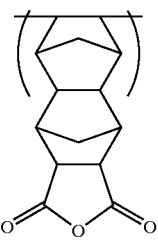
[V'-10]
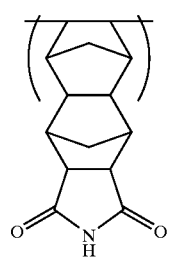
[V'-11]
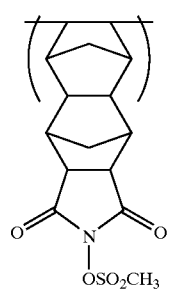
[V'-12]
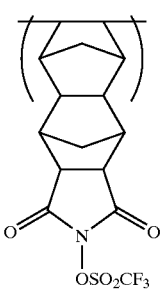
[V'-13]
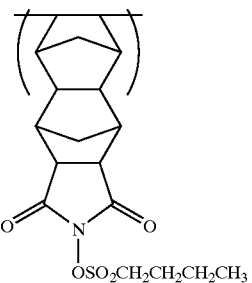
[V'-14]
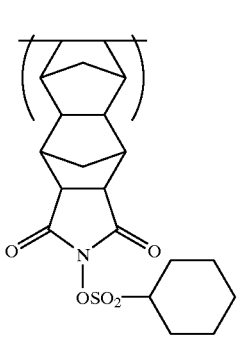
[V'-15]
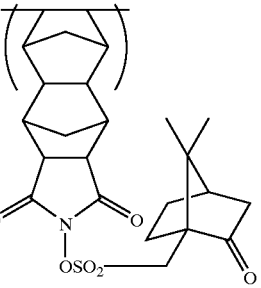
[V'-16]
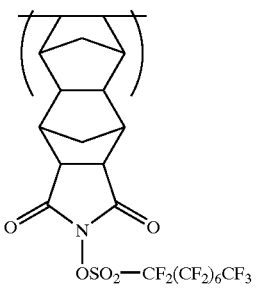
The acid-decomposable resin to be used in the invention may further comprise the foregoing monomers copolymerized to give repeating structural units constituting the resin so far as the effect of the invention can be effectively exerted, but the present invention should not be construed as being limited to the following monomers.

In this arrangement, properties required for the foregoing acid-decomposable resin, particularly the following properties can be finely adjusted:

(1) Solubility in the coating solvent;
(2) Film-forming properties (glass transition temperature);
(3) Alkali-developability;
(4) Film thickness loss (selection of hydrophilic group, alkali-soluble group);
(5) Adhesion of unexposed area to substrate; and
(6) Dry etching resistance Examples of such a copolymerizable monomers include compound having one addition-polymerizable unsaturated bond selected from the group consisting of acrylic acid ester, methacrylic acid ester, acrylamide, methacrylamide, allyl compound, vinylether and vinylester.

Specific examples of the acrylic acid ester include alkyl acrylate (preferably alkyl acrylate the alkyl moiety of which has from 1 to 10 carbon atoms) such as acrylic acid methyl, acrylic acid ethyl, acrylic acid propyl, acrylic acid amyl, acrylic acid cyclohexyl, acrylic acid ethylhexyl, acrylic acid octyl, acrylic acid t-octyl, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate.

Specific examples of the methacrylic acid ester include alkyl methacrylate (preferably alkyl methacrylate the alkyl group of which has from 1 to 10 carbon atoms) such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate.

Specific examples of the acrylamide include acrylamide, N-alkylacrylamide (having an alkyl moiety with from 1 to 10 carbon atoms, such as methyl group, ethyl group, propyl group, butyl group, t-butyl group, heptyl group, octyl group, cyclohexyl group and hydroxyethyl group), N,N-dialkylacrylamide (having an alkyl moiety with from 1 to 10 carbon atoms, such as methyl group, ethyl group, butyl group, isobutyl group, ethylhexyl group and cyclohexyl group), N-hydroxyethyl-N-methylacrylamide and N-2-acetamideethyl-N-acetylacrylamide.

Specific examples of the methacrylamide include methacrylamide, N-alkylmethacrylamide (having an alkyl moiety with from 1 to 10 carbon atoms, such as methyl group, ethyl group, t-butyl group, ethylhexyl group, hydroxyethyl group, cyclohexyl group), N,N-dialkylmethacrylamide (having an alkyl moiety such as ethyl group, propyl group and butyl group) and N-hydroxyethyl-N-methyl methacrylamide.

Specific examples of the allyl compound include allyl esters (e.g., allyl acetate, allyl caproate, allyl caprate, allyl laurate, allyl palmitate, allyl stearate, allyl benzoate, allyl acetoacetate, allyl lactate), and allyl oxyethanol.

Specific examples of the vinyl ether include alkyl vinyl ether such as hexyl vinyl ether, octyl vinyl ether, decyl vinyl ether, ethyl hexyl vinyl ether, methoxy ethyl vinyl ether, ethoxy ethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylamino ethyl vinyl ether, diethylamino ethyl vinyl ether, butylamino ethyl vinyl ether, benzyl vinyl ether and tetrahydrofurfuryl vinyl ether.

Specific examples of the vinyl ester include vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl acetoacetate, vinyl lactate, vinyl-β-phenyl butyrate, and vinylcyclohexyl carboxylate.

Specific examples of the itaconic acid dialkyl include itaconic acid dimethyl, itaconic diethyl, and itaconic acid dibutyl.

Other examples of the copolymerizable monomers include acrylic acid, methacrylic acid, crotonic acid, itaconic acid, acrylonitrile, and methacrylonitrile.

The content of the repeating structural unit represented by the general formula (Ia) and/or (Ib) and the repeating structural unit represented by the general formula (II) (including the general formulae (II-A) and (II-B)) in the acid-decomposable resin to be used in the invention can be properly predetermined taking into account the desired resist dry etching resistance, sensitivity, pattern cracking prevention, adhesivity to substrate, resist profile, and general requirements for resist such as resolution and heat resistance. In general, the content of the repeating structural unit represented by the general formula (Ia) and/or (Ib) and the repeating structural unit represented by the general formula (II) in the acid-decomposable resin to be used in the invention is preferably 25 mol-% or more, more preferably 30 mol-% or more, even more preferably 35 mol-% or more based on the total amount of monomer repeating structural units constituting the resin.

The content of the repeating structural unit (represented by the general formula (IV') or (V')) derived from the foregoing preferred copolymerizable monomers in the acid-decomposable resin to be used in the invention, too, can be properly predetermined according to the desired properties of resist. In practice, however, it is preferably 99 mol-% or less, more preferably 90 mol-% or less, even more preferably 80 mol-% or less based on the total molar amount of the repeating structural unit represented by the general formula (Ia) and/or (Ib) and the repeating structural unit represented by the general formula (II).

The content of the repeating structural unit based on the foregoing further copolymerizable monomer in the resin, too, can be properly predetermined depending on the desired properties of resist. In practice, however, it is preferably 99 mol-% or less, more preferably 90 mol-% or less, even more preferably 80 mol-% or less based on the total molar amount of the repeating structural unit represented by the general formula (Ia) and/or (Ib) and the repeating structural unit represented by the general formula (II). When the content of the repeating structural unit based on the foregoing further copolymerizable monomer exceeds 99 mol-%, the effect of the invention cannot be sufficiently exerted to disadvantage.

In the acid-decomposable resin to be used in the invention, the group capable of being decomposed by the action of an acid may be contained in any of the repeating structural unit represented by the general formula (Ia) and/or (Ib), the repeating structural unit represented by the general formula (II) and the repeating structural unit based on the copolymerizable monomer. The content of the repeating structural unit containing a group capable of being decomposed by the action of an acid is preferably from 8 to 60 mol-%, more preferably from 10 to 55 mol-%, even more preferably from 12 to 50 mol-% based on the total amount of repeating structural units constituting the resin.

In the acid-decomposable resin to be used in the invention, the content of monomers corresponding to the repeating structural units constituting the acid-decomposable resin is 5% or less, preferably from 0.01% to 4%, more preferably from 0.1% to 3% based on the total pattern area of gel permeation chromatography (GPC). For the measurement by GPC, Shodex system-11, produced by Showa Denko K.K., may be used.

By predetermining the monomer content in the acid-decomposable resin to the above defined value, a high sensitivity photoresist composition can be obtained, and a pattern profile having little edge roughness can be obtained.

The acid-decomposable resin to be used in the invention can be synthesized by a process which comprises copolymerizing monomers corresponding to the repeating structural unit represented by the general formula (II), maleic anhydride, and, if any copolymer component, monomers of the copolymer in the presence of a polymerization catalyst, subjecting the repeating structural unit derived from maleic anhydride in the copolymer thus obtained to ring-opening esterification with alcohols or hydrolysis under a basic or acidic condition, and then converting the carboxylic acid moiety of the product to a desired substituent.

The foregoing copolymerization (hereinafter singly referred to as "polymerization") can be accomplished by ordinary process (e.g., radical polymerization). As a preferred polymerization process by which the above defined monomer content is reached there may be the following process.

A block or batchwise addition process which comprises dissolving monomers to be reacted in a reaction solvent to make a uniform solution or uniformalizing the monomers in the absence of solvent, heating the monomers with stirring to a desired temperature in a nitrogen atmosphere, and then adding to the monomers a radical polymerization initiator en bloc or batchwise and a dropping process which comprises dissolving monomers to be reacted in a reaction solvent with an initiator, and then gradually adding this solution dropwise to a reaction solvent or a solution comprising a part of the monomers dissolved in such a reaction solvent which has been heated to a desired temperature in a nitrogen atmosphere may be employed.

Preferred among these processes are batchwise addition process and dropping process. The selection of these processes makes it possible to improve the effect of the present invention of improving resolution, eliminating edge roughness and other resist properties, though the mechanism being quite unknown.

The reaction temperature can be properly predetermined depending on the kind of the initiator used. In practice, however, it is normally from 30° C. to 180° C., preferably from 40° C. to 160° C., more preferably from 50° C. to 140° C.

In the case of batchwise addition process, the time interval at which the initiator is added is from 5 minutes to 6 hours, preferably from 10 minutes to 5 hours, more preferably from 15 minutes to 4 hours.

The time during which the reaction solution is added in the dropping process can be predetermined to various values depending on the reaction temperature, the kind of the initiator used and the monomers to be reacted. In practice, however, it is normally from 30 minutes to 8 hours, preferably from 45 minutes to 6 hours, more preferably from 1 hour to 5 hours.

In the case of block addition process or batchwise addition process, the addition of the initiator is followed by heating the reaction material to a desired temperature with stirring in an atmosphere of nitrogen for a predetermined period of time. In the case of dropping process, too, the dropwise addition is followed by heating the reaction material to a desired temperature with stirring in an atmosphere of nitrogen for a predetermined period of time.

The heating time can be varied with the reaction temperature and the kind of the initiator used. In practice, however, it is normally 24 hours or less, preferably 20 hours or less, more preferably 18 hours or less.

In any case, the step of heating with stirring for a predetermined period of time is preferably followed by further addition of the initiator.

The further addition of the initiator eventually improves sensitivity and resolving power, though the details of the mechanism being unknown. The further addition of the initiator is followed by heating with stirring for a predetermined period of time. The further addition of the initiator may be followed by raising the reaction temperature.

As the solvent to be used in the foregoing reaction there may be used any solvent which can dissolve the monomer used therein but doesn't inhibit polymerization (polymerization initiator such as nitrobenzene, chain transfer agent such as mercapto compound). Examples of such a solvent include alcohols, ethers, ketones, amides, esters, lactones, nitrites, hydrocarbons, and mixture thereof.

Specific examples of the alcohols include methanol, ethanol, propanol, isopropanol, butanol, ethylene glycol, propylene glycol, ethylene glycol monomethyl ether, ethylene glycol monoethyl ether, and 1-methoxy-2-propanol.

Specific examples of the ethers include propyl ether, isopropyl ether, butyl methyl ether, tetrahydrofuran, 1,4-dioxane, 1,3-dioxolan, and 1,3-dioxane.

Specific examples of the ketones include acetone, methyl ethyl ketone, diethyl ketone, methyl isopropyl ketone, and methyl isobutyl ketone.

Specific examples of the amides include N,N-dimethylformamide, and N,N-dimethylacetamide.

Specific examples of the esters and lactones include ethyl acetate, methyl acetate, isobutyl acetate, and γ-butyrolactone. Specific examples of the nitriles include acetonitrile, propionitrile, and butrylonitrile.

Specific examples of the hydrocarbons include straight-chain or branched hydrocarbons such as pentane, hexane, heptane and octane, cyclic hydrocarbons such as cyclopentane and cyclohexane, and aromatic hydrocarbons such as toluene and xylene.

Preferred among these solvents are propyl ether, isopropyl ether, butyl methyl ether, tetrahydrofuran, 1,4-dioxane, 1,3-dioxolan, 1,3-dioxane, acetone, methyl ethyl ketone, diethyl ketone, methyl isopropyl ketone, methyl isobutyl ketone, ethyl acetate, and γ-butyrolactone.

Specific examples of the mixed solvent include mixture of ethers, mixture of ether and ketone, mixture of ether, ester and lactone, and mixture of ketone, ester and lactone.

Preferred examples of the mixed solvent include mixture of propyl ether and tetrahydrofuran, mixture of propyl ether and 1,4-dioxane, mixture of propyl ether and 1,3-dioxolan, mixture of isopropyl ether and tetrahydrofuran, mixture of isopropyl ether and 1,4-dioxane, mixture of isopropyl ether and 1,3-dioxolane, mixture of tetrahydrofuran and 1,3-dioxolane, mixture of propyl ether and methyl ethyl ketone, mixture of propyl ether and methyl isopropyl ketone, mixture of isopropyl ether and methyl ethyl ketone, mixture of isopropyl ether and methyl isopropyl ketone, mixture of tetrahydrofuran and methyl ethyl ketone, mixture of tetrahydrofuran and methyl isopropyl ketone, 1,3-dioxolane and methyl ethyl ketone, mixture of 1,3-dioxolane and methyl isopropoyl ketone, mixture of propyl ether and ethyl acetate, mixture of propyl ether and γ-butyrolactone, mixture of isopropyl ether and ethyl acetate, mixture of ispropyl ether and γ-butyrolactone, mixture of tetrahydrofuran and ethyl acetate, mixture of tetrahydrofuran and γ-butyrolactone, mixture of 1,3-dioxolane and ethyl acetate, mixture of 1,3-dioxolane and γ-butyrolactone, mixture of methyl ethyl ketone and ethyl acetate, mixture of methyl ethyl ketone and γ-butyrolactone, mixture of methyl isopropyl ketone and ethyl acetate, and mixture of methyl isopropyl ketone and γ-butyrolactone.

The amount of the reaction solvent to be used varies with the desired molecular weight and the kind of monomers and initiator used. In the case of solution comprising monomers dissolved in a solvent, a polymerization solvent is used in an amount such that the monomer concentration is 20% by weight or more, preferably 30% by weight or more, more preferably 40% by weight or more.

Examples of the radical polymerization initiator to be used in the reaction of the invention will be given below.

As the radical polymerization initiator there may be used a commonly used radical polymerization initiator such as peroxide and azo-based initiator. Azo-based initiators are preferred.

Specific examples of azo-based initiators include 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobisisobutyronitrile, 2,2'-azobis(2-methylbutyronitrile), 1,1'-azobis(cyclohexane-1-carbonitrile), 2,2'-azobis (2-methyl-N-phenylpropionamidine)dihydrochloride, 2,2'-azobis(2-methyl-N-2-propenylpropionamidine)dihydrochloride, 2,2'-azobis[2-(5-methyl-2-imidazoline-2-il)propane] dihydrochloride, 2,2'-azobis{2-methyl-N-[1,1-bis (hydroxymethyl)2-hydroxyethyl]propionamide}, dimethyl-2,2'-azobis(2-methylpropionate), 4,4'-azobis(4-cyanovaleric acid), and 2,2'-azobis(2-(hydroxymethyl)propionitrile).

Preferred among these radical polymerization initiators are 2,2'-azobis(2,4-dimethylvaleronitrile), 2,2'-azobisisobutyronitrile, 2,2'-azobis(2-methylbutyronitrile), 1,1'-azobis(cyclohexane-1-carbonitrile), dimethyl-2,2'-azobis(2-methylpropionate), 4,4'-azobis(4-cyanovaleric acid), and 2,2'-azobis(2-(hydroxymethyl)propionitrile).

In the present invention, the polymer (resin) obtained by the foregoing polymerization reaction is preferably recovered by reprecipitation method. In other words, the reaction solution obtained by polymerization is poured into reprecipitating solution to give a desired resin which is then recovered in the form of powder.

Examples of the reprecipitating solution include water, alcohols, ethers, ketones, amides, esters, lactones, nitriles, hydrocarbons and the mixtures thereof.

Examples of the alcohols include methanol, ethanol, propanol, isopropanol, butanol, ethylene glycol, propylene glycol, and 1-methoxy-2-propanol.

Examples of the ethers include propyl ether, isopropyl ether, butyl methyl ether, tetrahydrofuran, 1,4-dioxane, 1,3-dioxolane, and 1,3-dioxane.

Examples of the ketones include acetone, methyl ethyl ketone, diethyl ketone, methyl isopropyl ketone, and methyl isobutyl ketone.

Examples of the amides include N,N-dimethylformamide, and N,N-dimethylacetamide.

Examples of the esters and lactones include ethyl acetate, methyl acetate, isobutyl acetate, and γ-butyrolactone.

Examples of the nitrites include acetonitrile, propionitrile, and butyronitrile.

Specific examples of the hydrocarbons include straight-chain or branched hydrocarbons such as pentane, hexane, heptane and octane, cyclic hydrocarbons such as cyclopentane and cyclohexane, and aromatic hydrocarbons such as toluene and xylene.

Specific examples of the mixed reprecipitating solution include mixure of alcohols, mixture of hydrocarbons, mixture of hydrocarbon and alcohol, mixture of hydrocarbon and ether, mixture of hydrocarbon and ketone, and mixture of hydrocarbon, ester and lactone.

Specific examples of mixture of alcohols include mixture of methanol and ethanol, mixture of methanol and propanol, mixture of methanol and isopropanol, mixture of methanol and butanol, mixture of ethylene glycol and ethanol, mixture of ethylene glycol and propanol, mixture of ethylene glycol and isopropanol, mixture of ethylene glycol and butanol, mixture of 1-methoxy-2-propanol and ethanol, mixture of 1-methoxy-2-propanol and propanol, mixture of 1-methoxy-2-propanol and isopropanol, and mixture of 1-methoxy-2-propanol and butanol. Specific examples of mixture of hydrocarbons include commercially available mixed solvent such as Isoper G, mixture of hexane and heptane, mixture of hexane and octane, mixture of hexane and cyclohexane, mixture of hexane and toluene, mixture of hexane and xylene, and mixture of cyclohexane and toluene.

Specific examples of mixture of different solvents include mixture of hexane and propanol, mixture of hexane and isopropanol, mixture of hexane and butanol, mixture of hexane and tetrahydrofuran, mixture of hexane and acetone, mixture of hexane and methyl ethyl ketone, and mixture of hexane and γ-butrolactone. The mixing ratio of these components is from 20/1 to 1/20.

Preferred among these reprecipitating solutions are hexane, commercially available mixed solvent such as Isoper G, mixture of hexane and heptane, mixture of hexane and octane, mixture of hexane and cyclohexane, mixture of hexane and toluene, mixture of cyclohexane and toluene, mixture of hexane and propanol, mixture of hexane and isopropanol, mixture of hexane and butanol, mixture of hexane and tetrahydrofuran, mixture of hexane and acetone, mixture of hexane and methyl ethyl ketone, and mixture of hexane and γ-butrolactone.

The reprecipitation in a hydrocarbon solvent such as hexane and heptane as reprecipitating solution as disclosed in JP-A-9-73173, JP-A-10-207069 and JP-A-10-274852 is so extremely dangerous as to cause extreme static electrification and hence give difficulty in working to disadvantage.

Further, the repetition of reprecipitation merely causes an increase in the amount of waste liquid in vain, gives a poor working efficiency and leads to worsening of edge roughness as described in JP-A-10-301285. In the present invention, the number of times of reprecipitation may be from 1 to 3, preferably 1.

The amount of the reprecipitating solution to be used is properly predetermined depending on the amount and kind of the solvent to be used in polymerization and the kind of the reprecipitating solution used. In practice, however, it is normally from 3 to 100 times, preferably from 4 to 50 times, more preferably from 5 to 30 times by volume the amount of the polymerization solution. When the amount of the reprecipitating solution to be used is too small, it is difficult for the reprecipitating solution to be separated from the powder recovered, deteriorating the working efficiency. On the contrary, when the amount of the reprecipitating solution to be used is too great, the amount of waste liquid increases to disadvantage on an economic basis.

The molecular weight of the foregoing acid-decomposable resin is preferably from 3,000 to 100,000, more preferably from 4,000 to 70,000, still more preferably from 5,000 to 50,000 as calculated in terms of weight-average molecular weight (Mw: in polystyrene equivalence as determined by GPC) The greater the molecular weight of the acid-decomposable resin is, the better is the heat resistance of the resin but the poorer are the developability and other properties thereof. Thus, the molecular weight of the acid-decomposable resin is adjusted so properly that these properties are well-balanced.

In the positive-working resist composition of the invention, the amount of the acid-decomposable resin to be incorporated in the entire resist composition is preferably from 40% to 99.99% by weight, more preferably from 50% to 99.97% by weight based on the total solid content.

Specific examples of combination of repeating structural units constituting the acid-decomposable resin as component (A') will be given below.

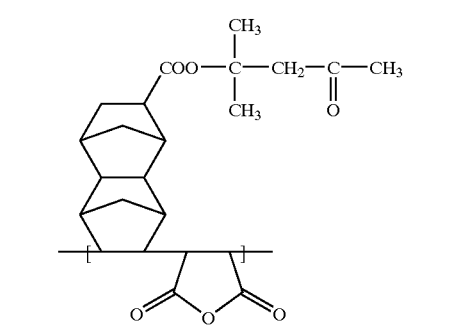
(1)

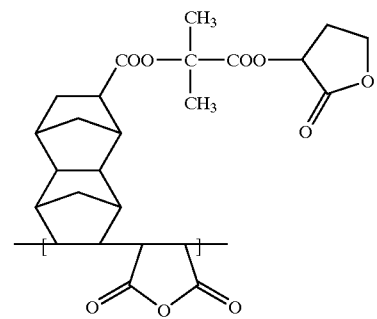
(2)

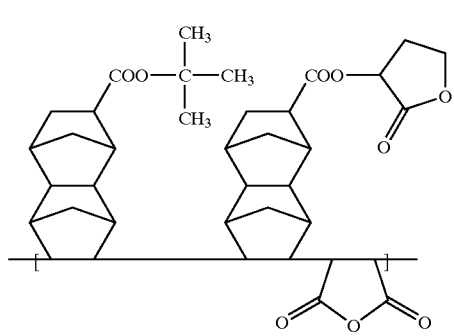
(3)

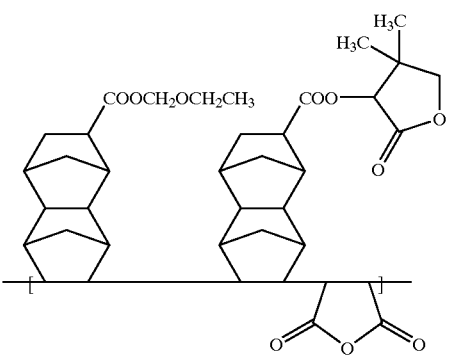
(4)

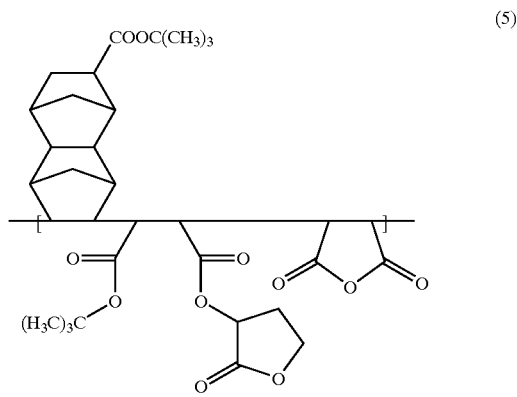
(5)

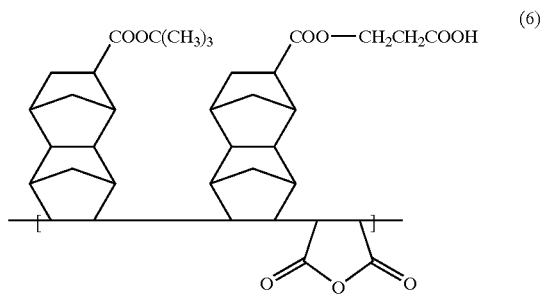
(6)

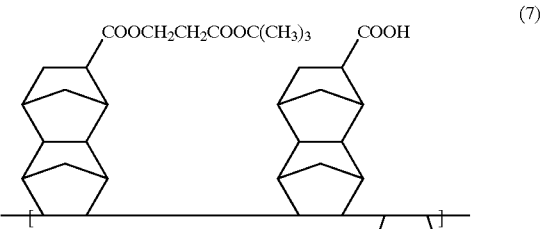
(7)

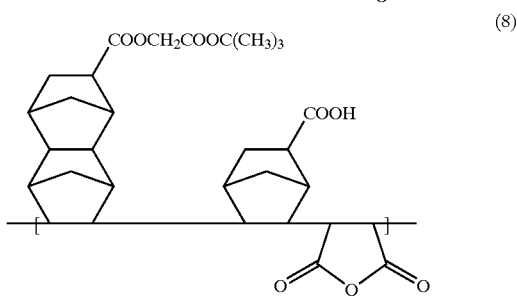
(8)

-continued

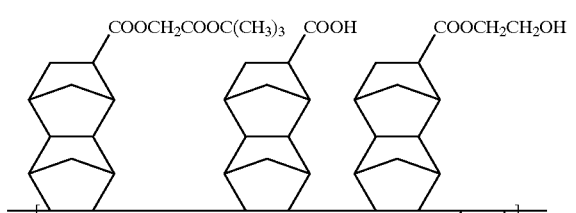
(9)

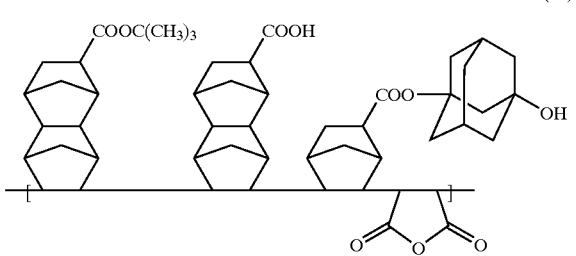
(10)

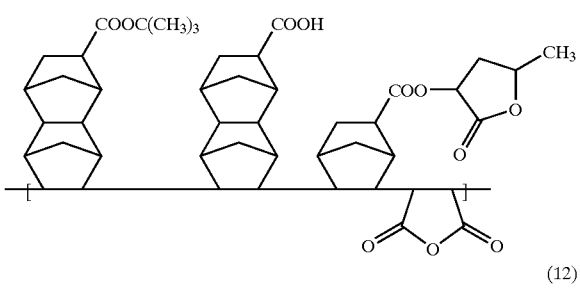
(11)

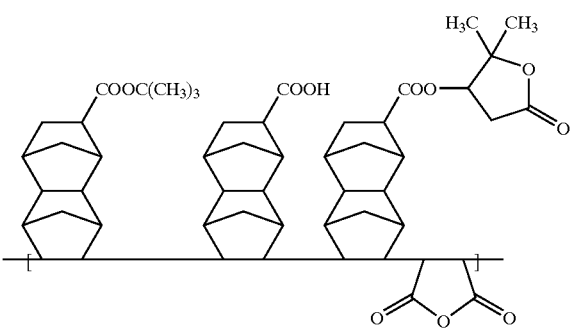
(12)

[2] (B) Compound which Generates an Acid when Irradiated with Active Ray or Radiation (Photo-acid Generator)

The photo-acid generator to be used in the invention is a compound which generates an acid when irradiated with active ray or radiation.

Examples of the photo-acid generator employable herein include photo cationic polymerization initiator, photo radical polymerization initiator, photodecolorizer for dyes, photo discoloring agent, compound which generates an acid when irradiated with known light used for the preparation of microresist (ultraviolet ray having a wavelength range of from 200 nm to 400 nm, far ultraviolet ray, particularly, g-line, h-line, i-line, KrF excimer laser beam), ArF excimer laser beam, electron ray, X-ray, molecular beam or ion beam, and mixture thereof. These photo-acid generators may be properly selected.

Other examples of the photo-acid generator employable herein include onium salt such as dizaonium salt, ammonium salt, phosphonium salt, iodonium salt, sulfonium salt, selenonium salt and arsonium salt, organic halogen compound, organic metal/organic halogen compound, photo-acid generator having o-nitrobenzyl type protective group, compound which undergoes photodecomposition to generate a sulfonic acid such as iminosulfonate, disulfon compound, diazoketosulfon, and diazodisulfon compound.

Alternatively, a compound comprising such a group or compound which generates an acid when irradiated with light incorporated in the main chain or side chain of a polymer may be used.

Still alternatively, compounds which generate when irradiated with light as disclosed in V. N. R. Pillai, "Synthesis", (1), 1 (1980), A. Abad et al., "Tetrahedron Lett.", (47) 4555 (1971), D. H. R. Barton et al., "J. Chem. Soc.", (C), 329 (1970), U.S. Pat. No. 3,779,778, and EP 126,712 may be used.

Among the foregoing compounds which generate an acid when irradiated with electron ray, those which can be used most effectively will be further described hereinafter.

(1) Oxazole derivative represented by the following general formula (PAG1) or S-triazine derivative represented by the following general formula (PAG2) substituted by trihalomethyl group:

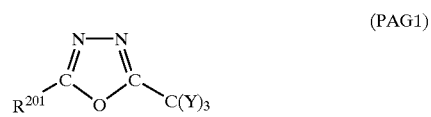
(PAG1)

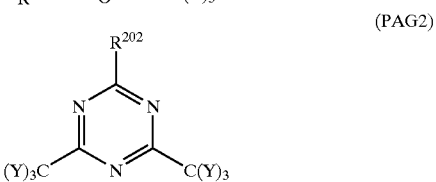
(PAG2)

wherein $R^{201}$ represents a substituted or unsubstituted aryl group or alkenyl group; $R^{202}$ represents a substituted or unsubstituted aryl group, alkenyl group or alkyl group or —C(Y)$_3$; and Y represents a chlorine atom or bromine atom.

Specific examples of these derivatives will be given below, but the present invention should not be construed as being limited thereto.

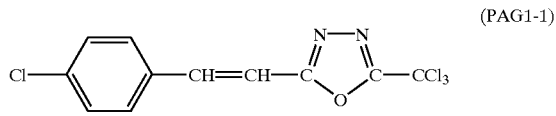
(PAG1-1)

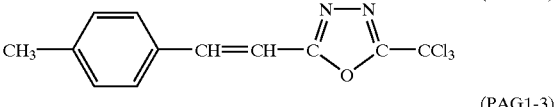
(PAG1-2)

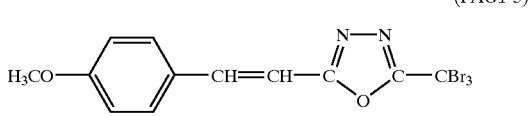
(PAG1-3)

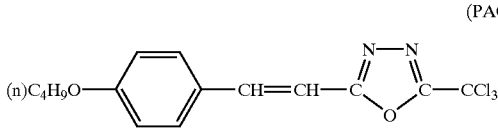
(PAG1-4)

(PAG1-5)
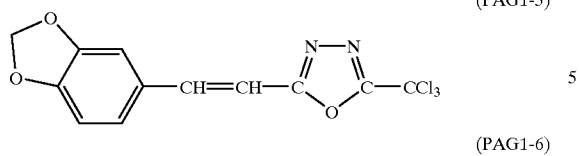
(PAG1-6)
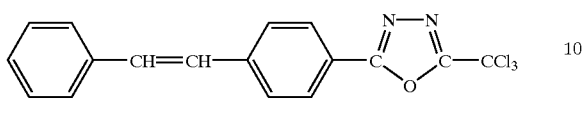
(PAD1-7)
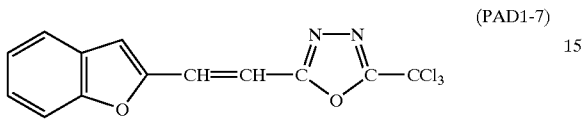
(PAG1-8)
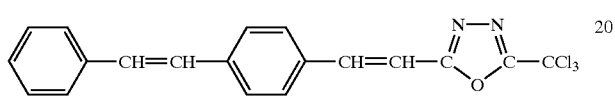
(PAG2-1)
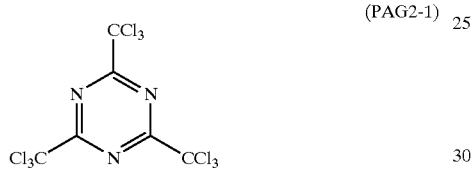
(PAG2-2)
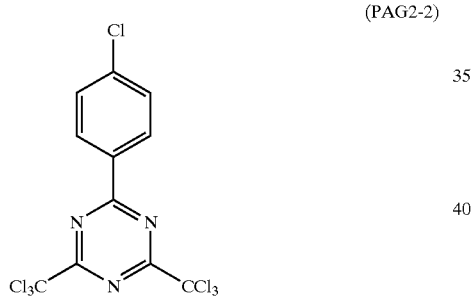
(PAG2-3)
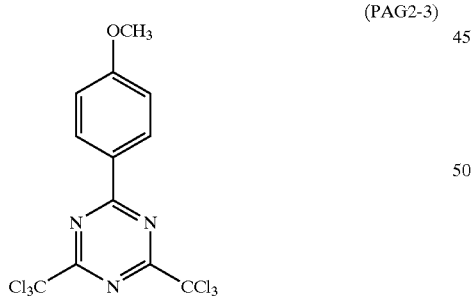
(PAG2-4)
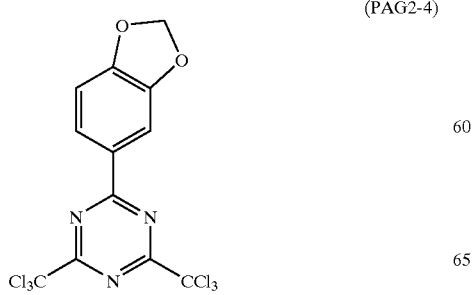
(PAG2-5)
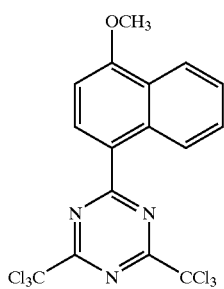
(PAG2-6)
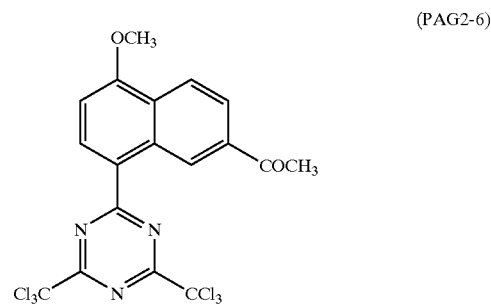
(PAG2-7)
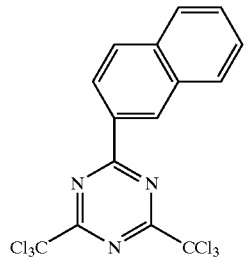
(PAG2-8)
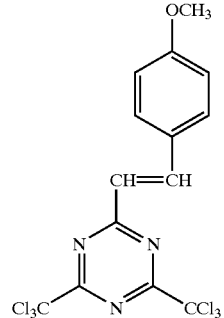
(PAG2-9)
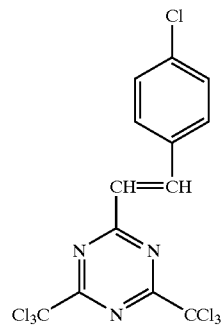

-continued (PAG2-10)

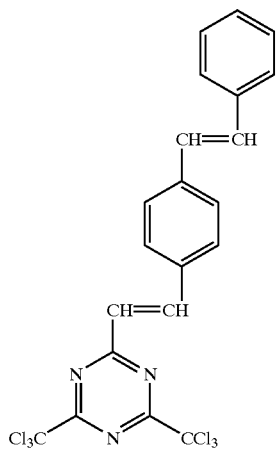

(2) Iodonium salt represented by the following general formula (PAG3) or sulfonium salt represented by the general formula (PAG4)

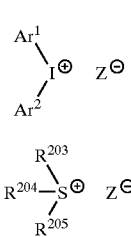
(PAG3)

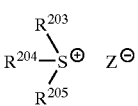
(PAG4)

$Ar^1$ and $Ar^2$ each independently represent a substituted or unsubstituted aryl group.

$R^{203}$, $R^{204}$ and $R^{205}$ each independently represent a substituted or unsubstituted alkyl group or aryl group.

$Z^-$ represents a counter ion. Examples of the counter ion include perfluoroalkanesulfonic acid anion such as $BF_4^-$, $AsF_6^-$, $PF_6^-$, $SbF_6^-$, $SiF_6^{2-}$, $ClO_4^-$ and $CF_3SO_3^-$, condensed polynuclear aromatic sulfonic acid anion such as pentafluorobenzenesulfonic acid anion and naphthalene-1-sulfonic acid anion, anthraquinonesulfonic acid anion, and sulfonic acid group-containing dye. However, the present invention is not limited to these counter ions.

Two of $R^{203}$, $R^{204}$ and $R^{205}$ and $Ar^1$ and $Ar^2$ may be connected to each other via the respective single bond or substituent.

Specific examples of these salts will be given below, but the present invention should not be construed as being limited thereto.

(PAG3-1)
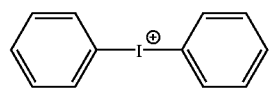 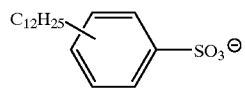

(PAG3-2)
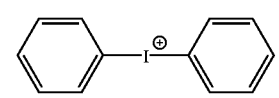 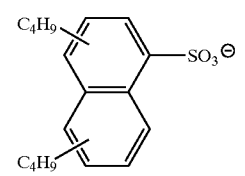

(PAG3-3)
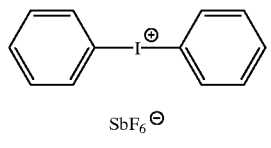
$SbF_6^{\ominus}$ (PAG3-4)
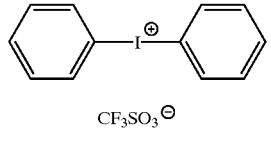
$CF_3SO_3^{\ominus}$ (PAG3-5)
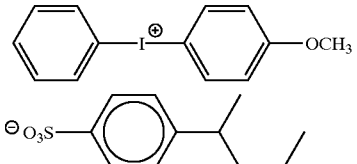

(PAG3-6)
$PF_6^{\ominus}$ (PAG3-7)
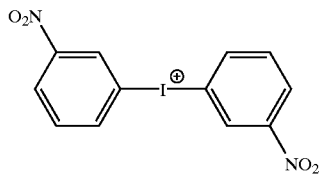

(PAG3-8)
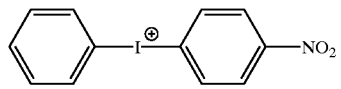
$AsF_6^{\ominus}$ (PAG3-9)
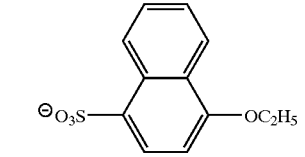

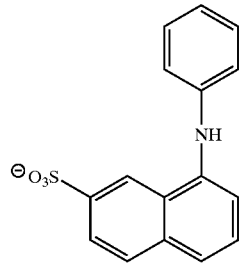

(PAG3-10)
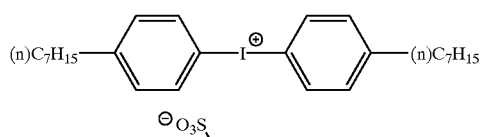
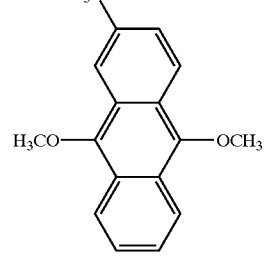
(PAG3-11)
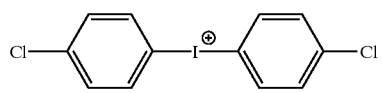
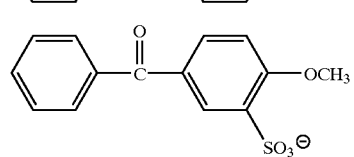
(PAG3-12)
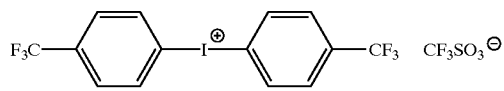
(PAG3-13)
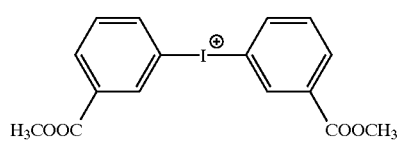
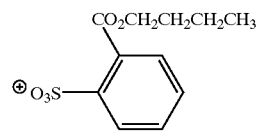
(PAG3-14)
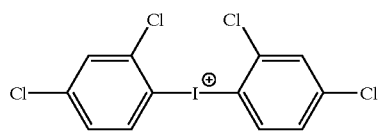
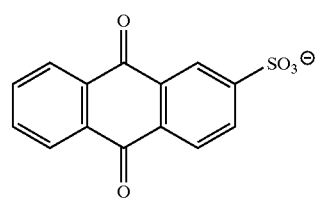
(PAG3-15)
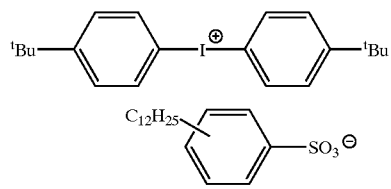
(PAG3-16)
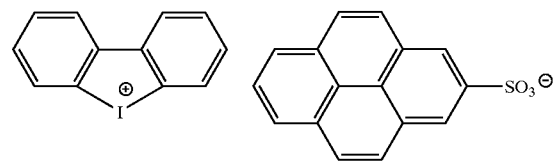
(PAG3-17)
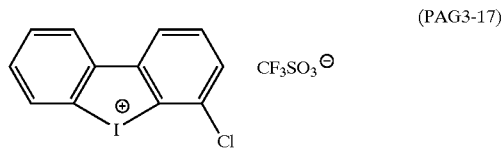
(PAG3-18)
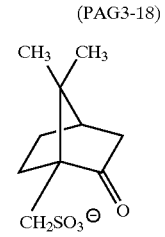
(PAG3-19)
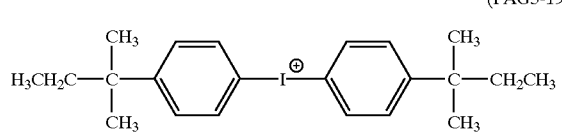
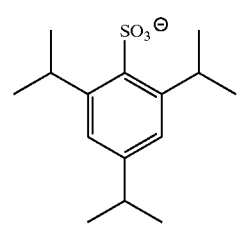
(PAG3-20)
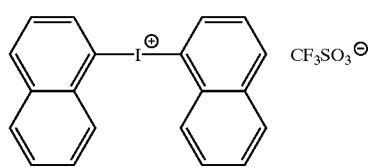
(PAG3-21)
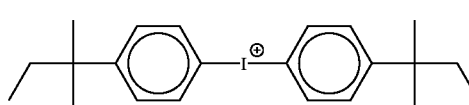
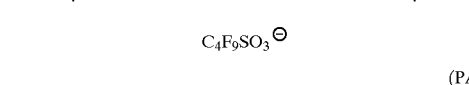
(PAG3-22)
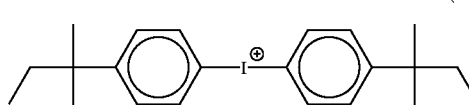
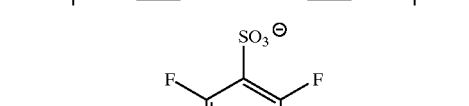
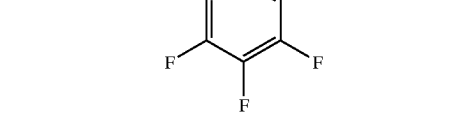

(PAG3-23)
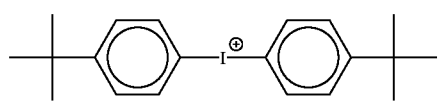
(PAG3-24)
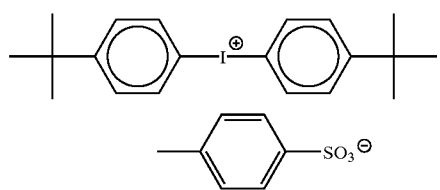
(PAG3-25)
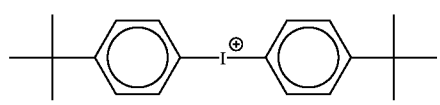
(PAG4-1)
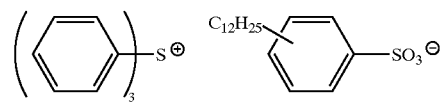
(PAG4-2)
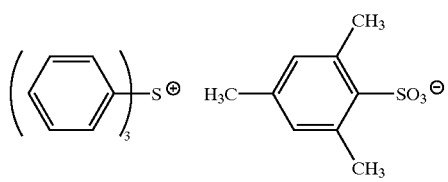
(PAG4-3)
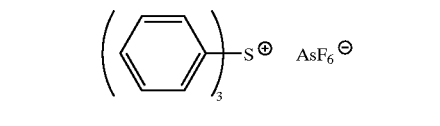
(PAG4-4)
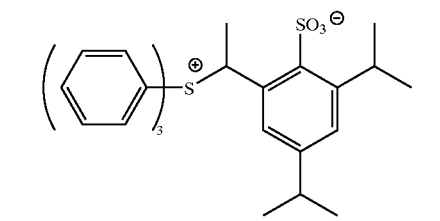
(PAG4-5)
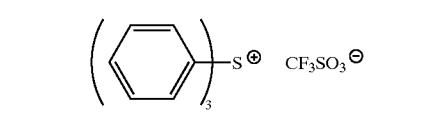
(PAG4-6)
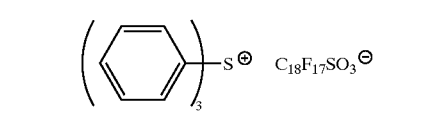
(PAG4-7)
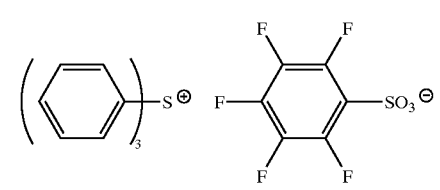
(PAG4-8)
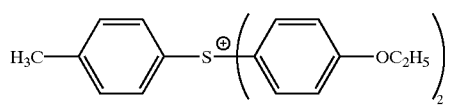
(PAG4-9)
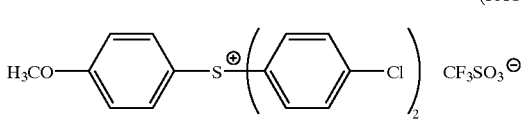
(PAG4-10)
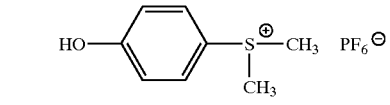
(PAG4-11)
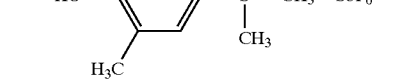
(PAG4-12)
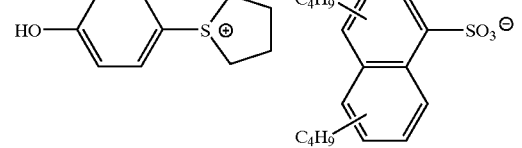
(PAG-13)
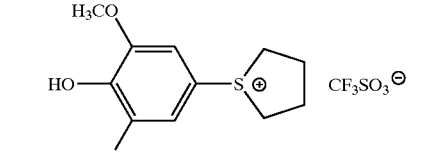
(PAG4-14)
(PAG4-15)
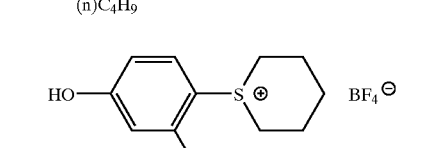
(PAG4-16)
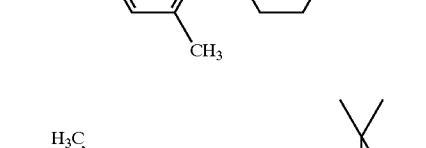
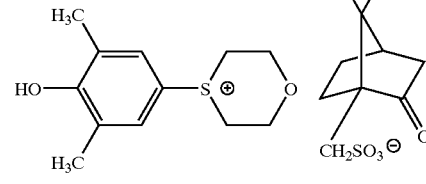

(PAG4-17)
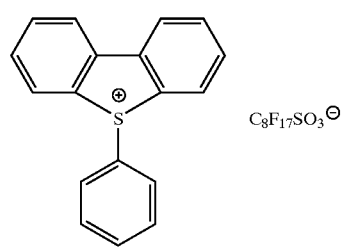
(PAG4-18)
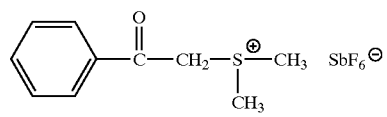
(PAG4-19)
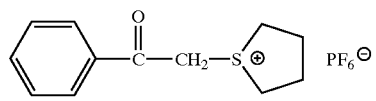
(PAG4-20)
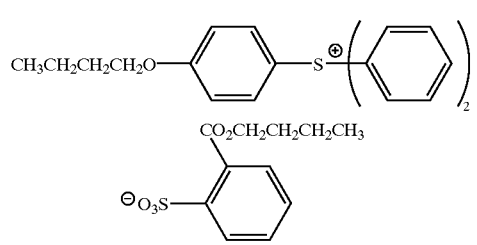
(PAG4-21)
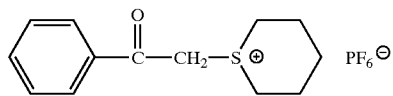
(PAG4-22)
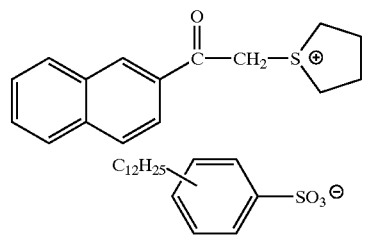
(PAG4-23)
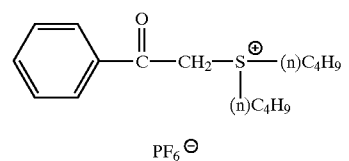
(PAG4-24)
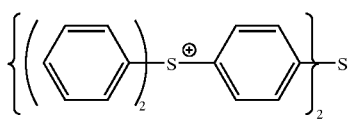
(PAG4-25)
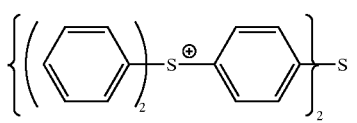
(PAG4-26)
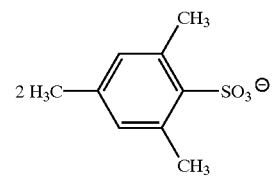
(PAG4-27)
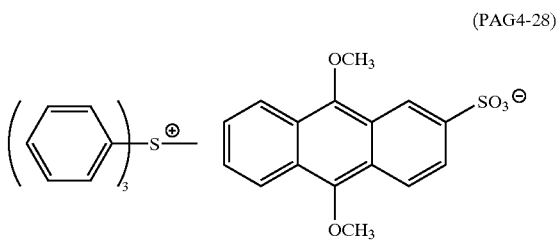
(PAG4-28)
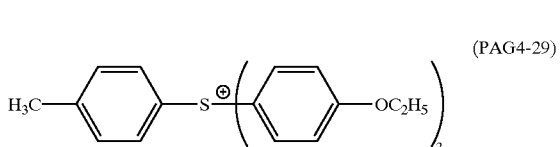
(PAG4-29)
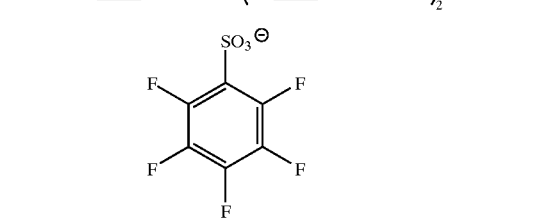
(PAG4-30)
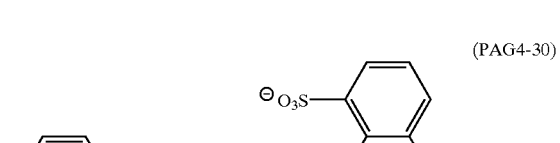
(PAG4-31)
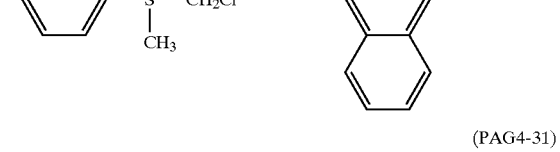

-continued

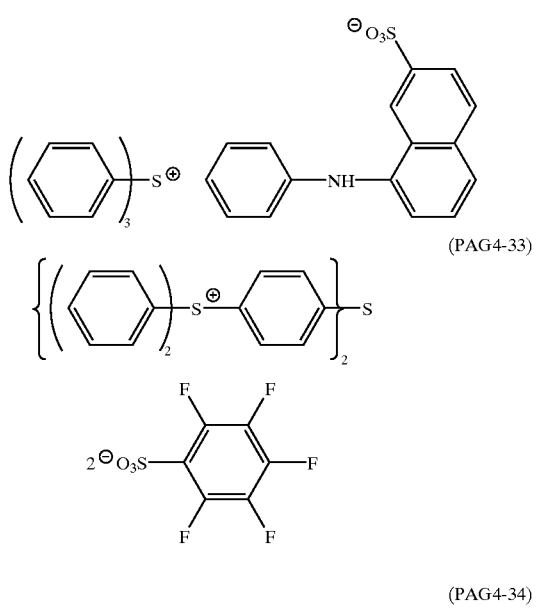

The foregoing onium salts represented by the general formulae (PAG3) and (PAG4) are known and can be synthesized by the methods disclosed in U.S. Pat. Nos. 2,807,648 and 4,247,473 and JP-A-53-101,331.

(3) Disulfon derivative represented by the following general formula (PAG5) or iminosulfonate derivative represented by the general formula (PAG6)

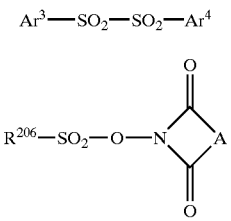

wherein $Ar^3$ and $Ar^4$ each independently represent a substituted or unsubstituted aryl group; $R^{206}$ represents a substituted or unsubstituted alkyl group or aryl group; and A represents a substituted or unsubstituted alkylene group, alkenylene group or arylene group.

Specific examples of these derivatives include compounds represented by the following general formulae, but the present invention should not be construed as being limited thereto.

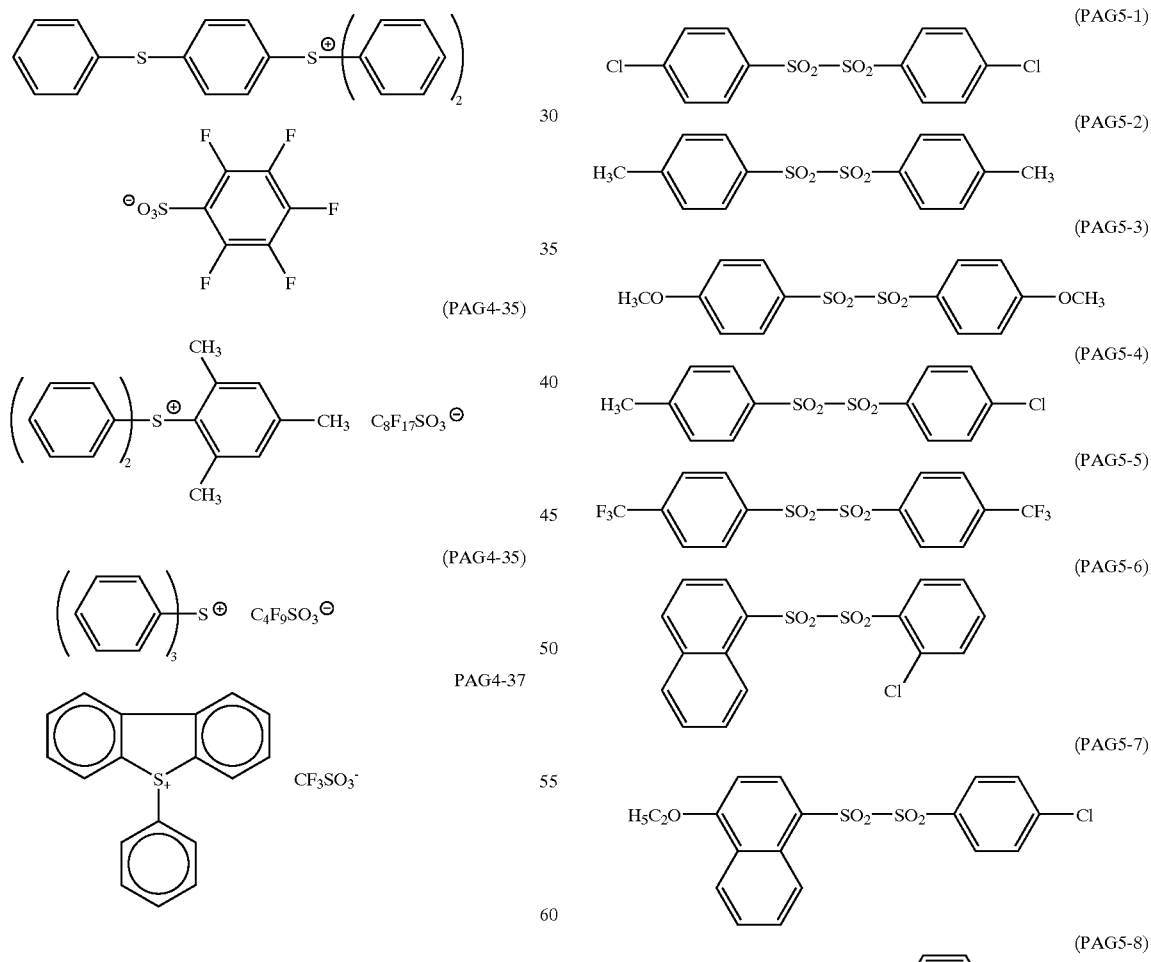

(PAG5-9)
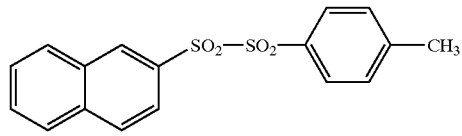
(PAG5-10)
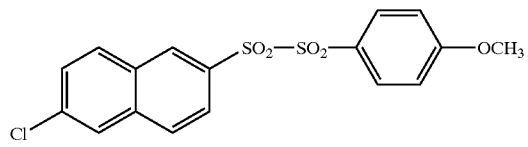
(PAG5-11)
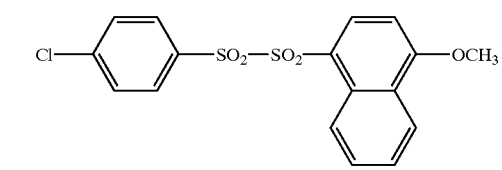
(PAG5-12)
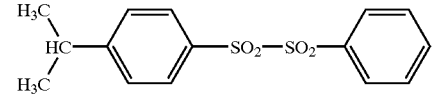
(PAG5-13)
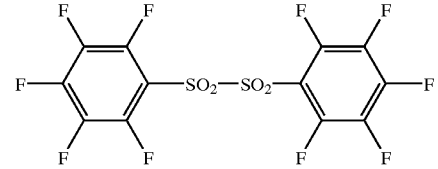
(PAG5-14)
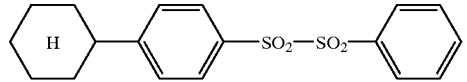
(PAG5-15)
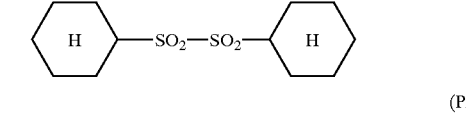
(PAG6-1)
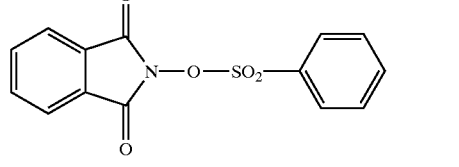
(PAG6-2)
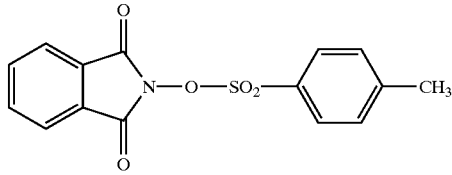
(PAG6-3)
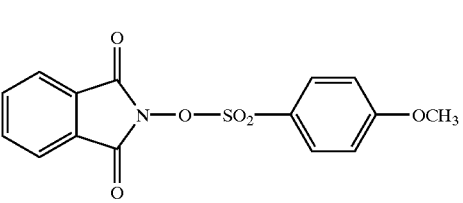
(PAG6-4)
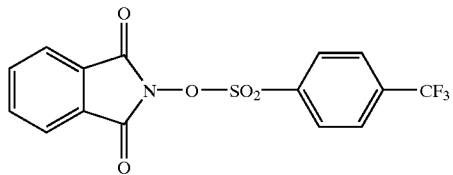
(PAG6-5)
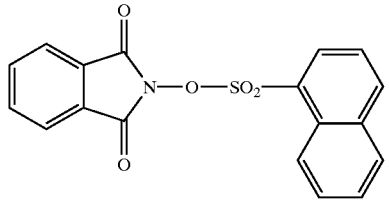
(PAG6-6)
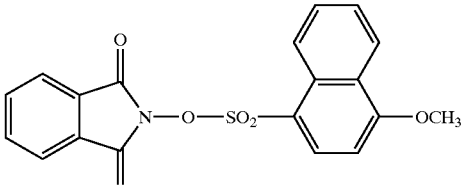
(PAG6-7)
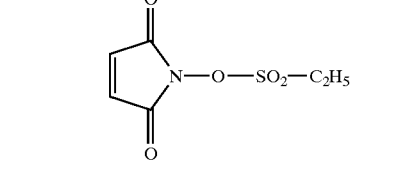
(PAG6-8)
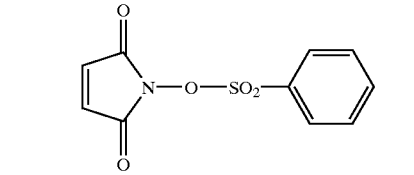
(PAG6-9)
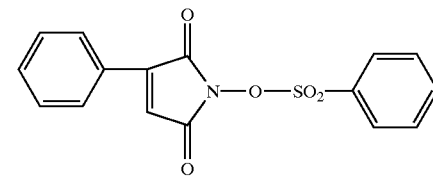
(PAG6-10)
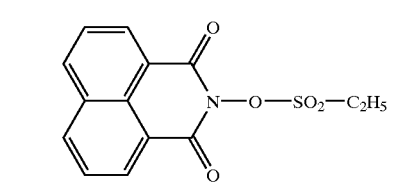
(PAG6-11)
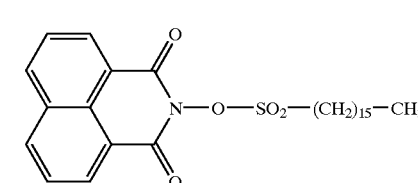

-continued (PAG6-12) 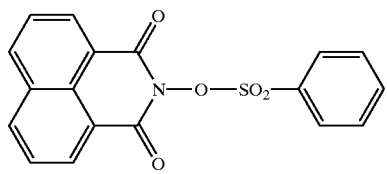

(PAG6-13) 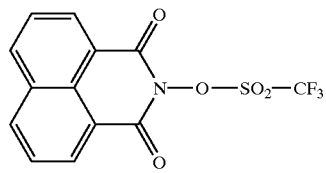

(PAG6-14) 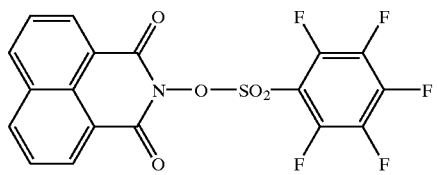

(PAG6-15) 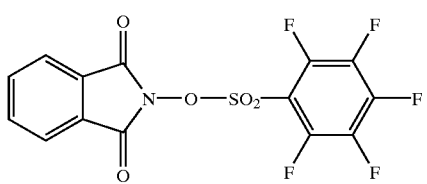

(PAG6-16) 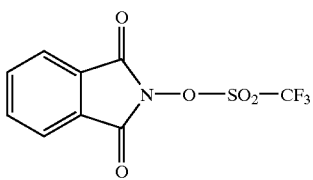

(PAG6-17) 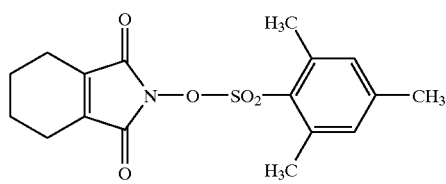

(PAG6-18) 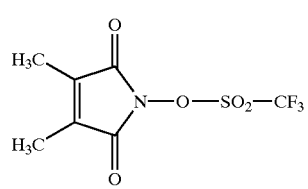

(PAG6-19) 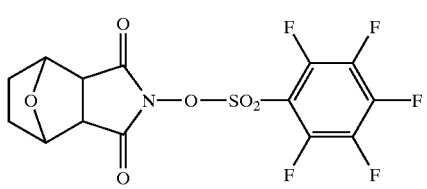

-continued (PAG6-20) 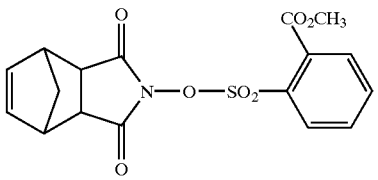

(4) Diazosulfon derivative represented by the following general formula (PAG7)

(PAG7) 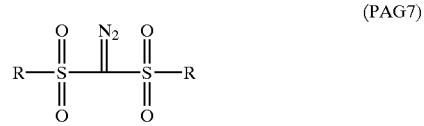

wherein R represents a straight-chain, branched or cyclic alkyl group or an aryl group which may be substituted.

Specific examples of the foregoing diazosulfone derivative include compounds represented by the following general formulae, but the present invention should not be construed as being limited thereto.

(PAG7-1) 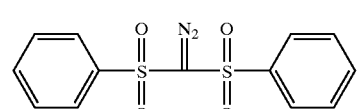

(PAG7-2) 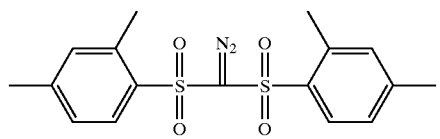

(PAG7-3) 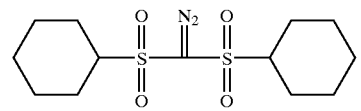

(PAG7-4) 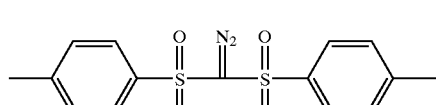

(PAG7-5) 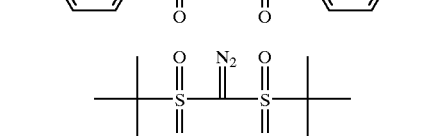

The added amount of the foregoing photo-acid generator is normally from 0.001 to 40% by weight, preferably from 0.01 to 20% by weight, more preferably from 0.1 to 5% by weight based on the solid content in the composition. When the added amount of the photo-acid generator falls below 0.001% by weight, the resulting composition exhibits a lowered sensitivity. On the contrary, when the added amount of the photo-acid generator exceeds 40% by weight, the resulting resist exhibits too high a light absorptivity that worsens profile or narrows the process (particularly bake) margin to disadvantage.

[3] Other components

The positive-working resist composition of the invention may further comprise an acid-decomposable dissolution-inhibiting compound, a dye, a plasticizer, a surface active agent, a photo sensitizer, an organic basic compound, a compound for accelerating solubility in the developer incorporated therein as necessary.

The positive-working resist composition of the invention preferably comprises a fluorine-based and/or silicon-based surface active agent incorporated therein.

The positive-working resist composition of the invention preferably comprises any or two or more of fluorine-based surface active agent, silicon-based surface active agent and surface active agent having both fluorine and silicon atoms incorporated therein.

The positive-working resist composition of the invention can comprise the foregoing acid-decomposable resin and surface active agent incorporated therein to work effectively particularly when the line width of pattern is further reduced, further eliminate defects in development and give better resolution of contact hole.

Examples of these surface active agents include those described in JP-A-62-36663, JP-A-61-226746, JP-A-61-226745, JP-A-62-170950, JP-A-63-34540, JP-A-7-230165, JP-A-8-62834, JP-A-9-54432, and JP-A-9-5988. The following commercially available surface active agents may be used as they are.

Examples of commercially available surface active agents employable herein include fluorine-based surface active agents or silicon-based surface active agents such as EFTOP EF301, EF303 (produced by Shin-Akita Kasei K.K.), Florad FC430, 431 (produced by Sumitomo 3M Limited), Megafac F171, F173, F176, F189, R08 (produced by DAINIPPON INK & CHEMICALS, INC.), Surflon S-382, SC101, 102, 103, 104, 105, 106 (produced by Asahi Glass Co., Ltd.) and Troysol S-366 (produced by Troy Chemical Co., Ltd.). Further, Polysiloxane polymer KP-341 (produced by Shin-Etsu Chemical Co., Ltd.) may be used as a silicon-based surface active agent.

The amount of the surface active agent to be incorporated is normally from 0.001% to 2% by weight, preferably from 0.01% to 1% by weight based on the solid content in the composition of the invention. These surface active agents may be added singly or in combination.

Specific other examples of surface active agent employable herein include nonionic surface active agents such as polyoxyethylene alkyl allyl ether (e.g., polyoxyethylene lauryl ether, polyoxyethylene stearyl ether, polyoxyethylene cetyl ether, polyoxyethylene oleyl ether), polyoxyethylene alkyl allyl ether (e.g., polyoxyethylene octyl phenol ether, polyoxyethylene nonyl phenol ether), polyoxyethylene-polyoxypropylene block copolymer, sorbitan aliphatic acid ester (e.g., sorbitan monolaurate, sorbitan monopalmitate, sorbitan monostearate, sorbitan monooleate, sorbitan trioleate, sorbitan tristearate) and polyoxyethylene sorbitan aliphatic acid ester (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

The amount of the other surface active agents to be incorporated is normally 2 parts by weight or less, preferably 1 part by weight or less based 100 parts by weight of the solid content in the composition of the invention.

A preferred example of organic basic compound which can be used in the invention is a compound having a higher basicity than phenol. In particular, a nitrogen-containing basic compound is preferred.

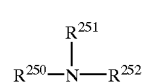
(A)

wherein $R^{250}$, $R^{251}$ and $R^{252}$ each independently represent a hydrogen atom, $C_{1-6}$ alkyl group, $C_{1-6}$ aminoalkyl group, $C_{1-6}$ hydroxyalkyl group or $C_{6-20}$ substituted or unsubstituted aryl group; and $R^{251}$ and $R^{252}$ may be connected to each other to form a ring.

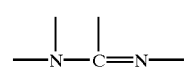
(B)

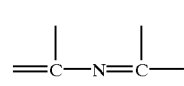
(C)

(D)

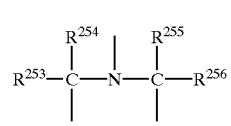
(E)

wherein $R^{253}$, $R^{254}$, $R^{255}$ and $R^{256}$ each independently represent a C1–6 alkyl group.

An even more desirable compound is a nitrogen-containing basic compound having two or more nitrogen atoms having different chemical environments per molecule, particularly a compound or alkylamino group having both substituted or unsubstituted amino group and nitrogen-containing cyclic structure. Specific examples of such a compound include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperadine, substituted or unsubstituted aminomorpholine, and substituted or unsubstituted aminoalkylmorpholine. Preferred examples of substituents on these compounds include amino group, aminoalkyl group, alkylamino group, aminoaryl group, arylamino group, alkyl group, alkoxy group, acyl group, acyloxy group, aryl group, aryloxy group, nitro group, hydroxyl group, and cyano group.

Specific preferred examples of the nitrogen-containing basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpridine, 3-aminopyrrolidine, piperadine, N-(2-aminoethyl) piperadine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, 2-pyrazoline, 3-pyrazoline, N-aminomorpholine, N-(2-aminoethyl)morpholine, 1,5- diazabicyclo[4.3.o]nona-5-ene, 1,8-diazabicyclo[5.4.0] undeca-7-ene, 1,4-diazabicyclo[2.2.2]octane, 2,4,5-triphenylimidazole, N-methylmorpholine, N-ethylmorpholine, N-hydroxyethylmorpholine, N-benzylmorpholine, tertiary morpholine derivatives such as cyclohexylmorpholinoethyl thiourea (CHMETU), and hindered amines disclosed in JP-A-11-52575 (e.g., [0005]), but the present invention is not limited thereto.

Particularly preferred among these nitrogen-containing basic compounds are 1,5-diazabicyclo[4.3.0]nona-5-ene, 1,8-diazabicyclo[5.4.0]undeca-7-ene, 1,4-diazabicyclo[2.2.2]octane, 4-dimethylaminopyridine, hexamethylenetetramine, 4,4-dimethylimidazoline, pyrroles, pyrazoles, imidazoles, pyridazines, tertiary morpholine derivatives such as cyclohexylmorpholinoethyl thiourea (CHMETU), and hindered amines such as bis(1,2,2,6,6-pentamethyl-4-piperidyl)sebacate.

Preferred among these nitrogen-containing basic compounds are 1,5-diazabicyclo[4.3.0]nona-5-ene, 1,8-diazabicyclo[5.4.0]undeca-7-ene, 1,4-diazabicyclo[2.2.2]octane, 4-dimethylaminopyridine, hexamethylenetetramine, (CHMETU), and bis(1,2,2,6,6-pentamethyl-4-piperidyl) sebacate.

These nitrogen-containing basic compounds may be used singly or in combination of two or more thereof. The amount of the nitrogen-containing basic compound to be used is normally from 0.001% to 10% by weight, preferably from 0.01% to 5% by weight based on the total solid content in the photosensitive resin composition. When the amount of the nitrogen-containing basic compound to be used falls below 0.001% by weight, the effect of the nitrogen-containing basic compound cannot be exerted. On the contrary, when the amount of the nitrogen-containing basic compound to be used exceeds 10% by weight, the resulting resin composition can be liable to the lowering of sensitivity and the deterioration of developability on unexposed areas.

[4] Preparation and use of Positive-working Resist Composition

The positive-working resist composition of the invention is applied to a support in the form of solution in a solvent capable of dissolving the foregoing constituents therein. Preferred examples of the solvent employable herein include ethylene dichloride, cyclohexanone, cyclopentanone, 2-heptanone, γ-butryrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, propyl pyruvate, N,N-dimethylformamide, dimethylsulfoxide, N-methylpyrrolidone, and tetrahydrofuran. These solvents may be used singly or in admixture.

Preferred among these solvents are 2-heptanone, γ-butryrolactone, ethylene glycol monomethyl ether, ethylene glycol monoethyl ether, ethylene glycol monoethyl ether acetate, propylene glycol monomethyl ether, methyl lactate, ethyl lactate, methyl methoxypropionate, ethyl ethoxypropionate, N-methylpyrrolidone, and tetrahydrofuran.

The positive-working resist composition of the invention is applied to a substrate to form a thin film thereon. The thickness of the coated film is preferably from 0.2 μm to 1.2 μm. In the present invention, a commercially available inorganic or organic anti-reflection coating film may be used as necessary.

As such an anti-reflection coating film there may be used an inorganic film such as titanium, titanium dioxide, titanium nitride, chromium oxide, carbon and a-silicon or organic film made of an absorber and a polymer material. The formation of the former anti-reflection coating film requires the use of facilities such as vacuum-metallizing apparatus, CVD apparatus and sputtering apparatus. Examples of the organic anti-reflection coating film include film made of product of condensation of diphenylamine derivative with formaldehyde-modified melamine resin, an alkali-soluble resin and a light absorber as disclosed in JP-B-7-69611 (The term "JP-B" as used herein means an "examined Japanese patent application"), film made of product of reaction of maleic anhydride copolymer with diamine type light absorber as disclosed in U.S. Pat. No. 5,294,680, film comprising a resin binder and a methylol melamine-based crosslinking agent as disclosed in JP-A-6-118631, acrylic resin type anti-reflection coating film having a carboxylic acid group, an epoxy group and a light absorbing group as disclosed in JP-A-6-118656, film made of methylol melamine and benzophenone-based light absorber as disclosed in JP-A-8-87115, and film comprising a low molecular light absorber incorporated in a polyvinyl alcohol resin as disclosed in JP-A-8-179509.

As the organic anti-reflection coating film there may also be used DUV30 Series or DUV-40 Series produced by Brewer Science Inc. or AC-2 or AC-3 produced by Shipley Inc.

The foregoing resist solution is applied to a substrate as used in the production of precision integrated circuit elements (e.g., silicon/silicon dioxide-coated substrate, optionally provided with the foregoing anti-reflection coating film) by a proper coating means such as spinner and coater. The coated material is exposed to light through a predetermined mask, and then baked to undergo development to obtain a good resist pattern. As the exposing light there is preferably used light having a wavelength range of from 150 nm to 250 nm. Specific examples of such light include KrF excimer laser (248 nm), ArF excimer laser (193 nm), $F_2$ excimer laser (157 nm) X-ray, and electron beam.

As the developer there may be used an alkaline aqueous solution of inorganic alkali such as sodium hydroxide, potassium hydroxide, sodium carbonate, sodium silicate, sodium metasilicate and aqueous ammonia, primary amine such as ethylamine and n-propylamine, secondary amine such as diethylamine and di-n-butylamine, tertiary amine such as triethylamine and methyl diethylamine, alcoholamine such as dimethyl ethanolamine, triethanolamine, quaternary ammonium salt such as tetramethyl ammonium hydroxide and tetraethyl ammonium hydroxide or cyclic amine such as pyrrole and piperidine.

The foregoing alkaline aqueous solution may further comprise an alcohol or surface active agent incorporated therein in a proper amount.

The present invention will be further described in the following examples, but the present invention should not be construed as being limited thereto.

(1) Synthesis of Resin (1A)-1 (Dropping Process A)

2-Ethyl-2-adamantyl methacrylate and butyrolactone methacrylate were charged at a molar ratio of 40/60. The mixture was then dissolved in a 3/7 (by weight) mixture of N,N-dimethylacetamide and tetrahydrofuran to prepare 100 ml of a solution having a solid content concentration of 20%. To this solution were then added 1 mol-% of V-65 (2,2'-azobis(2,4-dimethylvaleronitrile)) produced by Wako Pure Chemical Industries, Ltd. and 1 mol-% of mercaptoethanol. The mixture was then added dropwise to 10 ml of N,N- dimethylacetamide which had been heated to a temperature of 60° C. in an atmosphere of nitrogen in 2 hours. After the termination of dropwise addition, the reaction solution was then heated with stirring for 3 hours To the reaction solution was then added 1 mol-% of V-65. The reaction solution was then heated with stirring for 3 hours. After the termination of reaction, the reaction solution was allowed to cool to room temperature, and then subjected to crystallization in 1.5 liter of a 3/1 (by weight) mixture of methanol and distilled water to produce a white powder which was then recovered.

The polymer ratio determined by $C^{13}$NMR was 44/56. The composition thus obtained exhibited a weight-average molecular weight of 11,900 and a monomer area ratio of 1.1% as determined by GPC (Shodex system-11, produced by Showa Denko K.K.) in standard polystyrene equivalence. For the measurement of monomer area ratio, RI detector was used (similarly hereinafter).

(2) Synthesis of Resin (1A)-2 (Dropping Process B)

2-Ethyl-2-adamantyl methacrylate and butyrolactone methacrylate were charged at a molar ratio of 40/60. The mixture was then dissolved in a 3/7 (by weight) mixture of N,N-dimethylacetamide and tetrahydrofuran to prepare 100 ml of a solution having a solid content concentration of 20% To this solution was then added 2 mol-% of V-65 (2,2'-azobis(2,4-dimethylvaleronitrile)) produced by Wako Pure Chemical Industries, Ltd. The mixture was then added dropwise to 10 ml of N,N-dimethylacetamide which had been heated to a temperature of 60° C. in an atmosphere of nitrogen in 2 hours. After the termination of dropwise addition, the reaction solution was then heated with stirring for 3 hours. To the reaction solution was then added 1 mol-% of V-65. The reaction solution was then heated with stirring for 3 hours. After the termination of reaction, the reaction solution was allowed to cool to room temperature, and then subjected to crystallization in 1.5 liter of a 3/1 (by weight) mixture of methanol and distilled water to produce a white powder which was then recovered.

The polymer ratio determined by $C^{13}$MR was 44/56. The composition thus obtained exhibited a weight-average molecular weight of 10,200 and a monomer area ratio of 1.0% as determined by GPC in standard polystyrene equivalence.

(3) Synthesis of Resin (1A)-3 (Dropping Process C)

2-Ethyl-2-adamantyl methacrylate and butyrolactone methacrylate were charged at a molar ratio of 40/60. The mixture was then dissolved in a 3/7 (by weight) mixture of N,N-dimethylacetamide and tetrahydrofuran to prepare 100 ml of a solution having a solid content concentration of 20%. To this solution were then added 1 mol-% of V-65 (2,2'-azobis(2,4-dimethylvaleronitrile)) produced by Wako Pure Chemical Industries, Ltd. and 1 mol-% of mercaptoethanol. The mixture was then added dropwise to 10 ml of N,N-dimethylacetamide which had been heated to a temperature of 60° C. in an atmosphere of nitrogen in 2 hours. After the termination of dropwise addition, the reaction solution was then heated with stirring for 3 hours. After the termination of reaction, the reaction solution was allowed to cool to room temperature, and then subjected to crystallization in 1.5 liter of a 3/1 (by weight) mixture of methanol and distilled water to produce a white powder which was then recovered.

The polymer ratio determined by $C^{13}$NHR was 44/56. The composition thus obtained exhibited a weight-average molecular weight of 12,500 and a monomer area ratio of 2.4% as determined by GPC in standard polystyrene equivalence.

(4) Synthesis of Resin (1A)-4 (Dropping Process D)

2-Ethyl-2-adamantyl methacrylate and butyrolactone methacrylate were charged at a molar ratio of 40/60. The mixture was then dissolved in a 3/7 (by weight) mixture of N,N-dimethylacetamide and tetrahydrofuran to prepare 120 ml of a solution having a solid content concentration of 18%. 20% of this solution was withdrawn, and then charged into a reaction vessel. Subsequently, to the remaining 80% of this solution were then added 2 mol-% of v-65 (2,2'-azobis(2,4-dimethylvaleronitrile)) produced by Wako Pure Chemical Industries, Ltd. The mixture was then added dropwise to the previously withdrawn solution (20% of solution) which had been heated to a temperature of 60° C. in an atmosphere of nitrogen in 2 hours. After the termination of dropwise addition, the reaction solution was then heated with stirring for 3 hours. To the reaction solution was then added 1 mol-% of V-65. The reaction solution was then heated with stirring for 3 hours. After the termination of reaction, the reaction solution was allowed to cool to room temperature, and then subjected to crystallization in 1.5 liter of a 3/1 (by weight) mixture of isopropanol and distilled water to produce a white powder which was then recovered.

The polymer ratio determined by $C^{13}$NMR was 44/56. The composition thus obtained exhibited a weight-average molecular weight of 11,100 and a monomer area ratio of 0.8% as determined by GPC in standard polystyrene equivalence.

(5) Synthesis of Resin (1A)-5 (Block Addition Process A)

2-Ethyl-2-adamantyl methacrylate and butyrolactone methacrylate were charged at a molar ratio of 40/60. The mixture was then dissolved in a 3/7 (by weight) mixture of N,N-dimethylacetamide and tetrahydrofuran to prepare 120 ml of a solution having a solid content concentration of 18%. This solution was heated to a temperature of 60° C. with stirring in an atmosphere of nitrogen. When the temperature of this solution reached 60° C., to this solution was then added 2 mol-% of V-65 (2,2'-azobis(2,4-dimethylvaleronitrile)) produced by Wako Pure Chemical Industries, Ltd. The reaction solution was then heated with stirring for 3 hours. To the reaction solution was then added 1 mol-% of V-65. The reaction solution was then heated with stirring for 3 hours. After the termination of reaction, the reaction solution was allowed to cool to room temperature, and then subjected to crystallization in 1.5 liter of a 3/1 (by weight) mixture of methanol and distilled water to produce a white powder which was then recovered.

The polymer ratio determined by $C^{13}$NMR was 44/56. The composition thus obtained exhibited a weight-average molecular weight of 12,400 and a monomer area ratio of 4.5% as determined by GPC in standard polystyrene equivalence.

(6) Synthesis of Resin (1A)-R (Block Addition Process B): Comparative Example 2-Ethyl-2-adamantyl methacrylate and butyrolactone methacrylate were charged at a molar ratio of 40/60. The mixture was then dissolved in a 3/7 (by weight) mixture of N,N-dimethylacetamide and tetrahydrofuran to prepare 120 ml of a solution having a solid content concentration of 18%. This solution was heated to a temperature of 60° C. with stirring in an atmosphere of nitrogen. When the, temperature of this solution reached 60° C., to this solution was then added 2 mol-% of V-65 (2,2'-azobis(2,4-dimethylvaleronitrile)) produced by Wako Pure Chemical Industries, Ltd. The reaction solution was then heated with stirring for 3 hours. After the termination of reaction, the reaction solution was allowed to cool to room temperature, and then subjected to crystallization in 1.5 liter of a 3/1 (by weight) mixture of methanol and distilled water to produce a white powder which was then recovered.

The polymer ratio determined by $C^{13}NMR$ was 44/56. The composition thus obtained exhibited a weight-average molecular weight of 13,100 and a monomer area ratio of 5.8% as determined by GPC in standard polystyrene equivalence.

(7) Synthesis of Resin (1A)-6 (Batchwise Addition Process A)

2-Ethyl-2-adamantyl methacrylate and butyrolactone methacrylate were charged at a molar ratio of 40/60. The mixture was then dissolved in a 3/7 (by weight) mixture of N,N-dimethylacetamide and tetrahydrofuran to prepare 120 ml of a solution having a solid content concentration of 18%. This solution was heated to a temperature of 60° C. with stirring in an atmosphere of nitrogen. When the temperature of this solution reached 60° C., to this solution was then added 2 mol-% of V-65 (2,2'-azobis(2,4-dimethylvaleronitrile)) produced by Wako Pure Chemical Industries, Ltd. in 4 portions which were made at time intervals of 30 minutes. The reaction solution was then heated with stirring for 3 hours. Then, 1 mol-% of V-65 was further added to the reactive solution, and the solution was then heated with stirring for 3 hours. After the termination of reaction, the reaction solution was allowed to cool to room temperature, and then subjected to crystallization in 1.5 liter of a 3/1 (by weight) mixture of methanol and distilled water to produce a white powder which was then recovered.

The polymer ratio determined by $C^{13}NMR$ was 44/56. The composition thus obtained exhibited a weight-average molecular weight of 12,100 and a monomer area ratio of 3.1% as determined by GPC in standard polystyrene equivalence (8) Synthesis of Resin (1A)-7 (Batchwise Addition Process B)

2-Ethyl-2-adamantyl methacrylate and butyrolactone methacrylate were charged at a molar ratio of 40/60. The mixture was then dissolved in a 3/7 (by weight) mixture of N,N-dimethylacetamide and tetrahydrofuran to prepare 120 ml of a solution having a solid content concentration of 18%. This solution was heated to a temperature of 60° C. with stirring in an atmosphere of nitrogen. When the temperature of this solution reached 60° C., to this solution was then added 2 mol-% of V-65 (2,2'-azobis(2,4-dimethylvaleronitrile)) produced by Wako Pure Chemical Industries, Ltd. in 4 portions which were made at time intervals of 30 minutes. The reaction solution was then heated with stirring for 4 hours. After the termination of reaction, the reaction solution was allowed to cool to room temperature, and then subjected to crystallization in 1.5 liter of a 3/1 (by weight) mixture of methanol and distilled water to produce a white powder which was then recovered.

The polymer ratio determined by $C^{13}NMR$ was 44/56. The composition thus obtained exhibited a weight-average molecular weight of 12,700 and a monomer area ratio of 4.3% as determined by GPC in standard polystyrene equivalence.

Resins (2A)-1 to (15A) having the composition ratio, molecular weight and residual monomer set forth in the table below were synthesized in the same manner as in the foregoing synthesis examples (the number of the repeating, unit indicates the leftward order of the repeating unit structure 1 or 2 in the foregoing resins (2A) to (15A)).

TABLE 1

| Resin | Polymerization process | Polymerization solvent (weight ratio) | Repeating unit (mol-%) | | | Molecular weight (Mw) | Residual monomer (%) | Reprecipitating solution (weight ratio) |
|---|---|---|---|---|---|---|---|---|
| | | | 1 | 2 | 3 | | | |
| (2A)-1 | Dropping process A | e alone | 55 | 45 | | 16,300 | 0.8 | b alone |
| (2A)-2 | Dropping process C | e alone | 55 | 45 | | 16,900 | 1.9 | b alone |
| (2A)-3 | Block addition process A | e alone | 55 | 45 | | 17,400 | 4.0 | b alone |
| (2A)-4 | Batchwise addition process A | d/e = 1/1 | 55 | 45 | | 17,100 | 3.2 | a/c = 1/2 |
| (3A)-1 | Dropping process B | e/f = 2/1 | 53 | 47 | | 12,300 | 0.8 | a/c = 1/3 |
| (3A)-2 | Block addition process A | f/h = 5/1 | 53 | 47 | | 13,300 | 4.2 | a/i = 1/1 |
| 4A | Dropping process A | f/g = 6/4 | 47 | 53 | | 13,400 | 0.5 | a/d = 1/3 |
| (5A)-1 | Dropping process A | d/f = 1/1 | 48 | 47 | 5 | 10,300 | 0.6 | b alone |
| (5A)-2 | Dropping process C | d/f = 1/1 | 48 | 47 | 5 | 11,100 | 2.3 | b alone |
| (5A)-3 | Block addition process A | d/f = 2/1 | 48 | 47 | 5 | 11,900 | 3.9 | b alone |

TABLE 1-continued

| Resin | Polymerization process | Polymerization solvent (weight ratio) | Repeating unit (mol-%) 1 | 2 | 3 | Molecular weight (Mw) | Residual monomer (%) | Reprecipitating solution (weight ratio) |
|---|---|---|---|---|---|---|---|---|
| (5A)-4 | Batchwise addition process B | d/f = 1/1 | 48 | 47 | 5 | 11,800 | 4.2 | b alone |
| 6A | Dropping process B | e/g = 7/3 | 47 | 43 | 10 | 17,300 | 0.8 | a/b = 1/4 |
| 7A | Dropping process A | d/e = 4/6 | 57 | 41 | 2 | 16,400 | 0.6 | a/c = 1/3 |
| 8A | Dropping process B | e/f = 2/1 | 55 | 43 | 2 | 13,300 | 0.4 | a/d = 1/3 |
| (9A)-1 | Dropping process A | e/h = 5/2 | 46 | 54 | | 12,600 | 0.6 | a/b = 1/3 |
| (9A)-2 | Batchwise addition process A | e/h = 5/2 | 46 | 54 | | 12,900 | 3.1 | a/b = 1/3 |
| (10A)-1 | Dropping process A | e/g = 2/1 | 47 | 49 | 4 | 11,900 | 0.7 | b alone |
| (10A)-2 | Block addition process A | e/g = 2/1 | 47 | 49 | 4 | 12,700 | 4.2 | b alone |
| (10A)-3 | Batchwise addition process A | e/g = 2/1 | 47 | 49 | 4 | 12,300 | 3.0 | b alone |
| 11A | Dropping process A | d/e = 3/7 | 51 | 46 | 3 | 13,100 | 0.9 | a/c = 1/3 |
| 12A | Dropping process A | d/e = 4/6 | 51 | 49 | | 12,400 | 1.2 | a/c = 25 |
| 13A | Dropping process B | e alone | 54 | 46 | | 12,800 | 0.9 | b alone |
| 14A | Batchwise addition process B | e/f = 1/1 | 55 | 43 | 2 | 15,700 | 1.0 | b alone |
| 15A | Batchwise addition process A | d/e = 5/3 | 54 | 42 | 4 | 13,500 | 1.1 | a/c = 1/3 |

Solvent a: distilled water
Solvent b: methanol
Solvent c: isopropyl alcohol
Solvent d: 1-methoxy-2-propanol
Solvent e: tetrahydrofuran
Solvent f: methyl ethyl ketone
Solvent g: N,N-dimethylacetamide
Solvent h: γ-butyrolactone
Solvent i: acetonitrile
The initiators used are as follows:
2,2'-Azobisisobutyronitrile for resins 2A, 6A and 7A;
Dimethyl-2,2'-azobis(2-methylpropionate) for resins 4A and 14A; and 2,2'-azobis(2,4-dimethylvaleronitrile) for others

EXAMPLES 1–31; COMPARATIVE EXAMPLE 1

Preparation and Evaluation of Positive-working Resist Composition 1,4 g of each of the resins set forth in Tables 2 and 3 synthesized in the foregoing synthesis examples, 0.2 g of each of the photo-acid generators set forth in Tables 2 and 3, 10 mg of an organic basic compound (amine), and optionally 0.15 g of a surface active agent were mixed. The mixtures were each dissolved in propylene glycol monoethyl ether acetate in a solid content concentration of 14% by weight, and then filtered through a microfilter having a pore diameter of 0.1 μm to prepare positive-working resist compositions of Examples 1 to 31 and comparative example.

TABLE 2

| Example No. | Resin | Photo-acid generator | Amine | Surface active agent | Sensitivity | Edge roughness (nm) | Profile |
|---|---|---|---|---|---|---|---|
| 1 | (1A)-1 | 1 | 1 | W1 | 1.0 | 12 | ○ |
| 2 | (1A)-2 | 2 | 2 | W2 | 1.0 | 12 | ○ |
| 3 | (1A)-3 | 2 | 1 | W3 | 1.0 | 13 | ○ |
| 4 | (1A)-4 | 1 | 2 | W1 | 1.0 | 12 | ○ |
| 5 | (1A)-5 | 2 | 1 | W3 | 1.2 | 18 | Δ |
| 6 | (1A)-6 | 1 | 1 | W1 | 1.1 | 15 | ○ |
| 7 | (1A)-7 | 2 | 1 | W4 | 1.3 | 18 | Δ |
| 8 | (2A)-1 | 1 | 1 | W2 | 0.7 | 7 | ○ |
| 9 | (2A)-2 | 1 | 1 | W4 | 0.9 | 7 | ○ |
| 10 | (2A)-3 | 2 | 1 | W1 | 1.0 | 16 | Δ |

TABLE 2-continued

| Example No. | Resin | Photo-acid generator | Amine | Surface active agent | Sensitivity | Edge roughness (nm) | Profile |
|---|---|---|---|---|---|---|---|
| 11 | (2A)-4 | 1 | 2 | W2 | 0.9 | 13 | ○ |
| 12 | (3A)-1 | 2 | 1 | W1 | 1.0 | 12 | ○ |
| 13 | (3A)-2 | 1 | 2 | W2 | 1.3 | 18 | Δ |
| 14 | 4A | 2 | 1 | W3 | 0.9 | 10 | ○ |
| 15 | (5A)-1 | 2 | 2 | W1 | 1.2 | 10 | ○ |
| 16 | (5A)-2 | 2 | 1 | W2 | 1.3 | 11 | ○ |

TABLE 3

| Example No. | Resin | Photo-acid generator | Amine | Surface active agent | Sensitivity | Edge roughness (nm) | Profile |
|---|---|---|---|---|---|---|---|
| 17 | (5A)-3 | 2 | 1 | W4 | 1.5 | 13 | Δ |
| 18 | (5A)-4 | 1 | 1 | W3 | 1.5 | 18 | Δ |
| 19 | 6A | 2 | 1 | W1 | 0.6 | 6 | ○ |
| 20 | 7A | 2 | 1 | W1 | 0.8 | 9 | ○ |
| 21 | 8A | 2 | 1 | W2 | 0.7 | 7 | ○ |
| 22 | (9A)-1 | 1 | 2 | W2 | 0.8 | 6 | ○ |
| 23 | (9A)-2 | 2 | 1 | W3 | 0.9 | 10 | ○ |
| 24 | (10A)-1 | 2 | 1 | W3 | 0.7 | 7 | ○ |
| 25 | (10A)-2 | 2 | 2 | W1 | 1.0 | 16 | Δ |
| 26 | (10A)-3 | 1 | 1 | W2 | 0.9 | 12 | ○ |
| 27 | 11A | 2 | 2 | W3 | 0.8 | 7 | ○ |
| 28 | 12A | 2 | 2 | W1 | 0.9 | 7 | ○ |
| 29 | 13A | 2 | 1 | W2 | 0.8 | 7 | ○ |
| 30 | 14A | 2 | 1 | W3 | 0.8 | 6 | ○ |
| 31 | 15A | 2 | 1 | W1 | 0.6 | 6 | ○ |
| Comparative Example 1 | (1A)-R | 1 | 1 | W1 | 2.0 | 28 | X |

In the foregoing tables 2 and 3, the photo-acid generator 1 indicates triphenylsulfonium trifurate, and the photo-acid generator 2 indicates (PAG4-36) as mentioned above. The amine 1 indicates 1,5-diazabicyclo[4.3.0]-5-nonene (DBN), and the amine 2 indicates bis(1,2,2,6,6-pentamethyl-4-piperidyl) sebacate.

The surface active agents used are as follows:

W1: Megafac F176 (fluorine-based; produced by DAINIPPON INK & CHEMICALS, INC.)

W2: Megafac R08 (fluorine-based and silicon-based; produced by DAINIPPON INK & CHEMICALS, INC.)

W3: Polysiloxane polymer KP-341 (produced by Shin-Etsu Chemical Co., Ltd.)

W4: Polyoxyethylene nonyl phenyl ether

Evaluation Test

The positive-working resist solution thus obtained was applied to a silicon wafer by means of a spin coater, and then dried at a temperature of 135° C. for 90 seconds to form a positive-working photoresist film having a thickness of about 0.4 μm which was then exposed to light beam having a wavelength of 193 nm from an ArF excimer laser (through an ArF stepper (manufactured by ISI, Co.) having NA of 0.6). The coated material thus exposed was subjected to heat treatment at a temperature of 120° C. for 90 seconds, developed with a 2.38% aqueous solution of tetramethyl ammonium hydroxide, and then rinsed with distilled water to obtain a resist pattern profile.

The resist pattern was then evaluated for sensitivity, profile and edge roughness. The results of evaluation are set forth in Tables 2 and 3.

[Sensitivity]: The sensitivity is defined by the exposure required to reproduce a line width of 0.18 μm relative to that of Example 1 as 1.

[Profile]: A 1/1 line-and-space having a width of 0.18 μm was observed for profile of line under scanning electron microscope. When the profile is observed rectangular, it is evaluated good (○). When the profile is observed slightly tapered or skirted, it is evaluated fair (Δ). When the profile is observed fully tapered or skirted, it is evaluated poor (x).

[Edge roughness]: Using a scanning electron microscope (SEM), measurement of edge roughness was made on isolated pattern. Line pattern edges were then detected at plural sites in a measurement monitor. The dispersion (3σ) of detection sites is defined as index of edge roughness. The smaller this value is, the less is edge roughness.

As can be seen in Tables 2 and 3, the positive-working resist composition of the invention exhibits a sufficient sensitivity and gives a good profile and little edge roughness.

The positive-working resist composition of the invention is suitable for and highly sensitive to far ultraviolet rays, particularly light beam having a wavelength of 193 nm from ArF excimer laser, and gives little edge roughness and an excellent resist pattern profile. Accordingly, the positive-working resist composition of the invention is suitable for lithography using far ultraviolet rays, including light beam from ArF excimer laser.

(9) Synthesis of Resin (1A')-1 (Batchwise Addition Process Involving Additional Addition of Initiator)

An equimolecular mixture of the following tetracyclododecene derivative (1-1) obtained by the reaction of acrylic acid ester of 3-oxo-1,1-dimethyl butanol with cyclopentadiene and maleic anhydride was charged into a separable flask where it was then heated to a temperature of 80° C. in an atmosphere of nitrogen. When the reaction temperature was stabilized, to the reaction solution was then further added 1 mol-% of a radical polymerization initiator V-601 produced by Wako Pure Chemical Industries, Ltd. to initiate reaction. After 2 hours of heating, to the reaction solution was then added 1 mol-% of V-601. The reaction mixture was then further heated for 2 hours. To the reaction mixture was then added 1 mol-% of V-601. The reaction mixture was then further heated for 12 hours. Thereafter, to the reaction mixture was added 1 mol-% of V-601. The reaction mixture was then heated for 3 hours. The reaction mixture was diluted twice with tetrahydrofuran, and then poured into a 2/1 (by weight) mixture of, hexane and isopropyl alcohol to cause precipitation of a white powder. The powder thus precipitated was withdrawn by filtration, and then dried to obtain a desired resin (1A'-1).

The resin (1A'-1) thus obtained was then analyzed for molecular weight by GPC. The molecular weight thus determined (weight-average molecular weight) was 9,600 in polystyrene equivalence. The area ratio of residual monomer was 1.8%. It was also confirmed by NMR spectrum that the ratio of tetracyclododecene repeating unit to maleic anhydride repeating unit in the resin (1A'-1) is 1/1.

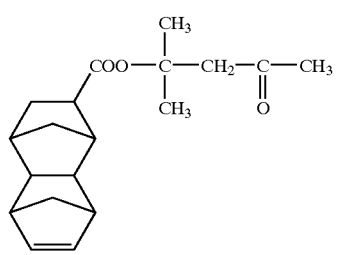

(1-1)

(10) Synthesis of Resin (1A')-2 (Block Addition Process Involving Additional Addition of Initiator)

An equimolecular mixture of the foregoing tetracyclododecene derivative (1-1) obtained by the reaction of acrylic acid ester of 3-oxo-1,1-dimethyl butanol with cyclopentadiene and maleic anhydride was charged into a separable flask where it was then heated to a temperature of 80° C. in a stream of nitrogen When the reaction temperature was stabilized, to the reaction solution was then added 3 mol-% of a radical polymerization initiator V-601 produced by Wako Pure Chemical Industries, Ltd. to initiate reaction. The reaction mixture was then heated for 12 hours. Thereafter, to the reaction solution was then added 1 mol-% of V-601. The reaction mixture was then further heated for 3 hours. The reaction mixture was diluted twice with tetrahydrofuran, and then poured into a 2/1 mixture of hexane and isopropyl alcohol to cause precipitation of a white powder. The powder thus precipitated was withdrawn by filtration, and then dried to obtain a desired resin (1A')-2.

The resin (1A')-2 thus obtained was then analyzed for molecular weight by GPC. The molecular weight thus determined (weight-average molecular weight) was 9,200 in polystyrene equivalence. The area ratio of residual monomer was 3.3%. It was also confirmed by NMR spectrum that the ratio of tetracyclododecene repeating unit to maleic anhydride repeating unit in the resin (1A')-2 is 1/1.

(11) Synthesis of Resin (1A')-3 (Dropping Polymerization Process Involving Additional Addition of Initiator)

An equimolecular mixture of the foregoing tetracyclododecene derivative (1-1) obtained by the reaction of acrylic acid ester of 3-oxo-1,1-dimethyl butanol with cyclopentadiene and maleic anhydride was dissolved in a 1/1 (by weight) mixture of tetrahydrofuran and methyl ethyl ketone to prepare a 60% solution. 1/5 of this solution was charged into a separable flask. To the remaining portion of the solution was added 1.5 mol-% of a radical polymerization initiator V-601 produced by Wako Pure Chemical Industries, Ltd. The reaction vessel was then heated to a temperature of 70° C. in a stream of nitrogen. When the reaction temperature was stabilized, to the reaction solution was then added 0.5 mol-% of the initiator V-601 to initiate reaction. Subsequently, to the reaction solution was added dropwise the remaining monomer solution in 8 hours. After the termination of dropwise addition, the reaction solution was then heated for 4 hours. Thereafter, to the reaction solution was then added 1 mol-% of V-601. The reaction mixture was then further heated for 3 hours. The reaction mixture was then poured into a 5/1 (by weight) mixture of hexane and isopropyl alcohol to cause precipitation of a white powder. The powder thus precipitated was withdrawn by filtration, and then dried to obtain a desired resin (1A')-3.

The resin (1A')-3 thus obtained was then analyzed for molecular weight by GPC. The molecular weight thus determined (weight-average molecular weight) was 7,100 in polystyrene equivalence. The area ratio of residual monomer was 2.3%. It was also confirmed by NMR spectrum that the ratio of tetracyclododecene repeating unit to maleic anhydride repeating unit in the resin (1A')-3 is 1/1.

Resins (2A')-1 to (12A')-2 set forth in Table 4 below were synthesized in the same manner as in the foregoing synthesis examples (the number of the repeating unit indicates the leftward order of the repeating units in the foregoing resins (2A') to (12A')).

The molar ratio and weight-average molecular weight of the various repeating units and the amount of residual monomer in the foregoing resins (2A')-1 to (12A')-2 are set forth in Table 4.

TABLE 4

| Resin | Polymerization process*1 | Polymerization solvent | Alicyclic olefin 1 | 2 | 3 | Maleic anhydride/ maleic acid ester 1 | 2 | Mw | Residual monomer (%) | Reprecipitating solvent |
|---|---|---|---|---|---|---|---|---|---|---|
| (2A')-1 | Block B | None | 50 | | | 50 | | 9,300 | 4.6 | c/h = 1/10 |
| (2A')-2 | Batchwise B | None | 50 | | | 50 | | 8,500 | 3.9 | c/h = 1/10 |
| (3A')-1 | Dropping A | c/f = 1/2 | 37 | 13 | | 50 | | 6,800 | 2.4 | b/h = 1/6 |
| (3A')-2 | Block A | c/f = 1/2 | 37 | 13 | | 50 | | 7,300 | 2.9 | b/h = 1/6 |
| (4A')-1 | Dropping A | b/e = 1/3 | 34 | 16 | | 50 | | 6,900 | 1.9 | a/i = 1/7 |

TABLE 4-continued

| Resin | Polymerization process*1 | Polymerization solvent | Alicyclic olefin 1 | 2 | 3 | Maleic anhydride/ maleic acid ester 1 | 2 | Mw | Residual monomer (%) | Reprecipitating solvent |
|---|---|---|---|---|---|---|---|---|---|---|
| (4A')-2 | Block A | b/e = 1/3 | 34 | 16 | | 50 | | 7,200 | 2.6 | a/i = 1/7 |
| (5A')-1 | Batchwise A | None | 50 | | | 28 | 22 | 8,700 | 1.9 | a/h = 1/3 |
| (5A')-2 | Batchwise B | None | 50 | | | 28 | 22 | 8,900 | 4.4 | a/h = 1/3 |
| (6A')-1 | Batchwise A | b/f = 1/2 | 43 | 7 | | 50 | | 6,500 | 2.1 | h/j = 3/1 |
| (6A')-2 | Batchwise B | b/f = 1/2 | 43 | 7 | | 50 | | 6,900 | 4.7 | h/j = 3/1 |
| (7A')-1 | Block A | None | 44 | 6 | | 50 | | 7,900 | 2.6 | c/h = 1/12 |
| (7A')-2 | Block B | None | 44 | 6 | | 50 | | 8,100 | 4.9 | c/h = 1/12 |
| (8A')-1 | Dropping A | c/d = 1/1 | 45 | 5 | | 50 | | 5,700 | 2.2 | i alone |
| (8A')-2 | Dropping B | c/d = 1/1 | 45 | 5 | | 50 | | 5,600 | 4.6 | i alone |
| (9A')-1 | Batchwise A | None | 38 | 3 | 9 | 50 | | 9,700 | 2.1 | f/h = 1/7 |
| (9A')-2 | Block B | e alone | 38 | 3 | 9 | 50 | | 7,400 | 4.8 | f/h = 1/7 |
| (10A')-1 | Batchwise A | None | 31 | 5 | 14 | 50 | | 8,800 | 1.7 | g/h = 1/15 |
| (10A')-2 | Block A | e/f = 1/1 | 31 | 5 | 14 | 50 | | 6,600 | 2.9 | g/h = 1/15 |
| (11A')-1 | Block A | None | 33 | 7 | 10 | 50 | | 8,200 | 2.7 | h alone |
| (11A')-2 | Dropping A | c/f = 2/1 | 33 | 7 | 10 | 50 | | 6,400 | 2.2 | h alone |
| (12A')-1 | Batchwise A | b/c = 1/1 | 30 | 6 | 14 | 50 | | 5,500 | 1.8 | e/h = 1/9 |
| (12A')-2 | Block A | None | 30 | 6 | 14 | 50 | | 8,600 | 2.5 | e/h = 1/9 |

*1Block A: initiator added at a time, initiator further added;
Block B: initiator added at a time, initiator not further added;
Batchwise A: initiator added batchwise, initiator further added;
Batchwise B: initiator added batchwise, initiator not further added;
Dropping A: dropping polymerization, initiator further added;
Dropping B: dropping polymerization, initiator not further added Solvent a: isopropyl alcohol
Solvent b: isopropyl ether
Solvent c: tetrahydrofuran
Solvent d: acetone
Solvent e: methyl ethyl ketone
Solvent f: ethyl acetate
Solvent g: γ-butyrolactone
Solvent h: hexane
Solvent i: Isoper G
Solvent j: toluene The initiator used was the foregoing radical polymerization initiator V-60 produced by Wako Pure Chemical Industries, Ltd.

EXAMPLES 32 TO 56 AND COMPARATIVE EXAMPLES 2 AND 3

Preparation and Evaluation of Positive-working Resist Composition 1,4 g of each of the resins set forth in Tables 5 and 6 synthesized in the foregoing synthesis examples, 0.2 g of each of the photo-acid generators set forth in Tables 5 and 6, 10 mg of an organic basic compound (amine), and optionally 0.15 g of a surface active agent were mixed. The mixtures were each dissolved in propylene glycol monoethyl ether acetate in a solid content concentration of 14% by weight, and then filtered through a microfilter having a pore diameter of 0.1 μm to prepare positive-working resist compositions of Examples 32 to 56 and Comparative Examples 2 and 3. For comparison, the resin described in Synthesis Example 24 of WO97/33198 was used as resin R1 (ratio of residual monomer area: 5.4%), and the resin described in Synthesis Example 7 of JP-A-10-111569 was used as resin R2 (ratio of residual monomer area: 6.3%).

The positive-working resist compositions thus prepared were each evaluated in the manner as described below. The results are set forth in Table 5.

In Tables 5 and 6, the photo-acid generators are designated by the same number as used for the specific examples previously listed.

The amine 1 indicates 1,4-diazabicyclo[4.3.0]-5-nonene [DBN], and the amine 2 indicates bis(1,2,2,6,6-pentamethyl-4-piperidyl) sebacate.

For surface active agent,

W1, W2, W3, W4, and W5 indicate Megafac F176 (produced by DAINIPPON INK & CHEMICALS, INC.) (fluorine-based surface active agent), Megafac R08 (produced by DAINIPPON INK & CHEMICALS, INC.) (fluorine-based and silicon-based surface active agent), Polysiloxane polymer KP-341 (produced by Shin-Etsu Chemical Co., Ltd.), polyoxyethylene nonyl phenyl ether, and Troysol S-366 (produced by Troy Chemical Co., Ltd.), respectively.

Evaluation Test

The positive-working resist solution thus obtained was applied to a silicon wafer by means of a spin coater, and then dried at a temperature of 150° C. for 90 seconds to form a positive-working photoresist film having a thickness of about 0.4 μm which was then exposed to light beam having a wavelength of 193 nm from an ArF excimer laser (through an ArF stepper (manufactured by ISI Co.) having NA of 0.6). The coated material thus exposed was subjected to heat treatment at a temperature of 150° C. for 90 seconds, developed with a 2.38% aqueous solution of tetramethyl ammonium hydroxide, and then rinsed with distilled water to obtain a resist pattern profile.

The resist pattern was then evaluated for sensitivity, profile and edge roughness. The results of evaluation are set forth in Tables 5 and 6.

[Sensitivity]: The sensitivity is defined by the exposure required to reproduce a line width of 0.18 μm relative to that of Example 32 as 1.

[Profile]: A 1/1 line-and-space having a width of 0.15 μm was observed for profile of line under scanning electron microscope. When the profile is observed rectangular, it is evaluated good (○). When the profile is observed slightly tapered or skirted, it is evaluated fair (Δ). When the profile is observed fully tapered or skirted, it is evaluated poor (x).

[Edge roughness]: Using a scanning electron microscope (SEM), measurement of edge roughness was made on isolated pattern (0.15 μm). Line pattern edges were then detected at plural sites in a measurement monitor. The dispersion (3σ) of detection sites is defined as index of edge roughness. The smaller this value is, the less is edge roughness.

TABLE 5

| Example No. | Resin | Photo-acid generator | Amine | Surface active agent | Sensitivity | Edge roughness (nm) | Profile |
|---|---|---|---|---|---|---|---|
| 32 | (1A')-1 | PAG4-5 | 1 | W1 | 1.0 | 8 | ○ |
| 33 | (1A')-2 | PAG4-8 | 2 | W2 | 1.1 | 10 | ○ |
| 34 | (1A')-3 | PAG4-33 | 1 | W3 | 1.0 | 8 | ○ |
| 35 | (2A')-1 | PAG4-36 | 1 | W4 | 1.4 | 13 | Δ |
| 36 | (2A')-2 | PAG4-37 | 1 | W5 | 1.3 | 12 | ○ |
| 37 | (3A')-1 | PAG4-36 | 1 | W5 | 0.9 | 10 | ○ |
| 38 | (3A')-2 | PAG4-36 | 1 | W3 | 1.0 | 11 | Δ |
| 39 | (4A')-1 | PAG4-36 | 1 | W1 | 0.8 | 9 | ○ |
| 40 | (4A')-2 | PAG4-36 | 2 | W2 | 0.9 | 11 | ○ |
| 41 | (5A')-1 | PAG4-36 | 2 | W5 | 1.0 | 10 | ○ |
| 42 | (5A')-2 | PAG4-36 | 2 | W4 | 1.1 | 13 | Δ |
| 43 | (6A')-1 | PAG4-36 | 2 | W3 | 0.8 | 10 | ○ |
| 44 | (6A')-2 | PAG4-36 | 2 | W4 | 0.9 | 13 | Δ |
| 45 | (7A')-1 | PAG4-36 | 2 | W5 | 0.8 | 11 | ○ |
| 46 | (7A')-2 | PAG4-36 | 2 | W4 | 0.9 | 14 | Δ |
| 47 | (8A')-1 | PAG4-36 | 2 | W2 | 0.8 | 10 | ○ |

TABLE 6

| Example No. | Resin | Photo-acid generator | Amine | Surface active agent | Sensitivity | Edge roughness (nm) | Profile |
|---|---|---|---|---|---|---|---|
| 48 | (8A')-2 | PAG4-5 | 1 | W1 | 0.9 | 13 | Δ |
| 49 | (9A')-1 | PAG4-6 | 1 | W2 | 0.8 | 10 | ○ |
| 50 | (9A')-2 | PAG4-36 | 1 | W4 | 0.9 | 14 | Δ |
| 51 | (10A')-1 | PAG4-36 | 1 | W3 | 0.8 | 9 | ○ |
| 52 | (10A')-2 | PAG4-36 | 1 | W5 | 0.8 | 12 | ○ |
| 53 | (11A')-1 | PAG4-36 | 1 | W5 | 0.8 | 11 | ○ |
| 54 | (11A')-2 | PAG4-36 | 2 | W5 | 0.8 | 10 | ○ |
| 55 | (12A')-1 | PAG4-36 | 2 | W3 | 0.8 | 9 | ○ |
| 56 | (12A')-2 | PAG4-36 | 2 | W1 | 0.8 | 11 | ○ |
| Comparative Example 2 | R1 | PAG4-5 | None | None | 2.3 | 21 | X |
| Comparative Example 3 | R2 | PAG4-5 | 1 | None | 2.4 | 19 | X |

As can be seen in Tables 5 and 6, the positive-working resist composition of the invention exhibits a sufficient sensitivity and gives a good profile and little edge roughness.

The positive-working resist composition of the invention is suitable for and highly sensitive to far ultraviolet rays, particularly light beam having a wavelength of 193 nm from ArF excimer laser, and gives et little edge roughness and an excellent resist pattern profile. Accordingly, the positive-working resist composition of the invention is suitable for lithography using far ultraviolet rays, including light beam from ArF excimer laser.

While the invention has been described in detail and with reference to specific embodiments thereof, it will be apparent to one skilled in the art that various changes and modifications can be made therein without departing from the spirit and scope thereof.

This application is based on Japanese patent applications No. Hei-11-285761 filed on Oct. 6, 1999 and No. 2000-80519 filed on Mar. 22, 2000, the entire contents of which incorporated herein by reference.

What is claimed is:
1. A positive-working resist composition comprising:
(A) a resin containing an alkali-soluble group protected by at least one of moieties containing alicyclic hydrocarbon represented by the following general formulae (pI) to (pVI) and having a residual monomer component content of 0.01 to 4% of the total pattern area as determined by gel permeation chromatography (GPC), which increases in its solution velocity with respect to an alkaline developer by the action of an acid:

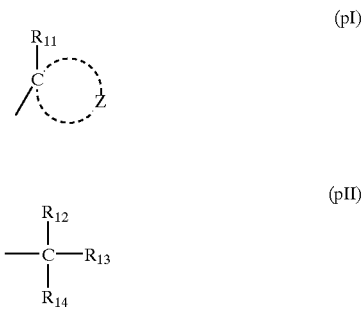

-continued

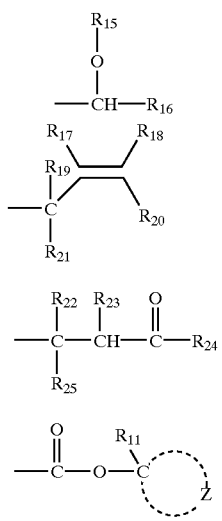

(pIII)

(pV)

(pVI)

wherein $R_{11}$ represents a methyl group, ethyl group, n-propyl group, isopropyl group, n-butyl group, isobutyl group or sec-butyl group; Z represents an atomic group required to form an alicyclic hydrocarbon group with carbon atoms; $R_{12}$ to $R_{16}$ each independently represent a $C_{1-4}$ straight-chain or branched alkyl group or alicyclic hydrocarbon group, with the proviso that at least one of $R_{12}$ to $R_{14}$ or either $R_{15}$ or $R_{16}$ represents an alicyclic hydrocarbon group; $R_{17}$ to $R_{21}$ each independently represent a hydrogen atom, $C_{1-4}$ straight-chain or branched alkyl group or alicyclic hydrocarbon group, with the proviso that at least one of $R_{17}$ to $R_{21}$ represents an alicyclic hydrocarbon group and either $R_{19}$ or $R_{21}$ represents a $C_{1-4}$ straight-chain or branched alkyl group or alicyclic hydrocarbon group; and $R_{22}$ to $R_{25}$ each independently represent a $C_{1-4}$ straight-chain or branched alkyl group or alicyclic hydrocarbon group, with the proviso that at least one of $R_{22}$ to $R_{25}$ represents an alicyclic hydrocarbon group; and (B) a compound which is capable of generating an acid by irradiation with an active ray or radiation.

2. The positive-working resist composition according to claim 1, wherein said resin (A) is one obtained by adding a reaction solution containing a monomer and a radical polymerization initiator dropwise to a reaction solvent or a reaction solution containing a monomer to cause polymerization reaction.

3. The positive-working resist composition according to claim 1, wherein said resin (A) is one obtained by adding a radical polymerization initiator to a reaction solution containing a monomer by portions in 30 minutes to 8 hours to cause a polymerization reaction.

4. The positive-working resist composition according to claim 1, wherein said resin (A) is one obtained by a process which comprises heating a reaction solution containing a monomer and a first radical polymerization initiator to cause a first polymerization reaction forming a reaction product, adding a second radical polymerization initiator to the polymerization reaction product, and then heating a mixture containing the reaction product, a residual monomer and the second radical polymerization initiator to cause a second polymerization reaction.

5. The positive-working resist composition according to claim 1, wherein said resin (A) is one obtained by a process which comprises adding a reacted solution obtained by a polymerization reaction of a monomer and a radical polymerization initiator to at least one solution selected from the group consisting of water, at least one alcohol, water/alcohol mixture, water/ether mixture, water/ketone mixture, water/amide mixture, water/ester or lactone mixture and water/nitrile mixture, and then recovering the product in the form of powder.

* * * * *